United States Patent
Ohsawa et al.

(10) Patent No.: US 10,529,399 B2
(45) Date of Patent: Jan. 7, 2020

(54) MAGNETIC MEMORY DEVICE

(71) Applicant: Kabushiki Kaisha Toshiba, Tokyo (JP)

(72) Inventors: Yuichi Ohsawa, Kanagawa (JP); Mariko Shimizu, Tokyo (JP); Satoshi Shirotori, Kangawa (JP); Hideyuki Sugiyama, Kangawa (JP); Altansargai Buyandalai, Kangawa (JP); Hiroaki Yoda, Kanagawa (JP); Katsuhiko Koui, Kanagawa (JP); Tomoaki Inokuchi, Kanagawa (JP); Naoharu Shimomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/106,694

(22) Filed: Aug. 21, 2018

(65) Prior Publication Data
US 2019/0279699 A1    Sep. 12, 2019

(30) Foreign Application Priority Data
Mar. 7, 2018    (JP) .................. 2018-040445

(51) Int. Cl.
*G11C 11/00* (2006.01)
*G11C 11/16* (2006.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
CPC .................................................. G11C 11/00
(Continued)

(56) References Cited

U.S. PATENT DOCUMENTS

| 8,384,171 B2 | 2/2013 | Gaudin et al. |
| 2014/0056060 A1 | 2/2014 | Khvalkovskiy et al. |

(Continued)

FOREIGN PATENT DOCUMENTS

| JP | 2014-45196 A | 3/2014 |
| JP | 2017-112351 A | 6/2017 |

(Continued)

OTHER PUBLICATIONS

Yoda et al., "Voltage-Control Spintronics memory (VoCSM) Having Potentials of Ultra-Low Energy Consumption and High-Density," IEEE IEDM (2016), pp. 679-681.
(Continued)

*Primary Examiner* — Hoai V Ho
(74) *Attorney, Agent, or Firm* — Finnegan, Henderson, Farabow, Garrett & Dunner, L.L.P.

(57) ABSTRACT

According to one embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The third region includes first and second end portions. The first end portion includes a first protrusion. The second end portion includes a second protrusion. A first position along the second direction of the first protrusion is different from a second position along the second direction of the second protrusion.

10 Claims, 31 Drawing Sheets

(51) Int. Cl.
*H01L 43/04* (2006.01)
*H01L 43/08* (2006.01)
*H01L 43/10* (2006.01)
*H01L 43/06* (2006.01)

(52) U.S. Cl.
CPC .............. *H01L 43/04* (2013.01); *H01L 43/06* (2013.01); *H01L 43/08* (2013.01); *H01L 43/10* (2013.01)

(58) Field of Classification Search
USPC ........................................................ 365/158
See application file for complete search history.

(56) References Cited

U.S. PATENT DOCUMENTS

| | | | |
|---|---|---|---|
| 2014/0056061 A1 | 2/2014 | Khvalkovskiy et al. | |
| 2014/0264680 A1* | 9/2014 | Kim ................... | H01L 27/222 257/427 |
| 2017/0169872 A1 | 6/2017 | Yoda et al. | |
| 2017/0200486 A1 | 7/2017 | Qiu et al. | |
| 2017/0222135 A1 | 8/2017 | Fukami et al. | |
| 2018/0033953 A1 | 2/2018 | Sasaki et al. | |
| 2018/0040812 A1 | 2/2018 | Shimizu et al. | |
| 2018/0159094 A1 | 6/2018 | Audebert et al. | |
| 2018/0174635 A1 | 6/2018 | Yoda et al. | |

FOREIGN PATENT DOCUMENTS

| | | |
|---|---|---|
| JP | 6168578 B2 | 7/2017 |
| JP | 2018-22805 A | 2/2018 |
| JP | 2018-26525 A | 2/2018 |
| JP | 6275806 B1 | 2/2018 |
| JP | 6280195 B1 | 2/2018 |
| JP | 6283437 B1 | 2/2018 |
| JP | 6291608 B1 | 3/2018 |

OTHER PUBLICATIONS

Shirotori et al., "Voltage-Control Spintronics Memory (VoSCM) with a self-aligned heavy-metal electrode," Digest of Intermag 2017, Control ID 2699443, 5 pages.

* cited by examiner

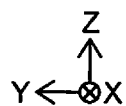
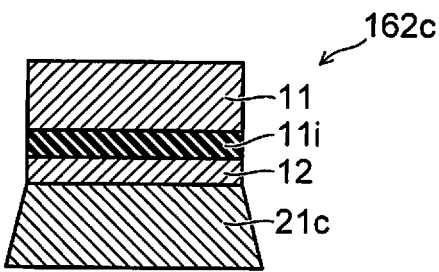
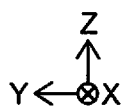
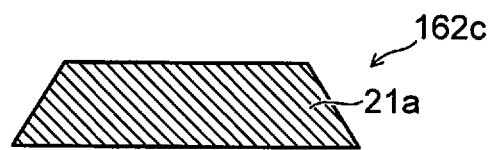
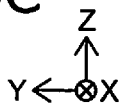
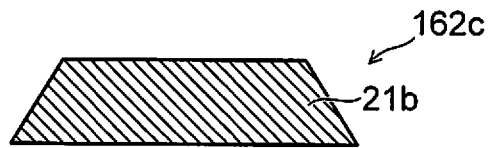
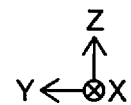
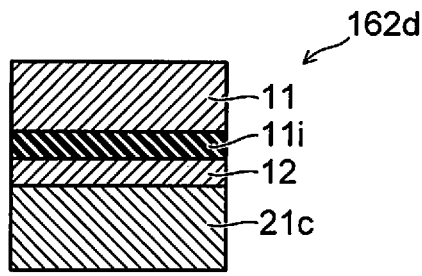
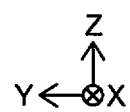
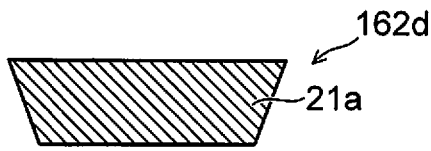
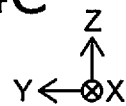
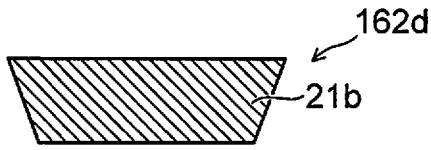

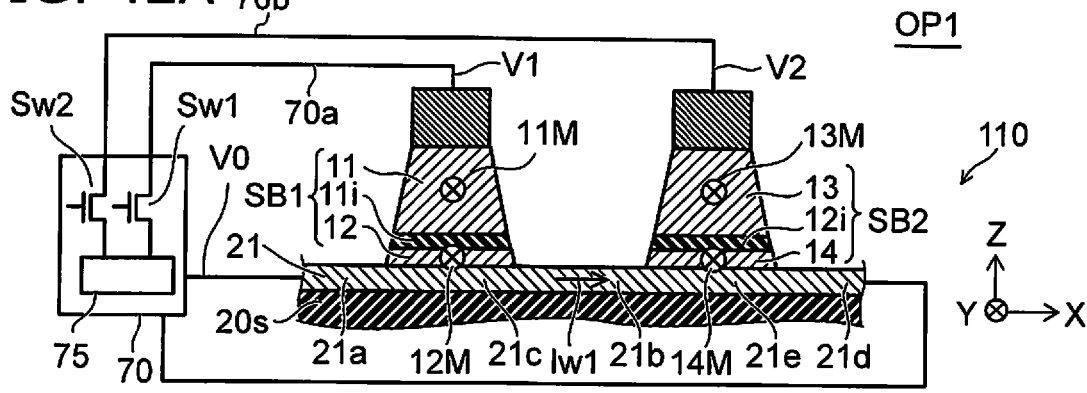
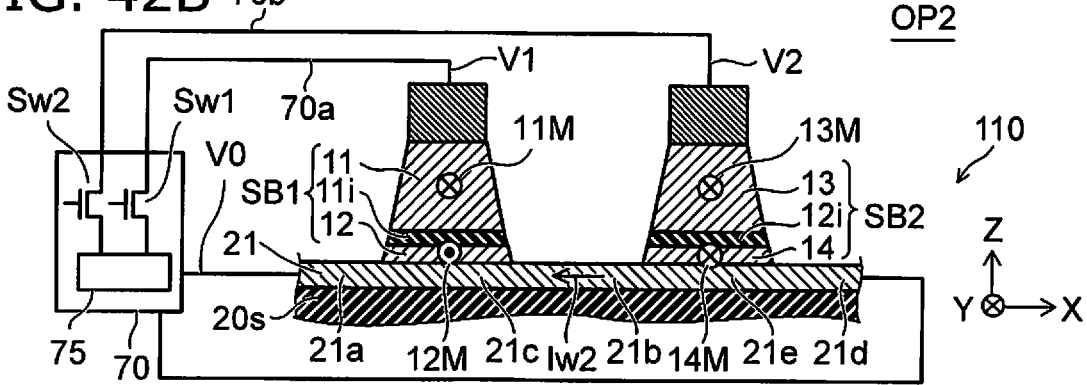
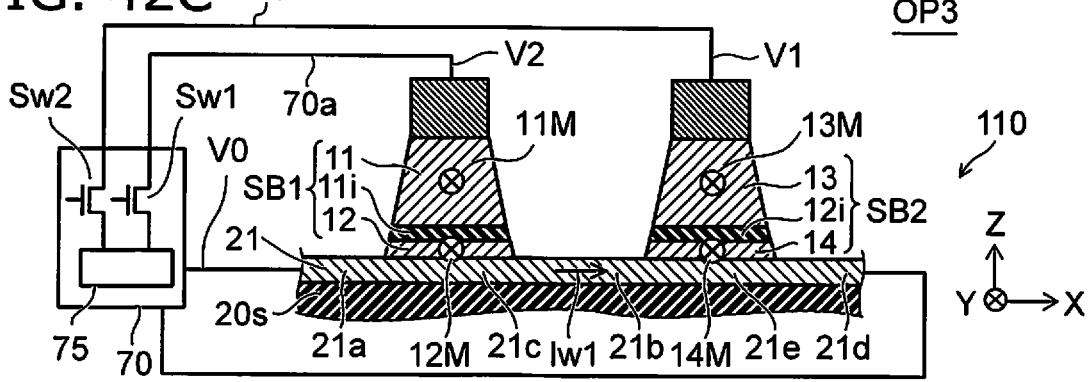
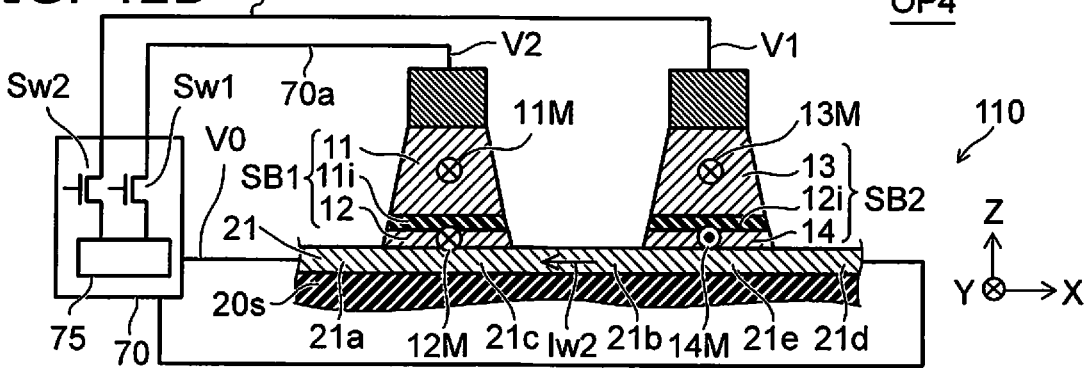

MAGNETIC MEMORY DEVICE

CROSS-REFERENCE TO RELATED APPLICATIONS

This application is based upon and claims the benefit of priority from Japanese Patent Application No. 2018-040445, filed on Mar. 7, 2018; the entire contents of which are incorporated herein by reference.

FIELD

Embodiments described herein relate generally to a magnetic memory device.

BACKGROUND

Stable operations of a magnetic memory device are desirable.

BRIEF DESCRIPTION OF THE DRAWINGS

FIG. 33A to FIG. 33C are schematic views illustrating a magnetic memory device according to the sixth embodiment;

FIG. 34A to FIG. 34C are schematic views illustrating a magnetic memory device according to the sixth embodiment;

FIG. 42A to FIG. 42D are schematic views illustrating the operations of the magnetic memory device according to the embodiment;

DETAILED DESCRIPTION

Figure 1A:
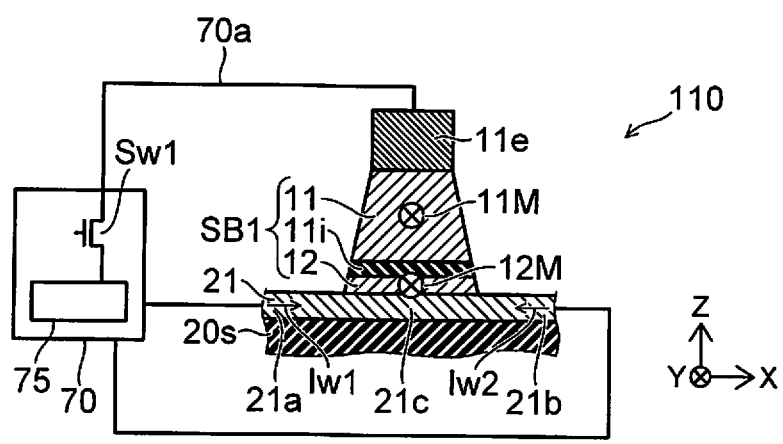
FIG. 1A and FIG. 1B are schematic views illustrating a magnetic memory device according to a first embodiment.

According to one embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The third region includes a first end portion and a second end portion. A direction from the second end portion toward the first end portion crosses a first plane. The first plane includes the first direction and the second direction. The first end portion includes a first protrusion. The second end portion includes a second protrusion. A first position along the second direction of the first protrusion is different from a second position along the second direction of the second protrusion.

According to another embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The third region includes a first end portion and a second end portion. A direction from the second end portion toward the first end portion crosses a first plane. The first plane includes the first direction and the second direction. The first end portion includes a first recess. The second end portion includes a second recess. A first position along the second direction of the first recess is different from a second position along the second direction of the second recess.

According to another embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The third region includes a first end portion and a second end portion. A direction from the second end portion toward the first end portion crosses a first plane. The first plane includes the first direction and the second direction. The first end portion includes a protrusion. The second end portion includes a recess.

According to another embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. The third region includes a first end portion and a second end portion. A direction from the second end portion toward the first end portion crosses a first plane. The first plane includes the first direction and the second direction. A configuration of the first end portion in at least one cross section perpendicular to the first plane is different from a configuration of the second end portion in the at least one cross section.

According to another embodiment, a magnetic memory device includes a conductive layer, a first magnetic layer, a second magnetic layer, and a first nonmagnetic layer. The conductive layer includes a first region, a second region, and a third region between the first region and the second region. The second magnetic layer is provided between the third region and the first magnetic layer in a first direction crossing a second direction. The second direction is from the first region toward the second region. The first nonmagnetic layer is provided between the first magnetic layer and the second magnetic layer. A configuration of the third region is asymmetric with respect to a line along the second direction.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
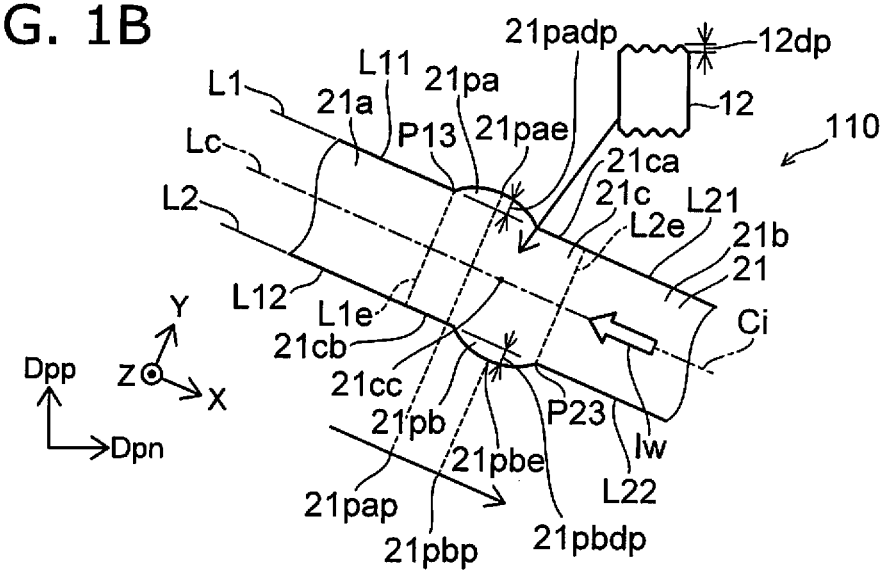

FIG. 1A and FIG. 1B are schematic views illustrating a magnetic memory device according to a first embodiment.

A portion of FIG. 1A shows an example of a cross-sectional view along a center line Lc of FIG. 1B. FIG. 1B is a plan view showing an example of a portion of the magnetic memory device.

As shown in FIG. 1A, the magnetic memory device 110 according to the embodiment includes a conductive layer 21, a first magnetic layer 11, a second magnetic layer 12, and a first nonmagnetic layer 11i.

For example, the conductive layer 21 is provided on a base body 20s. The base body 20s may be at least a portion of a substrate. The base body 20s is, for example, insulative. The base body 20s may include, for example, at least one of silicon oxide or aluminum oxide. The silicon oxide may be, for example, thermally-oxidized silicon.

The conductive layer 21 includes first to third regions 21a to 21c. The third region 21c is positioned between the first region 21a and the second region 21b. For example, the third region 21c is continuous with the first region 21a. For example, the third region 21c is continuous with the second region 21b. The conductive layer 21 includes a metallic element. The metallic element includes, for example, Ta. Other examples of the material of the conductive layer 21 are described below.

The first magnetic layer 11 is separated from the third region 21c in a first direction. The second magnetic layer 12 is provided between the third region 21c and the first magnetic layer 11 in the first direction. The first nonmagnetic layer 11i is provided between the first magnetic layer 11 and the second magnetic layer 12. Another layer may be provided between the first magnetic layer 11 and the first nonmagnetic layer 11i. Another layer may be provided between the second magnetic layer 12 and the first nonmagnetic layer 11i.

The first direction is, for example, a Z-axis direction. One direction perpendicular to the Z-axis direction is taken as an X-axis direction. A direction perpendicular to the Z-axis direction and the X-axis direction is taken as a Y-axis direction.

The first direction crosses a second direction from the first region 21a toward the second region 21b. In the example, the second direction corresponds to the X-axis direction.

The first magnetic layer 11 is, for example, ferromagnetic. The second magnetic layer 12 is, for example, ferromagnetic. The first magnetic layer 11 and the second magnetic layer 12 include, for example, at least one selected from the group consisting of Fe and Co. The first nonmagnetic layer 11i includes, for example, MgO. The first nonmagnetic layer 11i may include, for example, at least one selected from the group consisting of Ga, Al, and Cu. Other examples of the materials of the first magnetic layer 11, the second magnetic layer 12, and the first nonmagnetic layer 11i are described below.

The first magnetic layer 11, the second magnetic layer 12, and the first nonmagnetic layer 11i are included in a first stacked body SB1. For example, the first stacked body SB1 corresponds to one memory portion (memory cell).

The first magnetic layer 11 is, for example, a fixed magnetic layer. The second magnetic layer 12 is, for example, a free magnetic layer. A first magnetization 11M of the first magnetic layer 11 does not change easily compared to a second magnetization 12M of the second magnetic layer 12. For example, the first magnetic layer 11 functions as a reference layer. For example, the second magnetic layer 12 functions as a memory layer.

For example, the first stacked body SB1 functions as a magnetic variable resistance element. For example, a TMR (Tunnel Magneto Resistance Effect) occurs in the first stacked body SB1. For example, the electrical resistance of a path including the first magnetic layer 11, the first nonmagnetic layer 11i, and the second magnetic layer 12 changes according to the difference between the orientation of the first magnetization 11M and the orientation of the second magnetization 12M. The first stacked body SB1 includes, for example, a magnetic tunnel junction (MTJ). For example, the first stacked body SB1 corresponds to a MTJ element. For example, the first stacked body SB1 may correspond to a GMR element.

For example, the second magnetic layer 12 is provided on the conductive layer 21. The first nonmagnetic layer 11i is provided on the second magnetic layer 12. The first magnetic layer 11 is provided on the first nonmagnetic layer 11i. In the example, a first electrode 11e is provided on the first magnetic layer 11. For example, the conductive layer 21 and the second magnetic layer 12 contact each other.

The magnetic memory device 110 may further include a controller 70. The controller 70 is electrically connected to the first region 21a and the second region 21b. The controller 70 is further electrically connected to the first magnetic layer 11. For example, a drive circuit 75 is provided in the controller 70. The drive circuit 75 is electrically connected to the first magnetic layer 11 via the first electrode 11e by a first interconnect 70a. In the example, a first switch Sw1 (e.g., a transistor) is provided in a current path between the drive circuit 75 and the first magnetic layer 11.

In a first operation (a first program operation), the controller 70 supplies a first current Iw1 (a first program current) to the conductive layer 21. Thereby, a first state is formed. The first current Iw1 is a current from the first region 21a toward the second region 21b. In a second operation (a second program operation), the controller 70 supplies a second current Iw2 (a second program current) to the conductive layer 21. Thereby, a second state is formed. The second program current Iw2 is a current from the second region 21b toward the first region 21a.

A first electrical resistance between the first magnetic layer 11 and the conductive layer 21 (e.g., the first region 21a) after the first operation (in the first state) is different from a second electrical resistance between the first magnetic layer 11 and the conductive layer 21 (e.g., the first region 21a) after the second operation (in the second state).

The electrical resistance difference is based on, for example, the difference of the states of the second magnetization 12M between the first state and the second state.

In a read operation, the controller 70 may detect a characteristic (which may be a voltage, a current, or the like) corresponding to the electrical resistance between the first magnetic layer 11 and the conductive layer 21 (e.g., the first region 21a).

For example, the second magnetic layer 12 functions as a layer that stores information. For example, the first state in which the second magnetization 12M is oriented in one direction corresponds to first information that is stored. The second state in which the second magnetization 12M is oriented in another direction corresponds to second information that is stored. For example, the first information corresponds to one of "0" or "1." The second information corresponds to the other of "0" or "1."

For example, the second magnetization 12M can be controlled by a current (a program current) flowing in the conductive layer 21. For example, the orientation of the second magnetization 12M can be controlled by the orientation of the current (the program current) of the conductive layer 21. For example, the conductive layer 21 functions as, for example, a Spin Orbit Layer (SOL). For example, the orientation of the second magnetization 12M can be changed by spin-orbit torque generated between the conductive layer 21 and the second magnetic layer 12. The spin-orbit torque is based on a current (the program current) flowing in the conductive layer 21. The current (the program current) is supplied by the controller 70 (e.g., the drive circuit 75).

FIG. 1B illustrates the configuration of the conductive layer 21 in the X-Y plane. As shown in FIG. 1B, the third region 21c includes a first end portion 21ca and a second end portion 21cb. The direction from the second end portion 21cb toward the first end portion 21ca crosses a first plane including the first direction and the second direction. The first plane is, for example, the Z-X plane. For example, the direction from the second end portion 21cb toward the first end portion 21ca is aligned with the Y-axis direction.

The first end portion 21ca includes a first protrusion 21pa (e.g., a first convex portion). At least a portion of the first protrusion 21pa protrudes in the orientation from the second end portion 21cb toward the first end portion 21ca. The orientation of the protrusion of at least a portion of the first protrusion 21pa is the orientation from the second end portion 21cb toward the first end portion 21ca.

The second end portion 21cb includes a second protrusion 21pb (e.g., a second convex portion). At least a portion of the second protrusion 21pb protrudes in the orientation from the second end portion 21cb toward the first end portion 21ca. The orientation of the protrusion of at least a portion of the second protrusion 21pb is an orientation from the first end portion 21ca toward the second end portion 21cb.

A first position 21pap along the second direction (e.g., the X-axis direction) of the first protrusion 21pa is different from a second position 21pbp along the second direction of the second protrusion 21pb. For example, the first position 21pap is shifted from the second position 21pbp in the second direction.

For example, the first position 21pap is the position along the second direction (e.g., the X-axis direction) of a top portion 21pae of the first protrusion 21pa. The top portion 21pae is, for example, the tip of the first protrusion 21pa. In the first protrusion 21pa, the top portion 21pae protrudes most. In the case where the first protrusion 21pa includes a portion along the X-axis direction, the midpoint of the portion may be used as the top portion 21pae.

For example, the second position 21pbp is the position along the second direction (e.g., the X-axis direction) of a top portion 21pbe of the second protrusion 21pb. The top portion 21pbe is, for example, the tip of the second protrusion 21pb. In the second protrusion 21pb, the top portion 21pbe protrudes most. In the case where the second protrusion 21pb includes a portion along the X-axis direction, the midpoint of the portion may be used as the top portion 21pbe.

Thus, in the magnetic memory device 110, two protrusions (the first protrusion 21pa and the second protrusion 21pb) are provided in the third region 21c. Also, the positions along the X-axis direction of the first protrusion 21pa and the second protrusion 21pb are different from each other. For example, the current that flows through the third region 21c has a component crossing the X-axis direction. For example, the width-direction component of the planar distribution of the current direction in the third region 21c is larger than the width-direction component of the planar distribution of the current direction in the first region 21a and the second region 21b. For example, the planar distribution of the torque applied to the second magnetic layer 12 increases based on the current flowing in the third region 21c. A trigger of a change corresponding to the magnetization distribution of the second magnetic layer 12 occurs easily. For example, the second magnetization 12M of the second magnetic layer 12 changes easily based on the current. Thereby, more stable operations are obtained.

In the magnetic memory device 110, the planar configuration of the third region 21c is asymmetric with respect to the X-axis direction. The planar configuration of the third region 21c is the configuration of the third region 21c in a plane including the first direction and the second direction.

For example, the configuration of the first end portion 21ca in at least one cross section along the Z-Y plane may be different from the configuration of the second end portion 21cb in the at least one cross section. For example, the at least one cross section passes through the first protrusion 21pa. For example, the at least one cross section may pass through the second protrusion 21pb.

For example, the configuration of the first end portion 21ca in at least one cross section perpendicular to the first plane (e.g., the Z-X plane) including the first direction and the second direction recited above may be different from the configuration of the second end portion 21cb in the at least one cross section.

For example, the distance (a first distance) along the second direction between the one cross section and the first region 21a is different from the distance (a second distance) along the second direction between the one cross section and the second region 21b.

For example, the configuration of the third region 21c (e.g., the planar configuration) is point-symmetric with respect to a centroid 21cc of the configuration of the third region 21c.

For example, the first region 21a includes an end portion L11 and an end portion L12. For example, these end portions are aligned with the X-axis direction. These end portions are, for example, sides. The direction from the end portion L12 toward the end portion L11 is aligned with the Y-axis direction.

For example, the second region 21b includes an end portion L21 and an end portion L22. For example, these end portions are aligned with the X-axis direction. These end portions are, for example, sides. The direction from the end portion L22 toward the end portion L21 is aligned with the Y-axis direction.

For example, the end portion L11 and the end portion L21 are aligned with a first straight line L1. For example, the end portion L12 and the end portion L21 are aligned with a second straight line L2. For example, these straight lines are aligned with the second direction (e.g., the X-axis direction).

The portion of the third region 21c other than the protrusion corresponds to the region between the first straight line L1 and the second straight line L2. The first protrusion 21pa protrudes from the first straight line L1. The second protrusion 21pb protrudes from the second straight line L2.

For example, the center line Lc passes through the center in the Y-axis direction of the first region 21a and the center in the Y-axis direction of the second region 21b. The center line Lc is aligned with the X-axis direction.

The center of the current (e.g., the program current) flowing through the conductive layer 21 passes through a current center Ci in the first region 21a and the second region 21b. The current center Ci substantially corresponds to the center line Lc.

The planar configuration (the configuration in the X-Y plane) of the first region 21a is substantially symmetric (line-symmetric) with respect to the center line Lc. The planar configuration (the configuration in the X-Y plane) of the second region 21b is substantially symmetric (line-symmetric) with respect to the center line Lc.

On the other hand, the planar configuration (the configuration in the X-Y plane) of the third region 21c is asymmetric (non-line-symmetric) with respect to the center line Lc (one line along the second direction).

The line (e.g., the center line Lc) passes through the center of the first region 21a in the third direction and the center of the second region 21b in the third direction. The third direction is perpendicular to the first plane (e.g., the Z-X plane) including the first direction and the second direction. The third direction is, for example, the Y-axis direction. The first region 21a is line-symmetric with respect to the line (e.g., the center line Lc). The second region 21b is line-symmetric with respect to the line (e.g., the center line Lc).

For example, a boundary Lie between the first region 21a and the third region 21c can be determined. For example, the direction in which the end of the first region 21a extends and the direction in which the end of the second region 21b extends are aligned with the X-axis direction. The direction in which at least a portion of the end of the third region 21c extends crosses the X-axis direction. One end (e.g., the first end portion 21ca) of the third region 21c includes a point P13. The direction in which the one end of the third region 21c extends starts to cross from the X-axis direction at the point P13. For example, the boundary Lie passes through the point P13 and is aligned with the Y-axis direction.

For example, a boundary L2e between the second region 21b and the third region 21c can be determined. Another one end (the second end portion 21cb) of the third region 21c includes a point P23. The direction in which the other one end of the third region 21c extends starts to cross from the X-axis direction at the point P23. For example, the boundary L2e passes through the point P23 and is aligned with the Y-axis direction.

The direction from the top portion 21pbe of the second protrusion 21pb toward the top portion 21pae of the first protrusion 21pa is taken as a top portion direction Dpp. A direction that is perpendicular to the first direction (the Z-axis direction) and crosses the top portion direction Dpp is taken as a top portion cross direction Dpn. The top portion direction Dpp and the top portion cross direction Dpn are tilted with respect to the second direction (e.g., the X-axis direction).

For example, protrusions are not provided in the first region 21a and the second region 21b. Also, the two protrusions (the first protrusion 21pa and the second protrusion 21pb) that have mutually-different positions in the X-axis direction are provided in the third region 21c.

Figure 2:
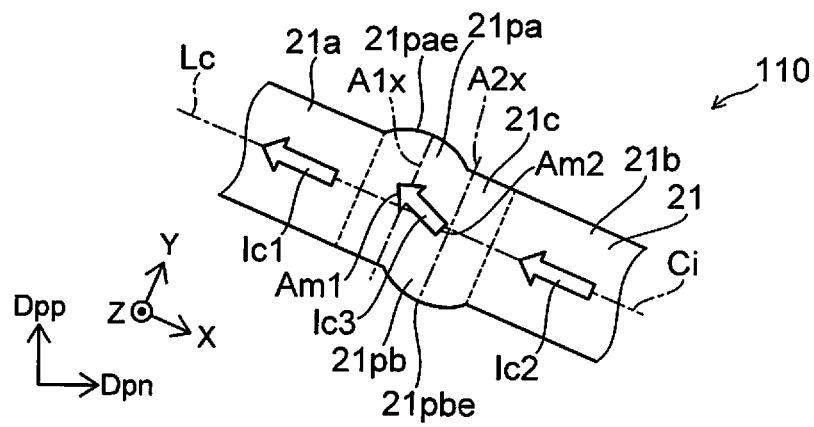
FIG. 2 is a schematic plan view illustrating an operation of the magnetic memory device according to the first embodiment.

FIG. 2 is a schematic plan view illustrating an operation of the magnetic memory device according to the first embodiment.

FIG. 2 illustrates a current flowing through the conductive layer 21. In the example, the current corresponds to the second current Iw2 (referring to FIG. 1A: having the orientation from the second region 21b toward the first region 21a).

Protrusions are not provided in the first region 21a and the second region 21b. A current Ic2 that flows through the second region 21b is aligned with the direction of the current center Ci. A current Ic1 that flows through the first region 21a is aligned with the direction of the current center Ci. The current Ic1 and the current Ic2 are aligned with the direction of the center line Lc.

On the other hand, a current Ic3 that flows through at least a portion of the third region 21c crosses the current center Ci. For example, a line A1x along the Y-axis direction that passes through the top portion 21pae of the first protrusion 21pa exists. The midpoint on the line A1x between the top portion 21pae and the second end portion 21cb is taken as a first midpoint Am1. A line A2x along the Y-axis direction that passes through the top portion 21pbe of the second protrusion 21pb exists. The midpoint on the line A2x between the top portion 21pbe and the first end portion 21ca is taken as a second midpoint Am2. For example, the current Ic3 is from the second midpoint Am2 toward the first midpoint Am1. The orientation of the current Ic3 crosses the orientation of the current Ic1 and crosses the orientation of the current Ic2.

As shown in FIG. 1B, the side surface (the surface crossing the X-Y plane) of the second magnetic layer 12 may include an unevenness. The size of the unevenness of the side surface of the second magnetic layer 12 is taken as an unevenness amount 12dp. The unevenness amount 12dp is the length in a direction crossing the X-Y plane and is the length (e.g., the average length) along the unevenness direction between the position of the convex portion and the position of the concave portion. The first protrusion 21pa has a first protrusion amount 21padp. The second protrusion 21pb has a second protrusion amount 21pbdp. At least one of the first protrusion amount 21padp or the second protrusion amount 21pbdp is, for example, 1.5 times the unevenness amount 12dp or more. At least one of the first protrusion amount 21padp or the second protrusion amount 21pbdp may be, for example, 2 times the unevenness amount 12dp or more.

At least one of the first protrusion amount 21padp or the second protrusion amount 21pbdp is 100 times the unevenness amount 12dp or less.

Figure 3A:
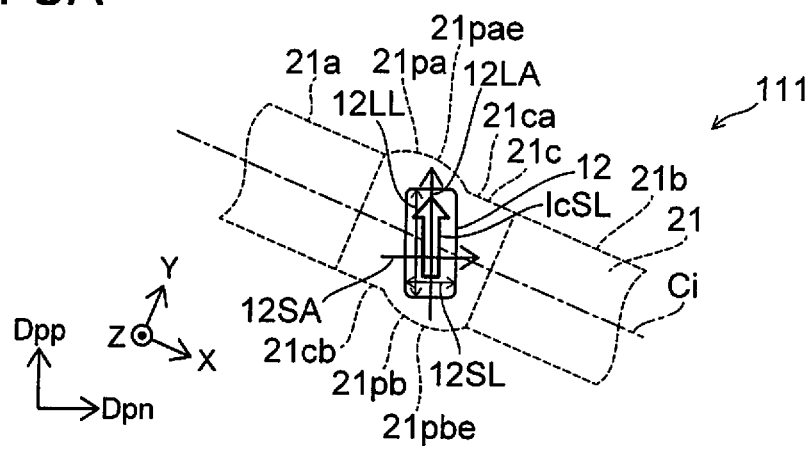
FIG. 3A and FIG. 3B are schematic plan views illustrating a magnetic memory device according to the first embodiment.
Figure 3B:
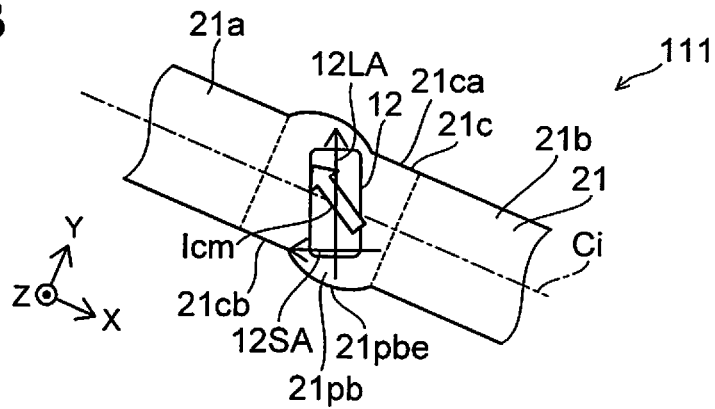

FIG. 3A and FIG. 3B are schematic plan views illustrating a magnetic memory device according to the first embodiment.

These drawings illustrate the magnetic memory device 111 of one example according to the embodiment. In the following description relating to the magnetic memory device 111, a description of at least some of the portions common to the magnetic memory device 110 is omitted. FIG. 3A illustrates the second magnetic layer 12. FIG. 3B illustrates the current in the magnetic memory device 111.

In the example of the magnetic memory device 111 as shown in FIG. 3A, the planar configuration of the second magnetic layer 12 is anisotropic. For example, in the X-Y plane, a length 12LL along one direction 12LA of the second magnetic layer 12 is different from a length 12SL along another one direction 12SA of the second magnetic layer 12. For example, the length 12LL is longer than the length 12SL. The direction 12LA and the direction 12SA recited above are along the X-Y plane. For example, the direction 12SA crosses (e.g., is perpendicular to) the direction 12LA. The direction 12LA and the direction 12SA are tilted with respect to the X-axis direction.

The easy magnetization axis of the second magnetic layer 12 crosses the X-axis direction. For example, the easy magnetization axis is tilted with respect to the X-axis direction. For example, the easy magnetization axis is aligned with the direction 12LA.

In the embodiment, the current Ic3 in the third region 21c (referring to FIG. 2) is tilted with respect to the direction 12LA. Thereby, the change of the second magnetization 12M of the second magnetic layer 12 due to the current Ic3 (referring to FIG. 1A) occurs efficiently. For example, the second magnetization 12M changes more easily; and more stable operations are obtained.

In the example of the magnetic memory device 111 as shown in FIG. 3A, the direction 12LA is aligned with the top portion direction Dpp. For example, the length 12LL of the second magnetic layer 12 recited above corresponds to the length of the second magnetic layer 12 along the top portion direction Dpp. The length 12SL of the second magnetic layer 12 recited above corresponds to the length of the second magnetic layer 12 along the top portion cross direction Dpn. For example, the length (the length 12LL) of the second magnetic layer 12 along the top portion direction Dpp is longer than the length (the length 12SL) of the second magnetic layer 12 along the top portion cross direction Dpn. The length 12LL may be longer than the length of the second magnetic layer 12 along the second direction (the X-axis direction).

In the embodiment as shown in FIG. 3A, the current Ic2 that flows through the second region 21b also flows through the third region 21c and flows in the second magnetic layer 12. Current division of the current occurs. A current IcSL that flows through the second magnetic layer 12 has a component along the direction 12LA. In the portion of the conductive layer 21 including the third region 21c, the current includes the current IcSL flowing through the second magnetic layer 12 and the current Ic3 flowing through the third region 21c (referring to FIG. 2).

As shown in FIG. 3B, a program current Icm in the portion including the third region 21c corresponds to the synthesis of the current Ic3 flowing through the third region 21c (referring to FIG. 2) and the current IcSL flowing through the second magnetic layer 12 (FIG. 3A). Accordingly, the orientation of the program current Icm corresponding to the synthesis is between the current Ic3 and the orientation of the current IcSL (the orientation along the direction 12LA).

For example, in the portion including the third region 21c, the orientation of the program current Icm is tilted with respect to the direction 12LA (e.g., the major-axis direction) and the other one direction 12SA (e.g., the minor-axis direction).

For example, there is a method in which the precession mode is used in a magnetic memory device using a SOT (Spin Orbit Torque) effect. In this method, the easy magnetization axis of the memory layer is orthogonal to the direction of the program current flowing in the SOL layer. For the precession mode, an operation that has low consumed energy is possible. On the other hand, there is also a method in which the easy magnetization axis of the memory layer is set to be parallel to the direction of the program current flowing in the SOL layer; and an external magnetic field is used. In this method, the memory layer can be programmed at a high speed; but the consumed energy is large. Generally, it is difficult to obtain a small consumed energy and a high-speed operation.

In the embodiment, for example, the current Icm in the third region 21c of the conductive layer 21 is tilted with respect to the direction of the easy magnetization axis of the second magnetic layer 12 (e.g., the second magnetization 12M). Thereby, the consumed energy can be small. High-speed operations can be obtained. According to the embodiment, for example, a spintronics magnetic memory device having high-speed operations can be provided in which a decrease of the consumed energy can be realized.

For example, strain that corresponds to the configuration of an isolatively patterned MTJ element is introduced to the SO layer (the conductive layer 21) connected to the MTJ element. For example, the strain-induced defect occurrence when applying a current for recording can be suppressed by copying the unevenness of the MTJ pattern edge to the patterned edge of the SO layer pattern. In such a case, the shift in the conduction direction of the SO layer of the protrusion can disperse, between the left and right of the SO layer, the nonuniform stress applied to the protrusion sidewall which is a nonlinear portion. Therefore, the life can be extended due to the strain-caused migration of the SO layer itself. For example, the reliability can be increased. For example, a large current can be caused to flow; therefore, high-speed recording becomes possible.

Several examples of the magnetic memory device according to the first embodiment will now be described. In the following description relating to the magnetic memory device, a description of at least some of the portions common to the magnetic memory device described above is omitted.

Figure 4:
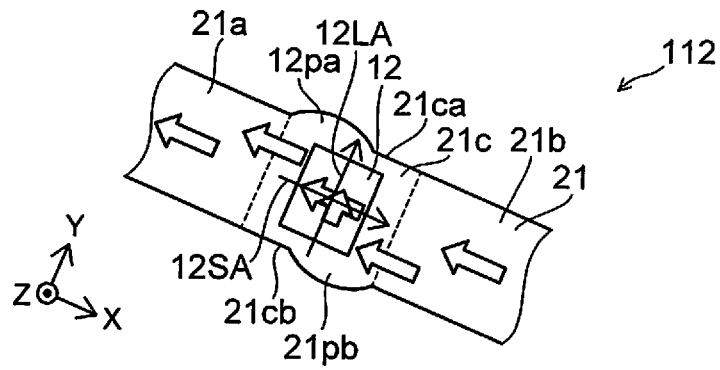
FIG. 4 is a schematic plan view illustrating a magnetic memory device according to the first embodiment.

FIG. 4 is a schematic plan view illustrating a magnetic memory device according to the first embodiment.

In the magnetic memory device 112 according to the embodiment as shown in FIG. 4, the direction 12LA (e.g., the major-axis direction) is aligned with the Y-axis direction. The direction 12SA (e.g., the minor-axis direction) is aligned with the X-axis direction. Even in such a case, for example, the orientation of the program current Icm (referring to FIG. 3B) is tilted with respect to the direction 12LA and the direction 12SA. For example, in the third region 21c of the conductive layer 21, the current is tilted with respect to the direction of the easy magnetization axis of the second magnetic layer 12 (e.g., the second magnetization 12M).

Figure 5A:
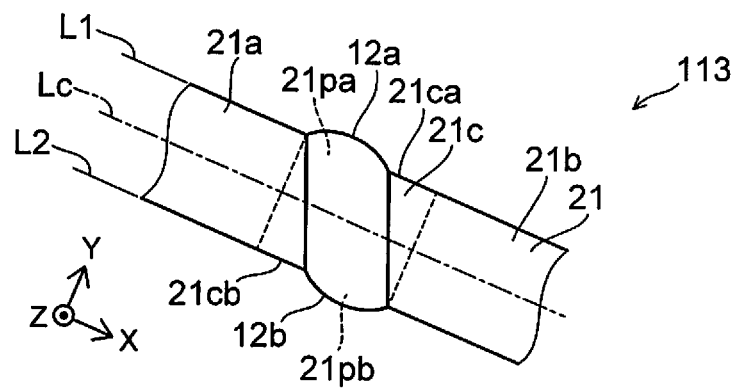
FIG. 5A and FIG. 5B are schematic plan views illustrating a magnetic memory device according to the first embodiment.
Figure 5B:
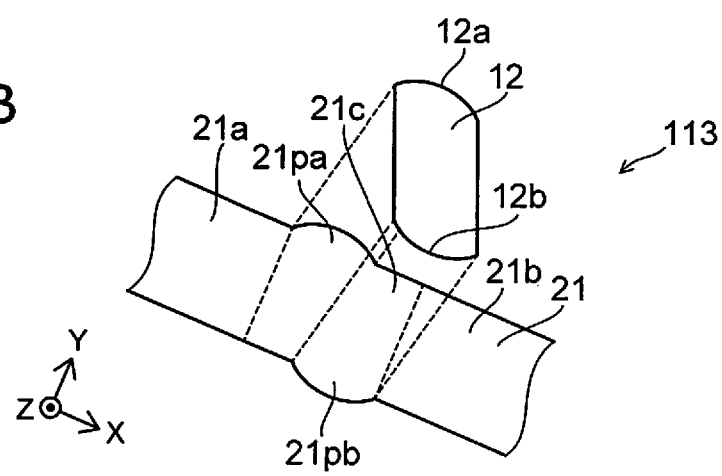

FIG. 5A and FIG. 5B are schematic plan views illustrating a magnetic memory device according to the first embodiment.

In the magnetic memory device 113 according to the embodiment as shown in FIG. 5A and FIG. 5B, a portion (a portion 12a) of the second magnetic layer 12 is along at least a portion of the first protrusion 21pa. Another portion (a portion 12b) of the second magnetic layer 12 is along at least a portion of the second protrusion 21pb. The planar configuration of the second magnetic layer 12 is substantially a parallelogram.

Figure 6A:
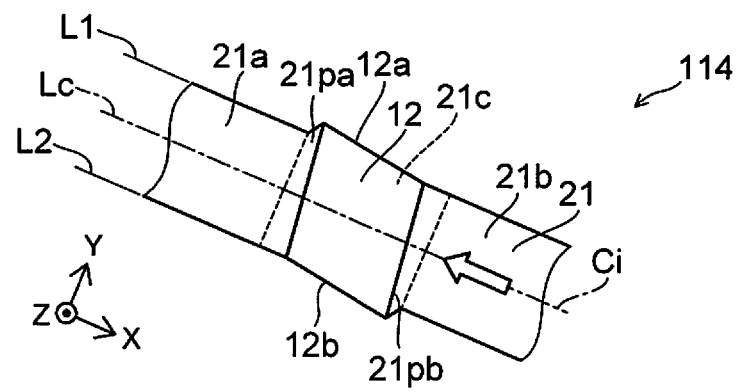
FIG. 6A and FIG. 6B are schematic plan views illustrating a magnetic memory device according to the first embodiment.
Figure 6B:
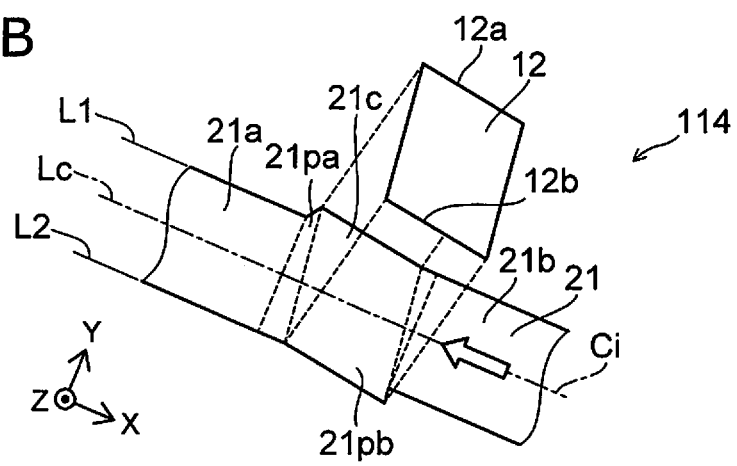

FIG. 6A and FIG. 6B are schematic plan views illustrating a magnetic memory device according to the first embodiment.

In the magnetic memory device 114 according to the embodiment as shown in FIG. 6A and FIG. 6B, the portion (the portion 12a) of the second magnetic layer 12 is along at least a portion of the first protrusion 21pa. The other portion (the portion 12b) of the second magnetic layer 12 is along at least a portion of the second protrusion 21pb.

In the magnetic memory devices 113 and 114, the short side of the second magnetic layer 12 is aligned with the end portion of the conductive layer 21. For example, the position in the X-Y plane of the short side of the second magnetic layer 12 may substantially match the position in the X-Y plane of the end portion of the conductive layer 21. In the example, the planar configuration of the third region 21c is point-symmetric with respect to the centroid 21cc of the planar configuration of the third region 21c (referring to FIG. 1B). The planar configuration of the second magnetic layer 12 is point-symmetric with respect to the centroid of the planar configuration of the second magnetic layer 12.

In the magnetic memory devices 113 and 114, the long side of the second magnetic layer 12 is tilted with respect to the X-axis direction.

In the magnetic memory devices 113 and 114, compared to the case where the portion (the portion 12a) of the second magnetic layer 12 is not along at least a portion of the first protrusion 21pa, the surface area of the second magnetic layer 12 can be set to be large. The retention energy of the second magnetic layer 12 can be set to be large.

For example, in the magnetic memory devices 113 and 114, compared to the case where the portion (the portion 12a) of the second magnetic layer 12 is not along at least a portion of the first protrusion 21pa, a magnetic domain is not formed easily in the second magnetic layer 12. For example, the program error rate can be improved.

In the magnetic memory devices 113 and 114, for example, the center of the current flowing through the second region 21b can be shifted from the center line Lc toward the second protrusion 21pb side. Also, the center of the current flowing through the first region 21a can be shifted from the center line Lc toward the first protrusion 21pa side. For example, the programming efficiency can be increased. For example, the program error rate can be improved.

Figure 7A:
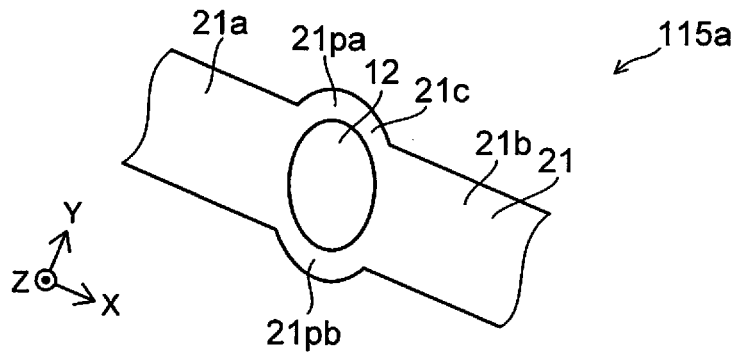
FIG. 7A to FIG. 7C are schematic plan views illustrating magnetic memory devices according to the first embodiment.
Figure 7B:
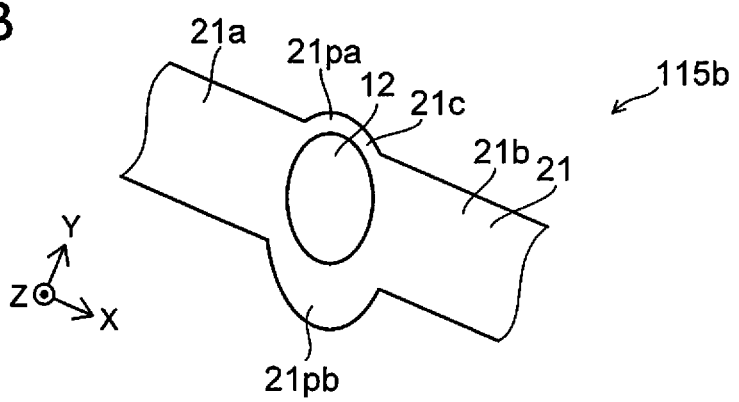
Figure 7C:
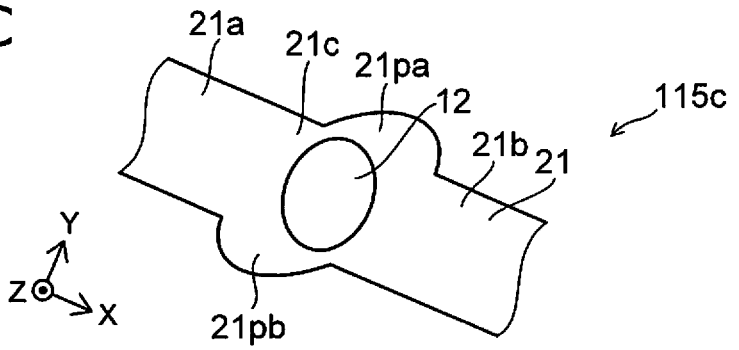

FIG. 7A to FIG. 7C are schematic plan views illustrating magnetic memory devices according to the first embodiment.

As shown in these drawings, the first protrusion 21pa and the second protrusion 21pb are provided in the magnetic memory devices 115a to 115c according to the embodiment as well. The third region 21c is non-line-symmetric. The planar configuration of the second magnetic layer 12 is substantially a flattened circle (including an ellipse). In the magnetic memory device 115a, the protrusion amounts of the first protrusion 21pa and the second protrusion 21pb are substantially the same. In the magnetic memory device 115b, the protrusion amount of the first protrusion 21pa is different from the protrusion amount of the second protrusion 21pb. In the magnetic memory device 115c, the direction from the first protrusion 21pa toward the second protrusion 21pb crosses the major axis (or the minor axis) of the second magnetic layer 12. In the magnetic memory device 115c, the major axis of the second magnetic layer 12 is aligned with the Y-axis direction. In the magnetic memory device 115c, the minor axis of the second magnetic layer 12 is aligned with the X-axis direction.

Figure 8A:
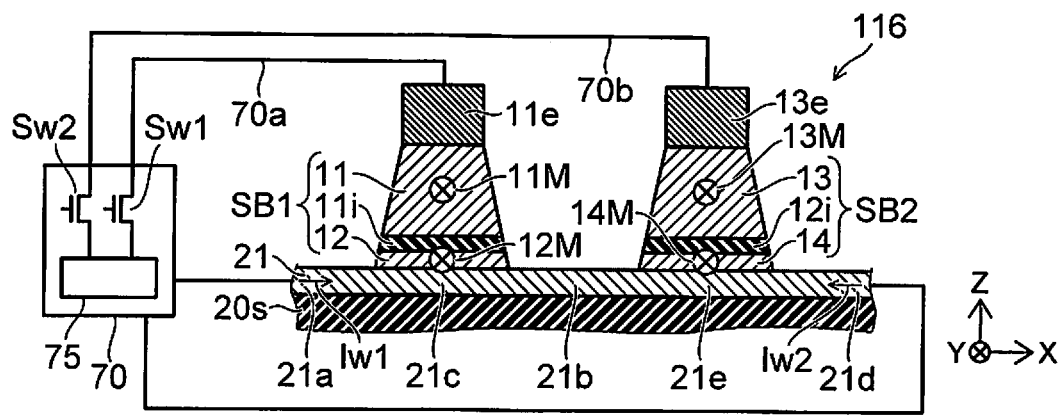
FIG. 8A and FIG. 8B are schematic views illustrating a magnetic memory device according to the first embodiment.
Figure 8B:
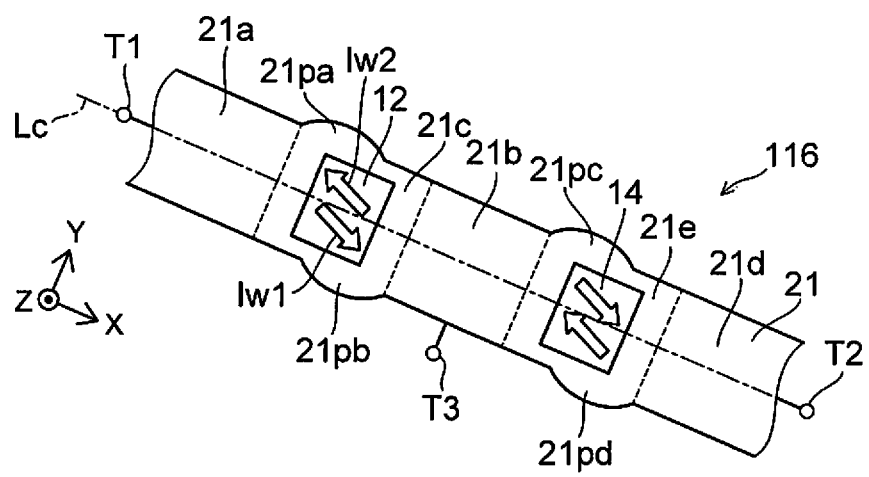

FIG. 8A and FIG. 8B are schematic views illustrating a magnetic memory device according to the first embodiment.

A portion of FIG. 8A shows an example of a cross-sectional view along the center line Lc of FIG. 8B. FIG. 8B is a plan view showing an example of a portion of the magnetic memory device.

As shown in FIG. 8A, the magnetic memory device 116 according to the embodiment further includes a third magnetic layer 13, a fourth magnetic layer 14, and a second nonmagnetic layer 12i in addition to the conductive layer 21, the first magnetic layer 11, the second magnetic layer 12, and the first nonmagnetic layer 11i. The configurations described above are applicable to the first magnetic layer 11, the second magnetic layer 12, and the first nonmagnetic layer 11i. The conductive layer 21, the third magnetic layer 13, the fourth magnetic layer 14, and the second nonmagnetic layer 12i of the magnetic memory device 116 will now be described.

The conductive layer 21 further includes a fourth region 21d and a fifth region 21e in addition to the first region 21a, the second region 21b, and the third region 21c. The second region 21b is positioned between the first region 21a and the fourth region 21d in the second direction (e.g., the X-axis direction). The fifth region 21e is positioned between the second region 21b and the fourth region 21d in the second direction.

The third magnetic layer 13 is separated from the fifth region 21e in the first direction (the Z-axis direction). The direction from the first magnetic layer 11 toward the third magnetic layer 13 is aligned with the X-axis direction. The fourth magnetic layer 14 is provided between the fifth region 21e and the third magnetic layer 13 in the first direction. The second nonmagnetic layer 12i is provided between the third magnetic layer 13 and the fourth magnetic layer 14. Another layer may be provided between the third magnetic layer 13 and the second nonmagnetic layer 12i. Another layer may be provided between the fourth magnetic layer 14 and the second nonmagnetic layer 12i.

The configurations of the first magnetic layer 11 and the second magnetic layer 12 are applicable respectively to the third magnetic layer 13 and the fourth magnetic layer 14. The configuration of the first nonmagnetic layer 11i is applicable to the second nonmagnetic layer 12i.

The third magnetic layer 13, the fourth magnetic layer 14, and the second nonmagnetic layer 12i are included in a second stacked body SB2. For example, the second stacked body SB2 corresponds to another one memory portion (memory cell). In the example, a second electrode 13e is provided on the third magnetic layer 13. For example, the conductive layer 21 and the fourth magnetic layer 14 contact each other.

A third magnetization 13M of the third magnetic layer 13 does not change easily compared to a fourth magnetization 14M of the fourth magnetic layer 14. For example, the third magnetic layer 13 functions as a reference layer. For example, the fourth magnetic layer 14 functions as a memory layer.

The fourth magnetization 14M of the fourth magnetic layer 14 changes due to the current (e.g., the first current Iw1, the second current Iw2, or the like) flowing in the conductive layer 21.

For example, the controller 70 is electrically connected to the first region 21a, the fourth region 21d, the first magnetic layer 11, and the third magnetic layer 13. As described above, the first switch Sw1 (e.g., a transistor) is provided in the current path between the first magnetic layer 11 and the drive circuit 75 of the controller 70. On the other hand, a second switch Sw2 (e.g., a transistor) is provided in a current path between the drive circuit 75 and the third magnetic layer 13. These switches are included in the controller 70. The drive circuit 75 and the third magnetic layer 13 are electrically connected by a second interconnect 70b.

In the first operation (the first program operation), the controller 70 supplies the first current Iw1 (the first program current) to the conductive layer 21. Thereby, the first state is formed. In one example, the first current Iw1 is a current from the first region 21a toward the fourth region 21d. In the second operation (the second program operation), the controller 70 supplies the second current Iw2 (the second program current) to the conductive layer 21. Thereby, the second state is formed. In one example, the second program current Iw2 is a current from the fourth region 21d toward the first region 21a.

Even in such a case, the first electrical resistance between the first magnetic layer 11 and the conductive layer 21 (e.g., the first region 21a) after the first operation (in the first state) is different from the second electrical resistance between the first magnetic layer 11 and the conductive layer 21 (e.g., the first region 21a) after the second operation (in the second state).

A third state is formed in the second stacked body SB2 when the controller 70 supplies first current Iw1 to the conductive layer 21. A fourth state is formed in the second stacked body SB2 when the controller 70 supplies a second current Iw2 to the conductive layer 21. A third electrical resistance between the third magnetic layer 13 and the conductive layer 21 (the first region 21a) in the third state is different from a fourth electrical resistance between the third magnetic layer 13 and the conductive layer 21 (the first region 21a) in the fourth state.

For example, the electrical resistance difference is based on the difference of the states of the fourth magnetization 14M between the third state and the fourth state.

In the read operation, the controller 70 may detect a characteristic (which may be a voltage, a current, or the like) corresponding to the electrical resistance between the third magnetic layer 13 and the conductive layer 21 (the first region 21a).

One of the first stacked body SB1 (a first memory cell) or the second stacked body SB2 (a second memory cell) is selected by the operations of the first switch Sw1 and the second switch Sw2 recited above. The program operation and the read operation are performed for the desired memory cell. Examples of the operations by the controller 70 are described below.

In the conductive layer 21 as shown in FIG. 8B, the planar configuration of the fifth region 21e is substantially the same as the planar configuration of the third region 21c. For example, one of the configurations described above for the third region 21c is applicable to the fifth region 21e. The planar configuration of the fourth magnetic layer 14 is substantially the same as the planar configuration of the second magnetic layer 12. For example, one of the configurations described above for the second magnetic layer 12 is applicable to the fourth magnetic layer 14.

For example, a third protrusion 21pc and a fourth protrusion 21pd are provided in the fifth region 21e.

In the magnetic memory device 116 as shown in FIG. 8A, the program current may flow from the first region 21a toward the fourth region 21d. Or, the program current may flow from the fourth region 21d toward the first region 21a.

In the magnetic memory device 116 as shown in FIG. 8B, the program current may flow along another path. As shown in FIG. 8B, a first terminal T1 is provided in the first region 21a. A second terminal T2 is provided in the fourth region 21d. A third terminal T3 is provided in the second region 21b. The controller 70 (e.g., referring to FIG. 8B) is electrically connected to these terminals.

For example, in one program operation, the current flows from the third terminal T3 toward the first terminal T1. In the one program operation, another current flows from the third terminal T3 toward the second terminal T2.

Or, for example, in another one program operation, the current flows from the first terminal T1 toward the third terminal T3. In the other one program operation, another current flows from the first terminal T1 toward the third terminal T3.

In such operations, mutually-different (e.g., reverse) magnetizations are stored in the second magnetic layer 12 and the fourth magnetic layer 14. For example, complimentary data is stored in these magnetic layers. For example, the programmed information can be reproduced by reading (differential reading) the difference between the multiple signals obtained respectively from these magnetic layers. Such an operation may be performed in the magnetic memory device 116. An example of such an operation is described below.

In the magnetic memory device 116 as shown in FIG. 8B, the minor axis of the second magnetic layer 12 and the minor axis of the fourth magnetic layer 14 are aligned with the X-axis direction. The major axis of the second magnetic layer 12 and the major axis of the fourth magnetic layer 14 are aligned with the Y-axis direction. In the magnetic memory device 116, the end portion of the second magnetic layer 12 and the end portion of the fourth magnetic layer 14 are aligned with a line aligned with the end portion of the first region 21a, the end portion of the second region 21b, and the end portion of the fourth region 21d. Various modifications of the axes of the magnetic layers and the end portions of the magnetic layers are possible in the embodiment.

Figure 9A:
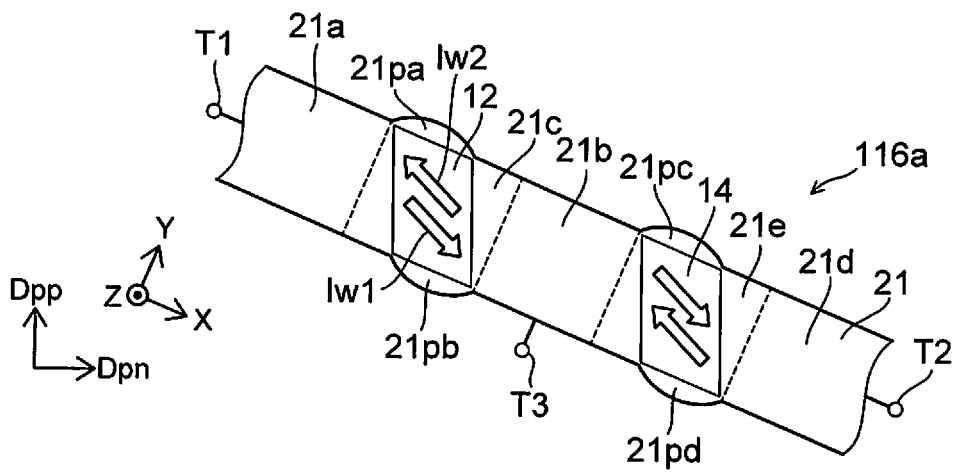
FIG. 9A to FIG. 9C are schematic plan views illustrating magnetic memory devices according to the first embodiment.
Figure 9B:
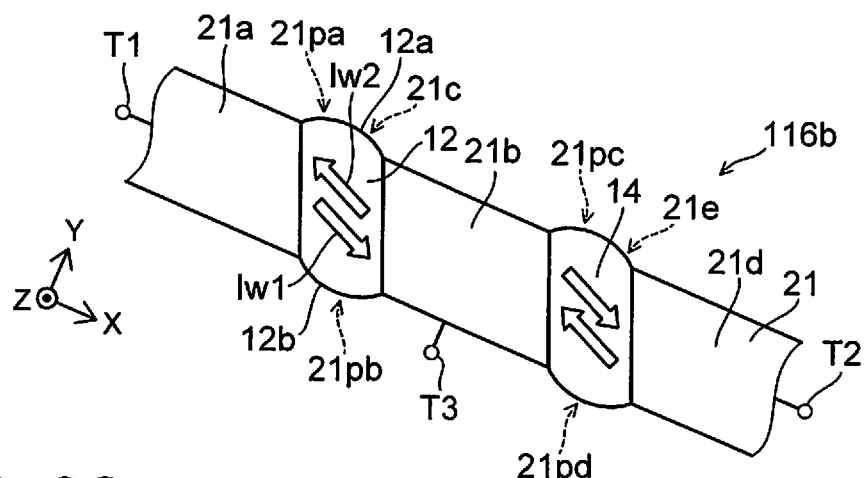
Figure 9C:
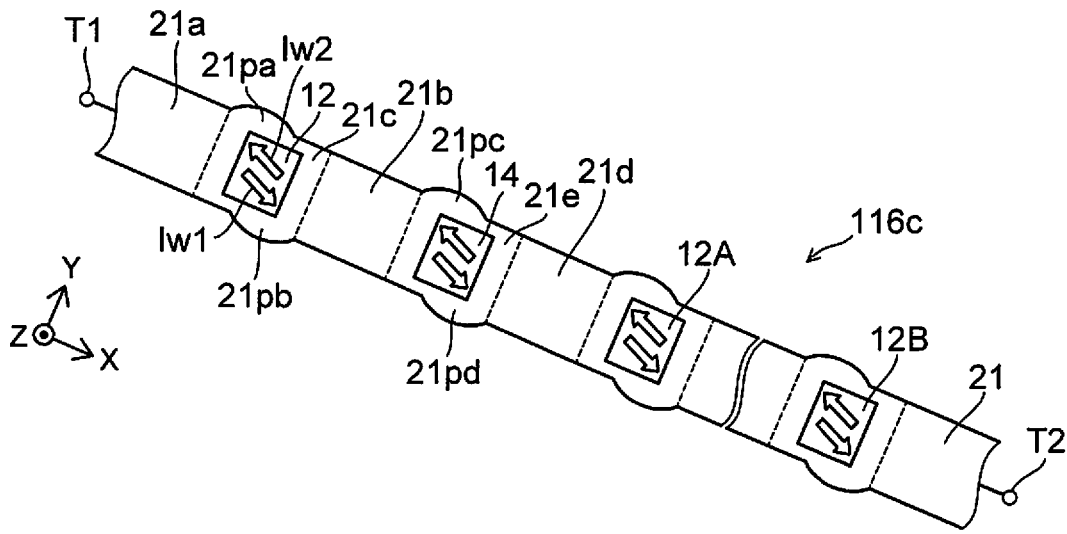

FIG. 9A to FIG. 9C are schematic plan views illustrating magnetic memory devices according to the first embodiment.

These drawings show examples of the configurations of the conductive layer 21 and the magnetic layers.

In a magnetic memory device 116a as shown in FIG. 9A as well, the first to fifth regions 21a to 21e are provided in the conductive layer 21. In the magnetic memory device 116a, the major axis of the second magnetic layer 12 and the major axis of the fourth magnetic layer 14 are aligned with the top portion direction Dpp. As described above, the top portion direction Dpp is from the top portion 21pbe of the second protrusion 21pb toward the top portion 21pae of the first protrusion 21pa. In the magnetic memory device 116a as well, the operation described in reference to FIG. 8B may be performed.

In a magnetic memory device 116b as shown in FIG. 9B, the major axis of the second magnetic layer 12 and the major axis of the fourth magnetic layer 14 are aligned with the top portion direction Dpp. The end portion of the second magnetic layer 12 is aligned with the end portion of the third region 21c. The end portion of the fourth magnetic layer 14 is aligned with the end portion of the fifth region 21e. For example, a portion (the portion 12a, e.g., the end portion) of the second magnetic layer 12 is along at least a portion of the first protrusion 21pa. For example, another portion (the portion 12b, e.g., the end portion) of the second magnetic layer 12 is along at least a portion of the second protrusion 21pb. In the magnetic memory device 116b as well, the operation described in reference to FIG. 8B may be performed.

In a magnetic memory device 116c as shown in FIG. 9C, other regions are provided in the conductive layer 21 in addition to the first to fifth regions 21a to 21e. In the magnetic memory device 116c, four memory layers (the second magnetic layer 12, the fourth magnetic layer 14, a magnetic layer 12A, a magnetic layer 12B, etc.) are provided. The number of these memory layers is arbitrary.

For example, the first terminal T1 is provided at one end (e.g., the first region 21a) of the conductive layer 21. The second terminal T2 is provided at another one end of the conductive layer 21. For example, in one program operation, the current flows from the first terminal T1 toward the second terminal T2. For example, in another one program operation, the current flows from the second terminal T2 toward the first terminal T1.

For example, "0" can be programmed to all of the magnetic layers (e.g., the second magnetic layer 12, the fourth magnetic layer 14, the magnetic layer 12A, the magnetic layer 12B, etc.). For example, a flushing operation can be performed. Subsequently, "1" is programmed to the selected memory layer. In the selection, for example, a voltage (a select voltage) is applied to the stacked body (the memory cell) including the magnetic layer. The energy barrier is reduced by the application of the select voltage. On the other hand, another voltage (an unselect voltage) is applied to the unselected stacked bodies. The energy barrier due to the application of the unselect voltage increases to be higher than the energy barrier due to the application of the select voltage. "1" is programmed to the desired cell by causing a current to flow in the reverse direction in the conductive layer 21 while applying such a select voltage or such an unselect voltage.

Figure 10:
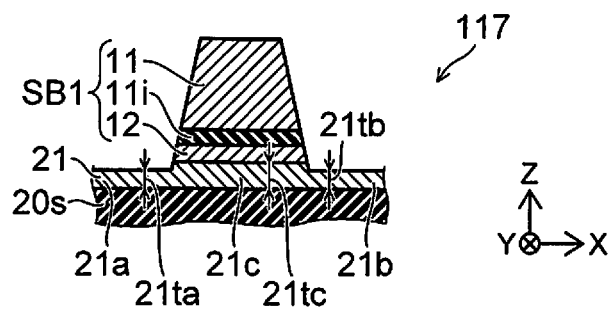
FIG. 10 is a schematic cross section illustrating a magnetic memory device according to the first embodiment.

FIG. 10 is a schematic cross section illustrating a magnetic memory device according to the first embodiment.

FIG. 10 corresponds to a schematic cross-sectional view corresponding to FIG. 1A.

As shown in FIG. 10, the conductive layer 21, the first magnetic layer 11, the second magnetic layer 12, and the first nonmagnetic layer 11i are provided in the magnetic memory device 117 according to the embodiment as well. In the magnetic memory device 117, the thickness of the conductive layer 21 is different by location (region). Otherwise, the configuration of the magnetic memory device 117 is similar to that of the magnetic memory device 110 (or a magnetic memory device recited above according to the embodiment).

In the magnetic memory device 117, the third region 21c includes a region overlapping the second magnetic layer 12.

This region overlaps the second magnetic layer 12 in the first direction (the Z-axis direction). A thickness 21*tc* along the first direction of the overlapping region is thicker than a thickness 21*ta* along the first direction of the first region 21*a*. The thickness 21*tc* is thicker than a thickness 21*tb* along the first direction of the second region 21*b*. By such a relationship of the thicknesses, for example, the effect of the effect of the protrusions can be strengthened. The operations become more stable.

In the magnetic memory devices 112 to 114, 115*a* to 115*c*, 116, 116*a* to 116*c*, and 117 recited above as well, for example, the consumed energy can be small. High-speed operations can be obtained. More stable operations are obtained.

Second Embodiment

In a second embodiment as well, the conductive layer 21, the first magnetic layer 11, the second magnetic layer 12, and the first nonmagnetic layer 11*i* are provided in the magnetic memory device. For example, the structures of the cross sections of these elements are similar to the structures of the cross sections of the magnetic memory device 110 (referring to FIG. 1A). The planar configuration of the conductive layer 21 of the second embodiment is different from the planar configuration of the conductive layer 21 of the first embodiment. Examples of the planar configuration of the conductive layer 21 of the second embodiment will now be described. In the following description, at least a portion of the configuration similar to the first embodiment is omitted as appropriate.

Figure 11:
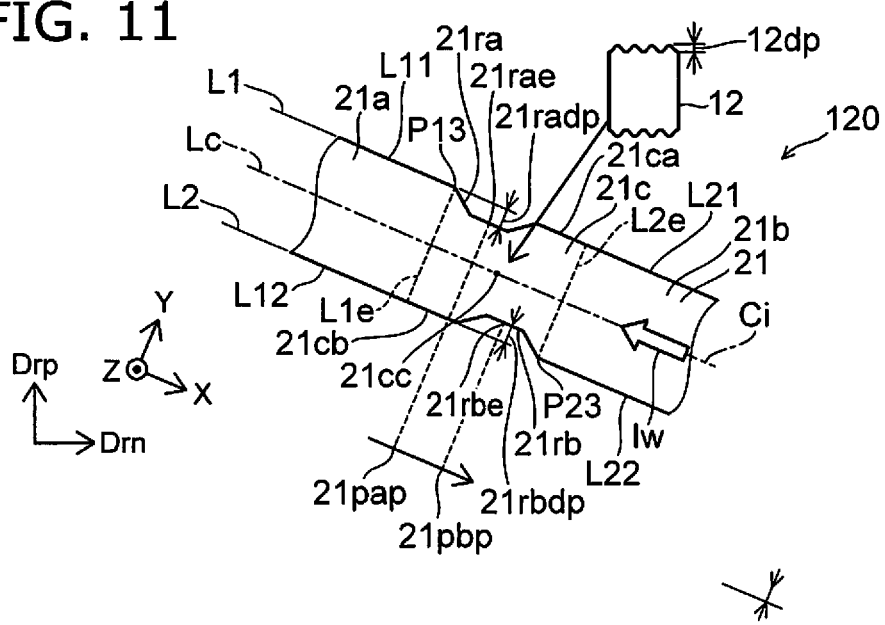
FIG. 11 is a schematic plan view illustrating a magnetic memory device according to the second embodiment.

FIG. 11 is a schematic plan view illustrating a magnetic memory device according to the second embodiment.

FIG. 11 is a plan view showing an example of a portion (the conductive layer 21) of the magnetic memory device 120 according to the embodiment. In the example as shown in FIG. 11 as well, the conductive layer 21 includes the first region 21*a*, the second region 21*b*, and the third region 21*c*. Even in such a case, the third region 21*c* is provided between the first region 21*a* and the second region 21*b*. Even in such a case, the third region 21*c* includes the first end portion 21*ca* and the second end portion 21*cb*. The direction from the second end portion 21*cb* toward the first end portion 21*ca* crosses the first plane (the Z-X plane). The first plane includes the first direction (the Z-axis direction) and the second direction (e.g., the X-axis direction).

The first end portion 21*ca* includes a first recess 21*ra* (e.g., a first concave portion). At least a portion of the first recess 21*ra* recedes in the orientation from the first end portion 21*ca* toward the second end portion 21*cb*. The orientation of the recession of at least a portion of the first recess 21*ra* is the orientation from the first end portion 21*ca* toward the second end portion 21*cb*.

The second end portion 21*cb* includes a second recess 21*rb* (e.g., a second concave portion). At least a portion of the second recess 21*rb* recedes in the orientation from the second end portion 21*cb* toward the first end portion 21*ca*. The orientation of the recession of at least a portion of the second recess 21*rb* is the orientation from the second end portion 21*cb* toward the first end portion 21*ca*.

A first position 21*rap* along the second direction (e.g., the X-axis direction) of the first recess 21*ra* is different from a second position 21*rbp* along the second direction of the second recess 21*rb*. For example, the first position 21*rap* along the second direction (e.g., the X-axis direction) of the first recess 21*ra* is shifted from the second position 21*rbp* along the second direction of the second recess 21*rb*.

For example, the first position 21*rap* is a position along the second direction (e.g., the X-axis direction) of a bottom portion 21*rae* of the first recess 21*ra*. In the first recess 21*ra*, the bottom portion 21*rae* recedes most. In the case where the first recess 21*ra* includes a portion along the X-axis direction, the midpoint of the portion may be taken as the bottom portion 21*rae*.

For example, the second position 21*rbp* is the position along the second direction (e.g., the X-axis direction) of a bottom portion 21*rbe* of the second recess 21*rb*. In the second recess 21*rb*, the bottom portion 21*rbe* recedes most. In the case where the second recess 21*rb* includes a portion along the X-axis direction, the midpoint of the portion may be taken as the bottom portion 21*rbe*.

Thus, in the magnetic memory device 120, two recesses (the first recess 21*ra* and the second recess 21*rb*) are provided in the third region 21*c*. Also, the positions along the X-axis direction of the first recess 21*ra* and the second recess 21*rb* are different from each other. For example, the current that flows through the third region 21*c* has a component crossing the X-axis direction. For example, the planar distribution of the current direction in the third region 21*c* is larger than the planar distribution of the current direction in the first region 21*a* and the second region 21*b*. The trigger of the change of the magnetization of the second magnetic layer 12 occurs easily. For example, the second magnetization 12M of the second magnetic layer 12 changes easily based on the current. Thereby, more stable operations are obtained.

In the magnetic memory device 120, the planar configuration of the third region 21*c* is asymmetric with respect to the X-axis direction.

For example, the configuration of the first end portion 21*ca* in at least one cross section along the Z-Y plane may be different from the configuration of the second end portion 21*cb* in the at least one cross section. For example, the at least one cross section passes through the first recess 21*ra*. For example, the at least one cross section may pass through the second recess 21*rb*.

For example, the configuration of the first end portion 21*ca* in at least one cross section perpendicular to the first plane (e.g., the Z-X plane) including the first direction and the second direction recited above may be different from the configuration of the second end portion 21*cb* in the at least one cross section.

For example, the distance (the first distance) along the second direction between the one cross section and the first region 21*a* is different from the distance (the second distance) along the second direction between the one cross section and the second region 21*b*.

For example, the configuration (e.g., the planar configuration) of the third region 21*c* is point-symmetric with respect to the centroid 21*cc* of the configuration of the third region 21*c*.

For example, the first region 21*a* includes the end portion L11 and the end portion L12. For example, these end portions are aligned with the X-axis direction. For example, the second region 21*b* includes the end portion L21 and the end portion L22. For example, these end portions are aligned with the X-axis direction. For example, the end portion L11 and the end portion L21 are aligned with the first straight line L1. For example, the end portion L12 and the end portion L21 are aligned with the second straight line L2. For example, these straight lines are aligned with the second direction (e.g., the X-axis direction). The first recess 21*ra* is recessed from the first straight line L1. The second recess 21*rb* is recessed from the second straight line L2.

For example, the center line Lc passes through the center in the Y-axis direction of the first region 21*a* and the center in the Y-axis direction of the second region 21b. The center line Lc is aligned with the X-axis direction. The center of the current (e.g., the program current) flowing through the conductive layer 21 passes through the current center Ci in the first region 21a and the second region 21b. The current center Ci substantially corresponds to the center line Lc.

The planar configuration of the first region 21a and the planar configuration of the second region 21b are substantially symmetric (line-symmetric) with respect to the center line Lc. On the other hand, the planar configuration (the configuration in the X-Y plane) of the third region 21c is asymmetric (non-line-symmetric) with respect to the center line Lc.

For example, the boundary L1e between the first region 21a and the third region 21c can be determined. For example, the boundary L1e passes through the point P13 and is aligned with the Y-axis direction. For example, the boundary L2e between the second region 21b and the third region 21c can be determined. For example, the boundary L2e passes through the point P23 and is aligned with the Y-axis direction.

The direction from the bottom portion 21rbe of the second recess 21rb toward the bottom portion 21rae of the first recess 21ra is taken as a bottom portion direction Drp. A direction that crosses the bottom portion direction Drp and is perpendicular to the first direction (the Z-axis direction) is taken as a bottom portion cross direction Drn. The bottom portion direction Drp and the bottom portion cross direction Drn are tilted with respect to the second direction (e.g., the X-axis direction).

For example, recesses are not provided in the first region 21a and the second region 21b. Also, the two recesses (the first recess 21ra and the second recess 21rb) that have mutually-different positions in the X-axis direction are provided in the third region 21c.

As shown in FIG. 11, the side surface (the surface crossing the X-Y plane) of the second magnetic layer 12 may include an unevenness. The size (e.g., the average size) of the unevenness of the side surface of the second magnetic layer 12 is taken as the unevenness amount 12dp. The first recess 21ra has a first recessed amount 21radp. The second recess 21rb has a second recessed amount 21rbdp. At least one of the first recessed amount 21radp or the second recessed amount 21rbdp is, for example, 1.5 times the unevenness amount 12dp or more. At least one of the first recessed amount 21radp or the second recessed amount 21rbdp may be, for example, 2 times the unevenness amount 12dp or more. At least one of the first recessed amount 21radp or the second recessed amount 21rbdp is 100 times the unevenness amount 12dp or less.

Figure 12:
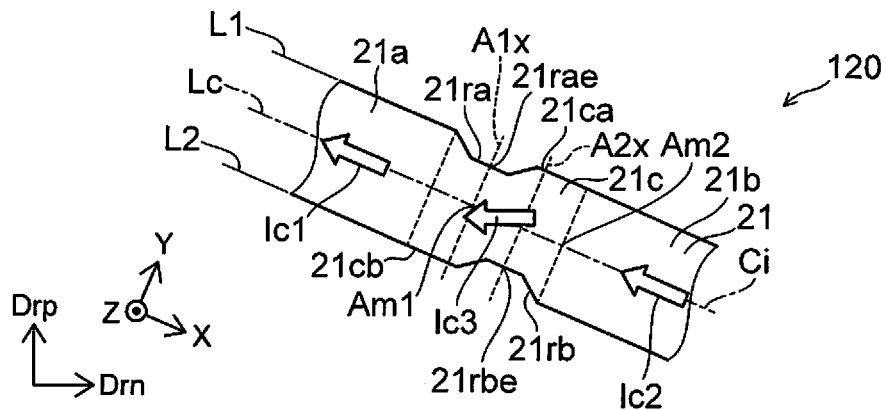
FIG. 12 is a schematic plan view illustrating the operation of the magnetic memory device according to the second embodiment.

FIG. 12 is a schematic plan view illustrating the operation of the magnetic memory device according to the second embodiment.

FIG. 12 illustrates the current flowing through the conductive layer 21. In the example, the current corresponds to the second current Iw2 (referring to FIG. 1A: an orientation from the second region 21b toward the first region 21a).

Recesses are not provided in the first region 21a and the second region 21b. The current Ic2 that flows through the second region 21b is aligned with the direction of the current center Ci. The current Ic1 flowing through the first region 21a is aligned with the direction of the current center Ci. The current Ic1 and the current Ic2 are aligned with the center line Lc.

On the other hand, the current Ic3 that flows through at least a portion of the third region 21c crosses the current center Ci. For example, the line A1x that passes through the bottom portion 21rae of the first recess 21ra along the Y-axis direction exists. The midpoint on the line A1x between the bottom portion 21rae and the second end portion 21cb is taken as the first midpoint Am1. The line A2x that passes through the bottom portion 21rbe of the second recess 21rb along the Y-axis direction exists. The midpoint on the line A2x between the bottom portion 21rbe and the first end portion 21ca is taken as the second midpoint Am2. For example, the current Ic3 is from the second midpoint Am2 toward the first midpoint Am1. The orientation of the current Ic3 crosses the orientation of the current Ic1 and crosses the orientation of the current Ic2.

Figure 13A:
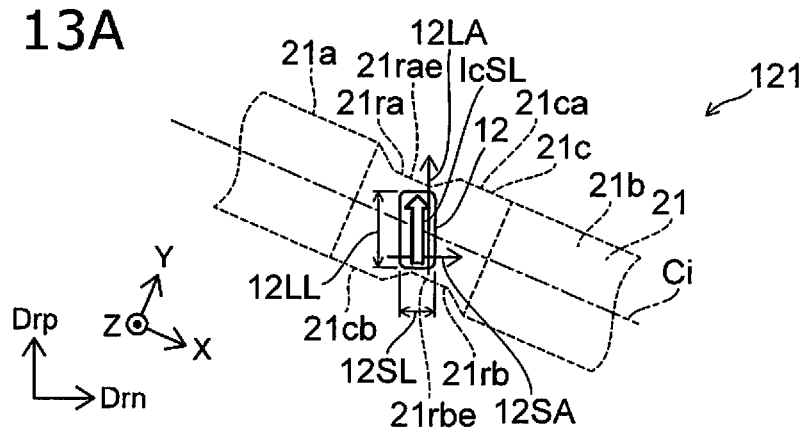
FIG. 13A and FIG. 13B are schematic plan views illustrating a magnetic memory device according to the second embodiment.
Figure 13B:
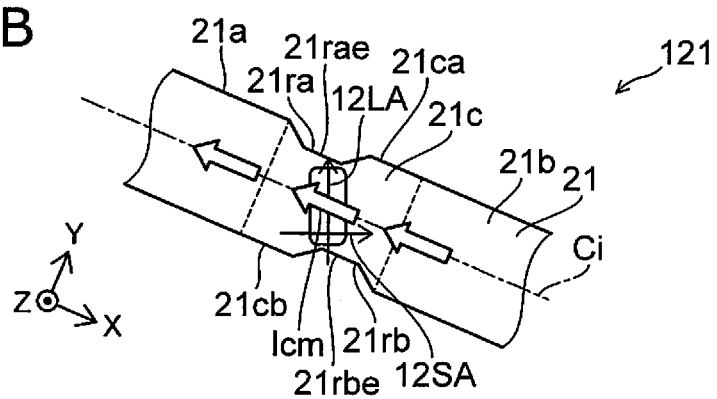

FIG. 13A and FIG. 13B are schematic plan views illustrating a magnetic memory device according to the second embodiment.

These drawings illustrate the magnetic memory device 121 of one example according to the embodiment. In the following description relating to the magnetic memory device 121, a description of at least some of the portions common to the magnetic memory device 120 is omitted. FIG. 13A illustrates the second magnetic layer 12. FIG. 13B illustrates the current in the magnetic memory device 121.

In the example of the magnetic memory device 121 as shown in FIG. 13A, the planar configuration of the second magnetic layer 12 is anisotropic. For example, in the X-Y plane, the length 12LL along the one direction 12LA of the second magnetic layer 12 is different from the length 12SL along the other one direction 12SA of the second magnetic layer 12. For example, the length 12LL is longer than the length 12SL. The direction 12LA and the direction 12SA are along the X-Y plane. For example, the direction 12SA crosses (e.g., is perpendicular to) the direction 12LA. The direction 12LA and the direction 12SA are tilted with respect to the X-axis direction.

The easy magnetization axis of the second magnetic layer 12 is tilted with respect to the X-axis direction. For example, the easy magnetization axis is aligned with the direction 12LA.

In the embodiment, the current Ic3 in the third region 21c (referring to FIG. 12) is tilted with respect to the direction 12LA. Thereby, the change of the second magnetization 12M of the second magnetic layer 12 due to the current Ic3 (referring to FIG. 1A) occurs efficiently. For example, the second magnetization 12M changes more easily; and more stable operations are obtained.

In the example of the magnetic memory device 121 as shown in FIG. 13A, the direction 12LA is aligned with the bottom portion direction Drp. For example, the length 12LL of the second magnetic layer 12 recited above corresponds to the length of the second magnetic layer 12 along the bottom portion direction Drp. The length 12SL of the second magnetic layer 12 recited above corresponds to the length of the second magnetic layer 12 along the bottom portion cross direction Drn. For example, the length 12LL is longer than the length 12SL. For example, the length 12LL may be longer than the length of the second magnetic layer 12 along the second direction (the X-axis direction).

In the embodiment as shown in FIG. 13B, the current Ic2 that flows through the second region 21b also flows through the third region 21c and flows in the second magnetic layer 12. Current division of the current occurs. The current IcSL that flows through the second magnetic layer 12 has a component along the direction 12LA. In the portion of the conductive layer 21 including the third region 21c, the current includes the current IcSL flowing through the second magnetic layer 12 and the current Ic3 flowing through the third region 21c (referring to FIG. 12).

As shown in FIG. 13B, the program current Icm in the portion including the third region 21c corresponds to the synthesis of the current Ic3 flowing through the third region 21c (referring to FIG. 12) and the current IcSL flowing through the second magnetic layer 12 (FIG. 13A). The orientation of the program current Icm corresponding to the synthesis is between the current Ic3 and the orientation of the current IcSL (the orientation along the direction 12LA).

In the portion including the third region 21c, the orientation of the program current Icm is tilted with respect to the direction 12LA (e.g., the major-axis direction) and the other one direction 12SA (e.g.; the minor-axis direction).

In the embodiment, for example, the current Icm in the third region 21c of the conductive layer 21 is tilted with respect to the direction of the easy magnetization axis of the second magnetic layer 12 (e.g., the second magnetization 12M). Thereby, the consumed energy can be small. High-speed operations can be obtained. According to the embodiment, for example, a spintronics magnetic memory device having high-speed operations can be provided in which a decrease of the consumed energy can be realized.

Figure 14A:
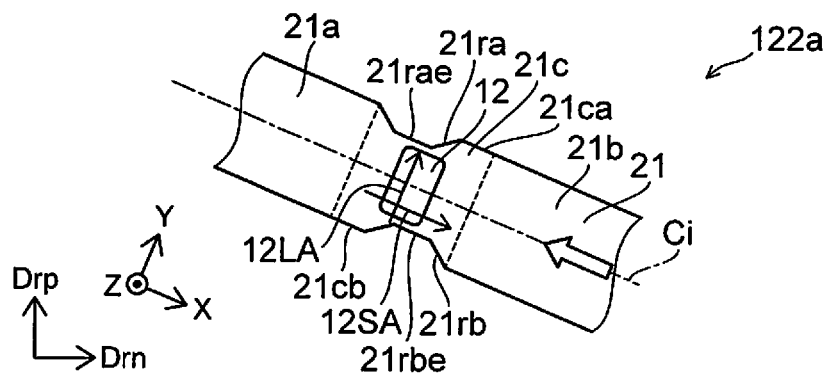
FIG. 14A to FIG. 14C are schematic plan views illustrating magnetic memory devices according to the second embodiment.
Figure 14B:
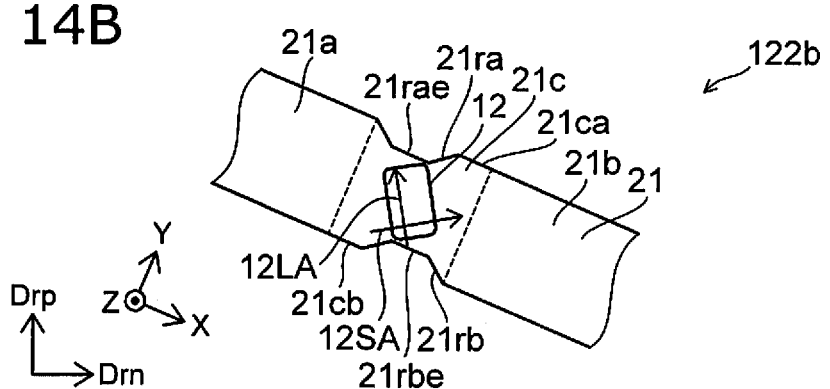
Figure 14C:
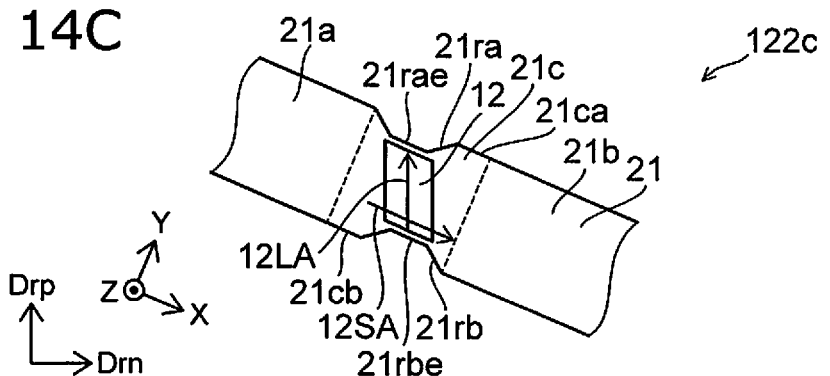

FIG. 14A to FIG. 14C are schematic plan views illustrating magnetic memory devices according to the second embodiment.

In the magnetic memory device 122a as shown in FIG. 14A, the direction 12LA is aligned with the Y-axis direction. The direction 12SA is aligned with the X-axis direction. The end portion (the short side) of the second magnetic layer 12 is aligned with the X-axis direction.

In the magnetic memory device 122b as shown in FIG. 14B, the direction 12LA is aligned with the bottom portion direction Drp. The direction 12SA is aligned with the bottom portion cross direction Drn. The end portion (the short side) of the second magnetic layer 12 is aligned with the bottom portion cross direction Drn.

In the magnetic memory device 122c as shown in FIG. 14C, the direction 12LA is aligned with the bottom portion direction Drp. The end portion (the short side) of the second magnetic layer 12 is aligned with the X-axis direction. The end portion (the long side) of the second magnetic layer 12 is aligned with the bottom portion direction Drp. The planar configuration of the second magnetic layer 12 is substantially a parallelogram.

In the magnetic memory devices 112a to 122c as well, for example, the current in the third region 21c of the conductive layer 21 is tilted with respect to the direction of the easy magnetization axis of the second magnetic layer 12 (e.g., the second magnetization 12M).

Figure 15:
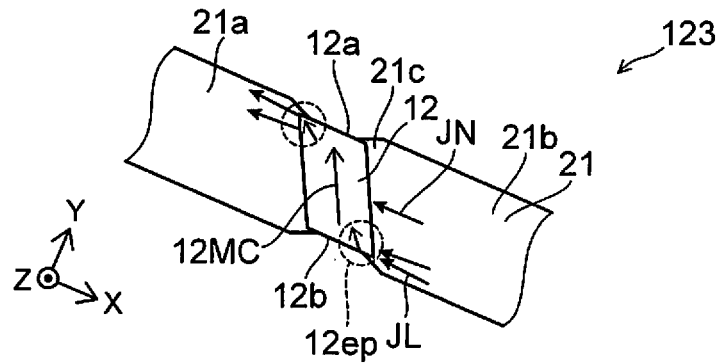
FIG. 15 is a schematic plan view illustrating a magnetic memory device according to the second embodiment.

FIG. 15 is a schematic plan view illustrating a magnetic memory device according to the second embodiment.

In the magnetic memory device 123 as shown in FIG. 15, the portion (the portion 12a) of the second magnetic layer 12 is along at least a portion of the first recess 21ra. The other portion (the portion 12b) of the second magnetic layer 12 is along at least a portion of the second recess 21rb. The planar configuration of the second magnetic layer 12 is substantially a parallelogram. By such a configuration, a current density JL at the vicinity of an edge portion 12ep of the second magnetic layer 12 can be high compared to a current density JN at the vicinity of the center of the second magnetic layer 12.

Compared to the other portions, the magnetization density becomes high and a magnetic domain is formed easily at the acute corners of the parallelogram of the second magnetic layer 12. For example, when the program current flows in the conductive layer 21, even when the magnetization at the center vicinity of the second magnetic layer 12 reverses, the reversal does not occur easily at the acute corners. At this time, compared to the current density JN at the vicinity of the center, the magnetization at the edge portion 12ep can reverse easily by setting the current density JL at the vicinity of the edge portion 12ep to be high. The error rate can be improved.

Figure 16A:
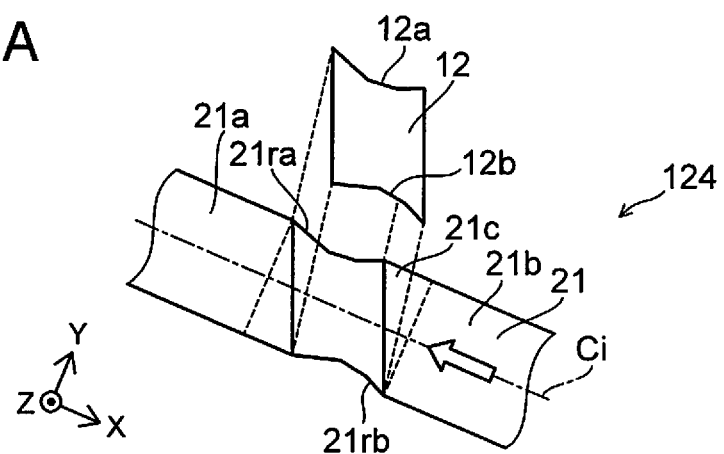
FIG. 16A and FIG. 16B are schematic plan views illustrating a magnetic memory device according to the second embodiment.
Figure 16B:
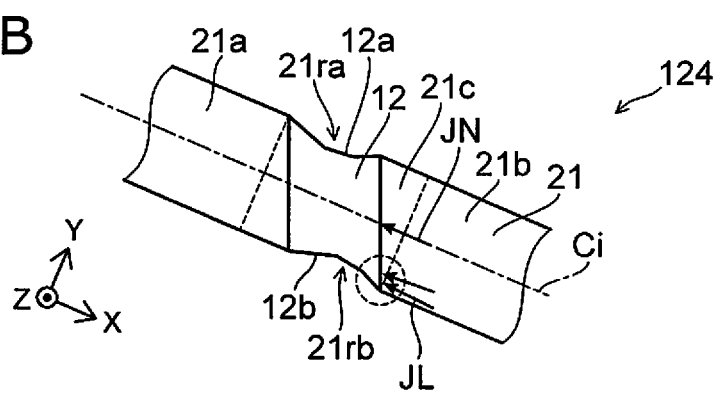

FIG. 16A and FIG. 16B are schematic plan views illustrating a magnetic memory device according to the second embodiment.

In the magnetic memory device 124 according to the embodiment as shown in FIG. 16A and FIG. 16B, the portion (the portion 12a) of the second magnetic layer 12 is along at least a portion of the first recess 21ra. The other portion (the portion 12b) of the second magnetic layer 12 is along at least a portion of the second recess 21rb.

In the magnetic memory devices 123 and 124, the short side of the second magnetic layer 12 is aligned with the end portion of the conductive layer 21. For example, the position in the X-Y plane of the short side of the second magnetic layer 12 may substantially match the position in the X-Y plane of the end portion of the conductive layer 21. In the example, the planar configuration of the third region 21c is point-symmetric with respect to the centroid 21cc of the planar configuration of the third region 21c (referring to FIG. 11). The planar configuration of the second magnetic layer 12 is point-symmetric with respect to the centroid of the planar configuration of the second magnetic layer 12.

In the magnetic memory devices 123 and 124, the long side of the second magnetic layer 12 is tilted with respect to the X-axis direction. In the magnetic memory devices 123 and 124, for example, the program error rate can be improved compared to the case where the portion (the portion 12a) of the second magnetic layer 12 is not along at least a portion of the first recess 21ra.

For example, the loss of the recording current can be suppressed by causing the edge of the SO layer (the conductive layer 21) to be along the pattern edge of the MTJ element. For example, as in the examples of FIG. 15A, FIG. 15B, FIG. 16A, and FIG. 16B, it is more favorable for the edge of the SO layer to substantially match the pattern edge of the MTJ element. For example, by shifting the recesses of the two edges of the SO layer in the conduction direction, the region where the current density of the SO layer interior becomes large can be dispersed. Therefore, the life can be extended due to the thermal migration of the SO layer itself. For example, the reliability can be increased. For example, the loss of the recording current can be suppressed. A magnetic memory device having good energy conservation is obtained.

Figure 17A:
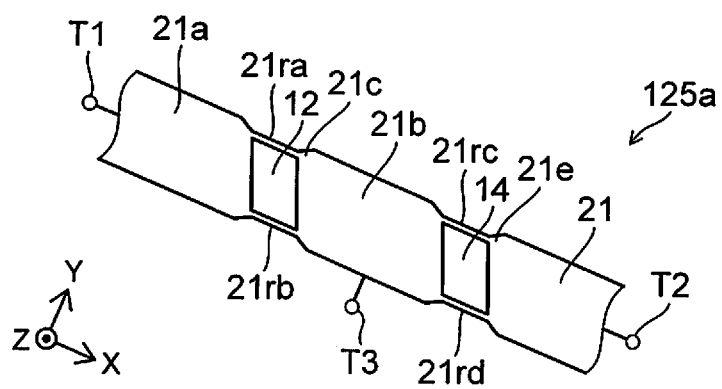
FIG. 17A and FIG. 17B are schematic plan views illustrating magnetic memory devices according to the second embodiment.
Figure 17B:
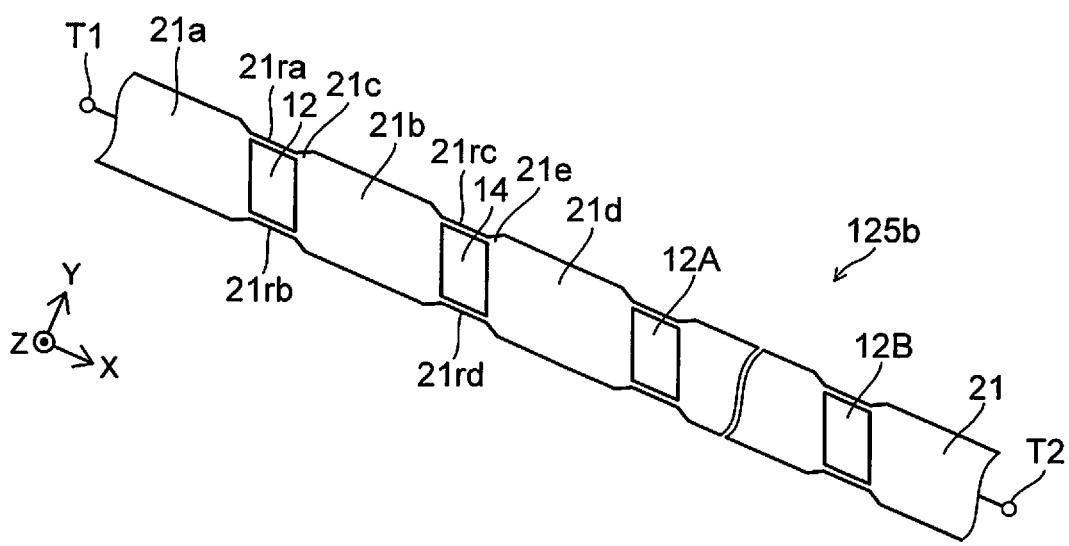

FIG. 17A and FIG. 17B are schematic plan views illustrating magnetic memory devices according to the second embodiment.

In the magnetic memory device 125a according to the embodiment as shown in FIG. 17A, the fourth magnetic layer 14 is provided in addition to the conductive layer 21 and the second magnetic layer 12. The first magnetic layer 11, the first nonmagnetic layer 11i, the third magnetic layer 13, and the second nonmagnetic layer 12i are provided in the magnetic memory device 125a (referring to FIG. 8A). The configurations of the cross sections of these layers are similar to those of the magnetic memory device 116 (referring to FIG. 8A). Examples of the conductive layer 21 and the fourth magnetic layer 14 of the magnetic memory device 125a will now be described.

In the conductive layer 21 as shown in FIG. 17A, the planar configuration of the fifth region 21e is substantially the same as the planar configuration of the third region 21c.

For example, one of the configurations described above for the third region 21c is applicable to the fifth region 21e. The planar configuration of the fourth magnetic layer 14 is substantially the same as the planar configuration of the second magnetic layer 12. For example, one of the configurations described above for the second magnetic layer 12 is applicable to the fourth magnetic layer 14.

For example, a third recess 21rc and a fourth recess 21rd are provided in the fifth region 21e.

Similarly to the magnetic memory device 116 (referring to FIG. 8A), in the magnetic memory device 125a, the program current may flow from the first region 21a toward the fourth region 21d. Or, the program current may flow from the fourth region 21d toward the first region 21a.

In the magnetic memory device 125a as shown in FIG. 17A, the program current may flow along another path. As shown in FIG. 17A, the first terminal T1 is provided in the first region 21a. The second terminal T2 is provided in the fourth region 21d. The third terminal T3 is provided in the second region 21b.

For example, in one program operation, the current flows from the third terminal T3 toward the first terminal T1. In the one program operation, another current flows from the third terminal T3 toward the second terminal T2.

Or, for example, in another one program operation, the current flows from the first terminal T1 toward the third terminal T3. In the other one program operation, another current flows from the first terminal T1 toward the third terminal T3.

In a magnetic memory device 125b as shown in FIG. 8B, other regions are provided in the conductive layer 21 in addition to the first to fifth regions 21a to 21e. Four memory layers (the second magnetic layer 12, the fourth magnetic layer 14, the magnetic layer 12A, the magnetic layer 12B, etc.) are provided in the magnetic memory device 125b. The number of these memory layers is arbitrary.

For example, the first terminal T1 is provided at one end (e.g., the first region 21a) of the conductive layer 21. The second terminal T2 is provided at another one end of the conductive layer 21. For example, in one program operation, the current flows from the first terminal T1 toward the second terminal T2. For example, in another one program operation, the current flows from the second terminal T2 toward the first terminal T1.

Third Embodiment

In a third embodiment as well, the conductive layer 21, the first magnetic layer 11, the second magnetic layer 12, and the first nonmagnetic layer 11i are provided in a magnetic memory device. For example, the structures of the cross sections of these elements are similar to the structures of the cross sections of the magnetic memory device 110 (referring to FIG. 1A). In the third embodiment, the planar configuration of the conductive layer 21 is different from the planar configuration of the conductive layer 21 of the first embodiment and the second embodiment. Examples of the planar configuration of the conductive layer 21 of the third embodiment will now be described. In the following description, at least a portion of the configuration similar to the first embodiment or the second embodiment is omitted as appropriate.

Figure 18:
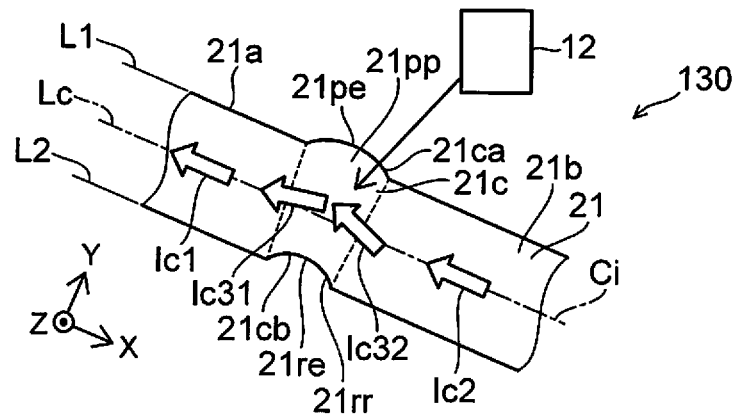
FIG. 18 is a schematic plan view illustrating a magnetic memory device according to the third embodiment.

FIG. 18 is a schematic plan view illustrating a magnetic memory device according to the third embodiment.

FIG. 18 is a plan view showing an example of a portion (the conductive layer 21) of the magnetic memory device 130 according to the embodiment. In the example as shown in FIG. 18 as well, the conductive layer 21 includes the first region 21a, the second region 21b, and the third region 21c.

Even in such a case, the third region 21c is provided between the first region 21a and the second region 21b. Even in such a case, the third region 21c includes the first end portion 21ca and the second end portion 21cb. The direction from the second end portion 21cb toward the first end portion 21ca crosses the first plane (the Z-X plane). The first plane includes the first direction (the Z-axis direction) and the second direction (e.g., the X-axis direction).

The first end portion 21ca includes a protrusion 21pp (e.g., a convex portion). At least a portion of the protrusion 21pp protrudes in the orientation from the second end portion 21cb toward the first end portion 21ca. The orientation of the protrusion of at least a portion of the protrusion 21pp is the orientation from the second end portion 21cb toward the first end portion 21ca.

The second end portion 21cb includes a recess 21rr (e.g., a concave portion). The recess 21rr is recessed in the orientation from the second end portion 21cb toward the first end portion 21ca. The orientation of the recession of at least a portion of the recess 21rr is the orientation from the second end portion 21cb toward the first end portion 21ca.

Neither the protrusion 21pp nor the recess 21rr is provided in the first region 21a and the second region 21b. For example, the current Ic1 in the first region 21a is aligned with the center line Lc. For example, the current Ic2 in the second region 21b is aligned with the center line Lc.

Conversely, in at least a portion of the third region 21c, the direction of the current (a current Ic31 or a current Ic32) crosses the center line Lc. For example, the third region 21c includes a region that is continuous with the second region 21b. In this region, the current Ic32 includes a component in the direction from the recess 21rr toward the protrusion 21pp. For example, the third region 21c includes a region that is continuous with the first region 21a. In this region, the current Ic31 includes a component in the direction from the protrusion 21pp toward the recess 21rr.

In the magnetic memory device 130, the change of the second magnetization 12M of the second magnetic layer 12 due to the current Ic3 (referring to FIG. 1A) occurs efficiently. For example, the planar distribution of the current direction in the third region 21c is larger than the planar distribution of the current direction in the first region 21a and the second region 21b. The trigger of the change of the magnetization of the second magnetic layer 12 occurs easily. For example, the second magnetization 12M changes more easily; and more stable operations are obtained.

The first end portion 21ca and the second end portion 21cb are interchangeable with each other in the embodiments.

Figure 19:
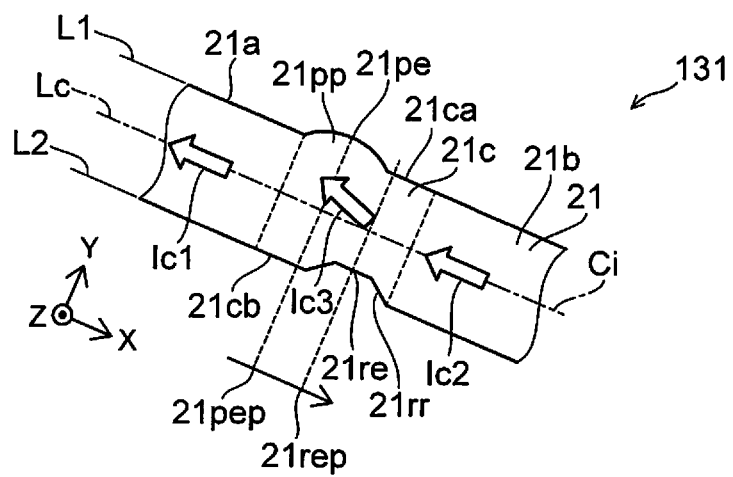
FIG. 19 is a schematic plan view illustrating a magnetic memory device according to the third embodiment.

FIG. 19 is a schematic plan view illustrating a magnetic memory device according to the third embodiment.

FIG. 19 is a plan view showing an example of a portion (the conductive layer 21) of the magnetic memory device 131 according to the embodiment. In the example as shown in FIG. 19 as well, the protrusion 21pp is provided in the first end portion 21ca of the conductive layer 21; and the recess 21rr is provided in the second end portion 21cb of the conductive layer 21. In the example, a first position 21pep along the second direction (e.g., the X-axis direction) of the protrusion 21pp is different from a second position 21rep along the second direction of the recess 21rr. For example, the first position 21pep is shifted from the second position 21rep in the second direction.

For example, the first position 21pep is a position along the second direction (e.g., the X-axis direction) of a top portion 21pe of the protrusion 21pp. The top portion 21pe is, for example, the tip of the protrusion 21pp. In the protrusion 21*pp*, the top portion 21*pe* protrudes most. In the case where the protrusion 21*pp* includes a portion along the X-axis direction, the midpoint of the portion may be taken as the top portion 21*pe*.

For example, the second position 21*rep* is a position along the second direction (e.g., the X-axis direction) of a bottom portion 21*re* of the recess 21*rr*. In the recess 21*rr*, the bottom portion 21*re* recedes most. In the case where the recess 21*rr* includes a portion along the X-axis direction, the midpoint of the portion may be taken as the bottom portion 21*re*.

In the magnetic memory device 131, the planar configuration of the third region 21*c* is asymmetric with respect to the center line Lc.

For example, the configuration of the first end portion 21*ca* in at least one cross section perpendicular to the first plane (e.g., the Z-X plane) may be different from the configuration of the second end portion 21*cb* in the at least one cross section.

Figure 20:
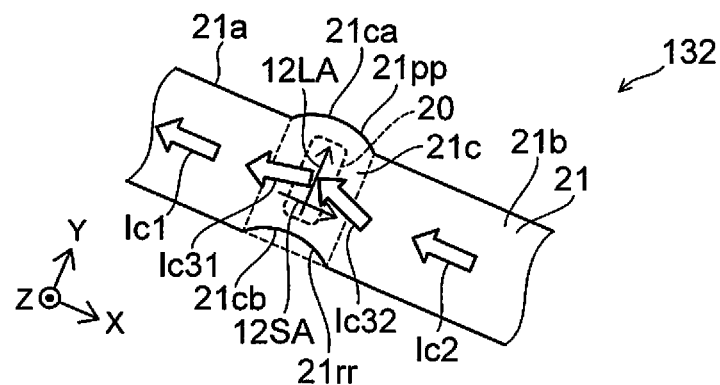
FIG. 20 is a schematic plan view illustrating a magnetic memory device according to the third embodiment.

FIG. 20 is a schematic plan view illustrating a magnetic memory device according to the third embodiment.

In the magnetic memory device 132 according to the embodiment as shown in FIG. 20, the one direction 12LA (e.g., the major-axis direction) relating to the second magnetic layer 12 is aligned with the Y-axis direction. The other one direction 12SA (e.g., the minor-axis direction) relating to the second magnetic layer 12 is aligned with the X-axis direction.

Figure 21:
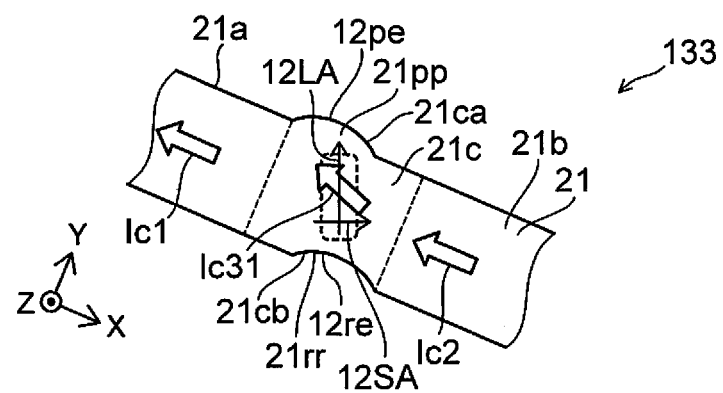
FIG. 21 is a schematic plan view illustrating a magnetic memory device according to the third embodiment.

FIG. 21 is a schematic plan view illustrating a magnetic memory device according to the third embodiment.

In the magnetic memory device 133 according to the embodiment as shown in FIG. 21, the one direction 12LA (e.g., the major-axis direction) relating to the second magnetic layer 12 is aligned with a top-bottom direction Dp. The top-bottom direction Dp is from the bottom portion 21*re* of the recess 21*rr* toward the top portion 21*pe* of the protrusion 21*pp*. The other one direction 12SA (e.g., the minor-axis direction) relating to the second magnetic layer 12 is aligned with a top-bottom cross direction Dn. The top-bottom cross direction Dn crosses the top-bottom direction Dp and is perpendicular to the first direction (the Z-axis direction). The top-bottom direction Dp and the top-bottom cross direction Dn are tilted with respect to the second direction (e.g., the X-axis direction).

In the magnetic memory devices 131 and 132 as well, the change of the second magnetization 12M of the second magnetic layer 12 due to the current Ic3 (referring to FIG. 1A) occurs efficiently. For example, the planar distribution of the current direction in the third region 21*c* is larger than the planar distribution of the current direction in the first region 21*a* and the second region 21*b*. The trigger of the change of the magnetization of the second magnetic layer 12 occurs easily. For example, the second magnetization 12M changes more easily; and more stable operations are obtained.

Fourth Embodiment

In a fourth embodiment as well, the conductive layer 21, the first magnetic layer 11, the second magnetic layer 12, and the first nonmagnetic layer 11*i* are provided in a magnetic memory device. For example, the structures of the cross sections of these elements are similar to the structures of the cross sections of the magnetic memory device 110 (referring to FIG. 1A). In the fourth embodiment, the planar configuration of the conductive layer 21 is different from the planar configuration of the conductive layer 21 of the first to third embodiments. Examples of the planar configuration of the conductive layer 21 of the fourth embodiment will now be described. In the following description, at least a portion of the configuration similar to the first to third embodiments is omitted as appropriate.

Figure 22:
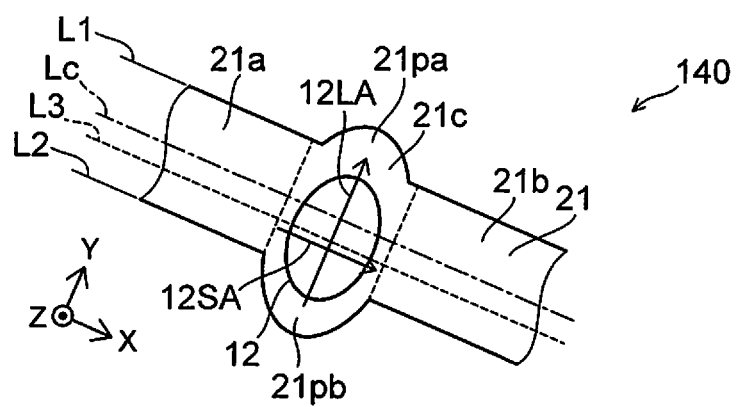
FIG. 22 is a schematic plan view illustrating a magnetic memory device according to the fourth embodiment.

FIG. 22 is a schematic plan view illustrating a magnetic memory device according to the fourth embodiment.

As shown in FIG. 22, the conductive layer 21 and the second magnetic layer 12 are provided in the magnetic memory device 140 according to the embodiment as well. The first magnetic layer 11 and the first nonmagnetic layer 11*i* are provided in the embodiment as well (referring to FIG. 1A). These layers are not illustrated in FIG. 22.

The planar configuration (the configuration in the X-Y plane) of the third region 21*c* is asymmetric (non-line-symmetric) with respect to one line aligned with the second direction (e.g., the X-axis direction). The one line is the center line Lc.

The line (e.g., the center line Lc) passes through the center of the first region 21*a* in the third direction and the center of the second region 21*b* in the third direction. The third direction is perpendicular to the first plane (e.g., the Z-X plane) including the first direction and the second direction. The third direction is, for example, the Y-axis direction. The first region 21*a* is line-symmetric with respect to the line (e.g., the center line Lc). The second region 21*b* is line-symmetric with respect to the line (e.g., the center line Lc).

In the example, a third line L3 is shifted from the center line Lc. The third line L3 passes through the center in the third direction of the third region 21*c* and is aligned with the second direction (e.g., the X-axis direction).

In the magnetic memory device 140, for example, the current at the vicinity of the boundary between the second region 21*b* and the third region 21*c* and the vicinity of the boundary between the first region 21*a* and the third region 21*c* includes a component crossing the X-axis direction. The change of the second magnetization 12M of the second magnetic layer 12 due to the current (referring to FIG. 1A) occurs efficiently. For example, the second magnetization 12M changes more easily; and more stable operations are obtained.

In the magnetic memory device 140, the first protrusion 21*pa* and the second protrusion 21*pb* are provided in the third region 21*c*. The protrusion amounts of these protrusions are different from each other. In the magnetic memory device 140, a portion of the outer edges of the planar configurations of these protrusions have curved configurations.

In the magnetic memory device 140, the direction 12LA (e.g., the major axis) relating to the second magnetic layer 12 is aligned with the Y-axis direction. The direction 12SA (e.g., the minor axis) relating to the second magnetic layer 12 is aligned with the X-axis direction. In the embodiment, the direction 12LA (and the direction 12SA) may cross (e.g., may be tilted with respect to) the X-axis direction or the Y-axis direction.

FIG. 23A, FIG. 23B, FIG. 24A, and FIG. 24B are schematic plan views illustrating magnetic memory devices according to the fourth embodiment.

Figure 23A:
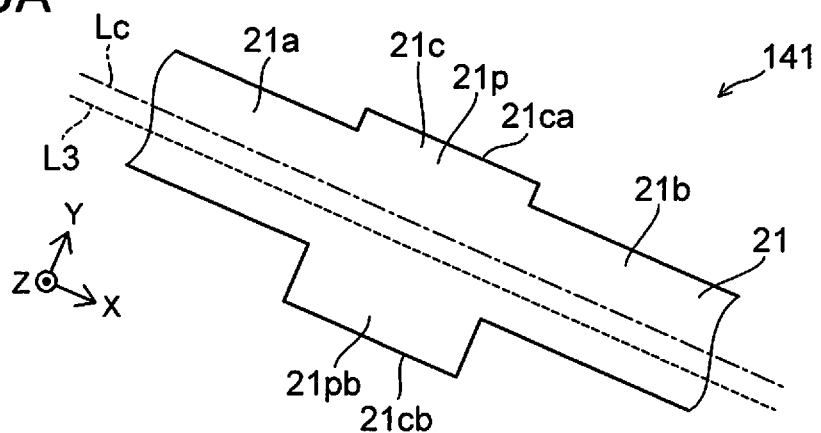
FIG. 23A and FIG. 23B are schematic plan views illustrating magnetic memory devices according to the fourth embodiment.
Figure 24A:
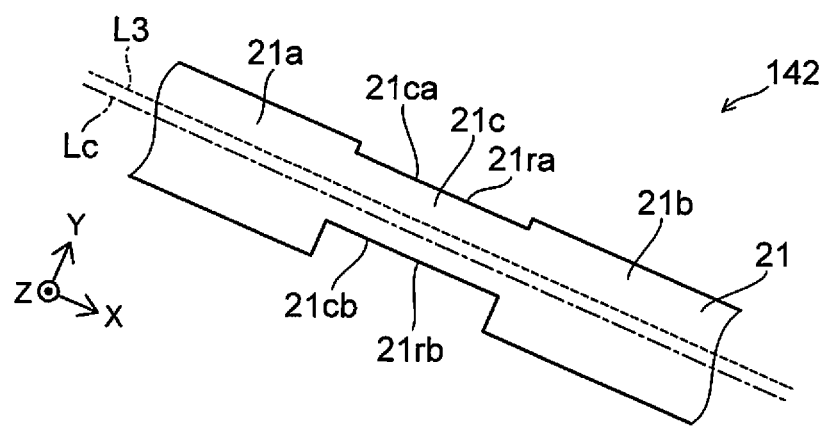
FIG. 24A and FIG. 24B are schematic plan views illustrating magnetic memory devices according to the fourth embodiment.

In the magnetic memory devices 141 and 142 according to the embodiment as shown in FIG. 23A and FIG. 24A as well, the planar configuration (the configuration in the X-Y plane) of the third region 21*c* is asymmetric (non-line-symmetric) with respect to one line (e.g., the center line Lc) aligned with the second direction (e.g., the X-axis direction). The line (e.g., the center line Lc) passes through the center of the first region 21*a* in the third direction (e.g., the Y-axis direction) and the center of the second region 21*b* in the third direction. The first region 21*a* and the second region 21*b* are line-symmetric with respect to the line (e.g., the center line Lc).

In the magnetic memory device 141 as shown in FIG. 23A, the first protrusion 21*pa* and the second protrusion 21*pb* are provided in the third region 21*c*. The protrusion amounts of these protrusions are different from each other. In the magnetic memory device 141, the outer edges of the planar configurations of these protrusions have substantially linear configurations.

In the magnetic memory device 142 as shown in FIG. 24A, the first recess 21*ra* and the second recess 21*rb* are provided in the third region 21*c*. The recessed amounts of these recesses are different from each other.

Figure 23B:
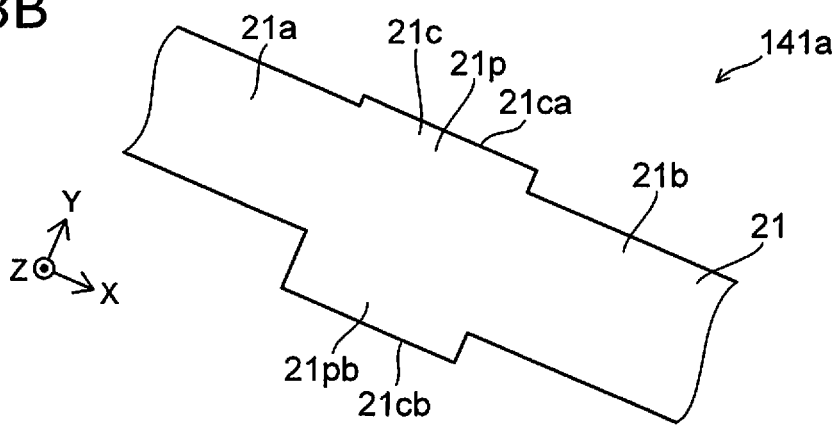
Figure 24B:
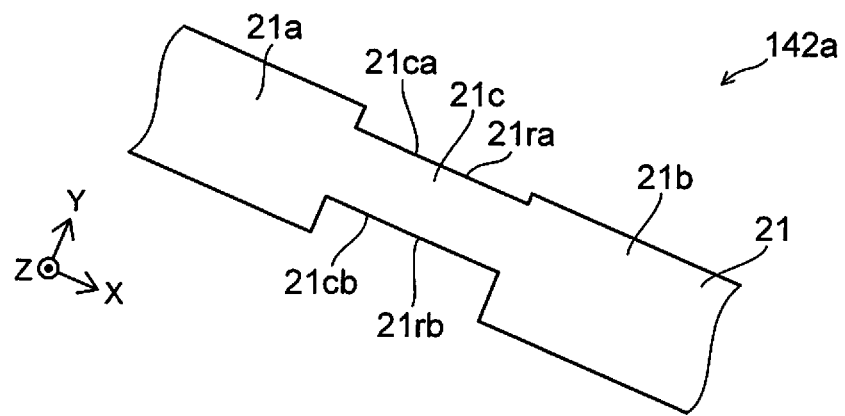

In a magnetic memory device 141*a* and a magnetic memory device 142*a* as shown in FIG. 23B and FIG. 24B, a position (the first position) along the third direction of the center of the first region 21*a* in the third direction (the Y-axis direction) is different from a position (the second position) along the third direction of the center of the second region 21*b* in the third direction. A position (a third position) along the third direction of the center of the third region 21*c* in the third direction is different from the first position. For example, the third position is different from the second position.

FIG. 25A to FIG. 25D are schematic plan views illustrating magnetic memory devices according to the fourth embodiment.

In the magnetic memory devices 143*a* to 143*d* according to the embodiment as shown in FIG. 25A to FIG. 25D, the end portion L11 of the first region 21*a* is shifted from an extension line of the end portion L21 of the second region 21*b*. The end portion L12 of the first region 21*a* is shifted from an extension line of the end portion L22 of the second region 21*b*. The center of the first region 21*a* in the Y-axis direction is shifted from the center of the second region 21*b* in the Y-axis direction.

Figure 25A:
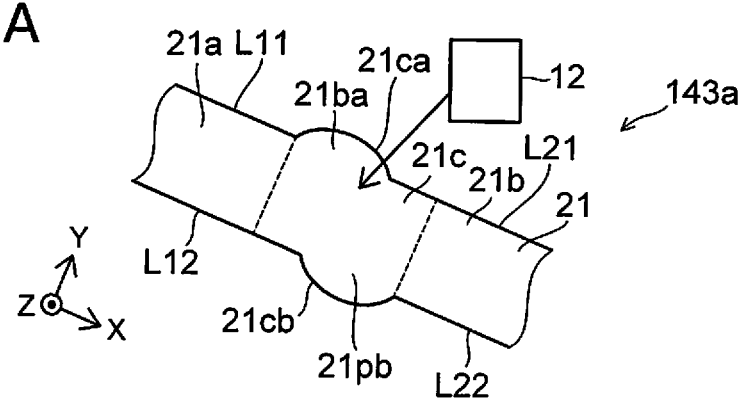
FIG. 25A to FIG. 25D are schematic plan views illustrating magnetic memory devices according to the fourth embodiment.

In the magnetic memory device 143*a* as shown in FIG. 25A, the first protrusion 21*pa* and the second protrusion 21*pb* are provided in the third region 21*c*. The positions in the X-axis direction of these protrusions are different from each other.

Figure 25B:
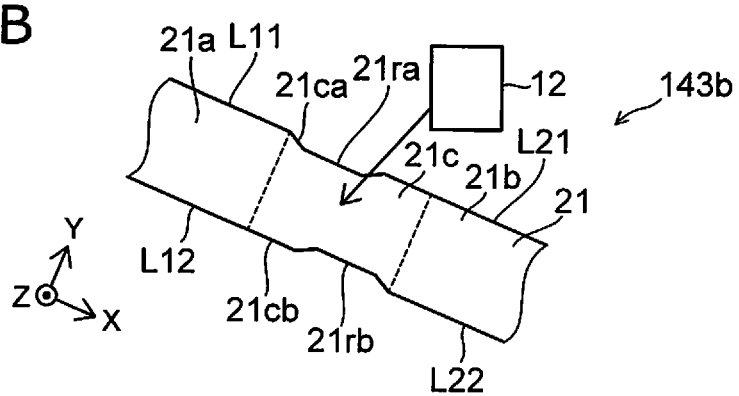

In the magnetic memory device 143*b* as shown in FIG. 25B, the first recess 21*ra* and the second recess 21*rb* are provided in the third region 21*c*. The positions in the X-axis direction of these recesses are different from each other.

Figure 25C:
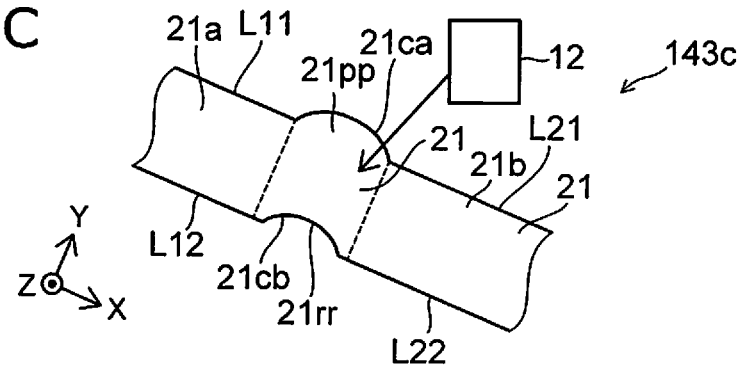
Figure 25D:
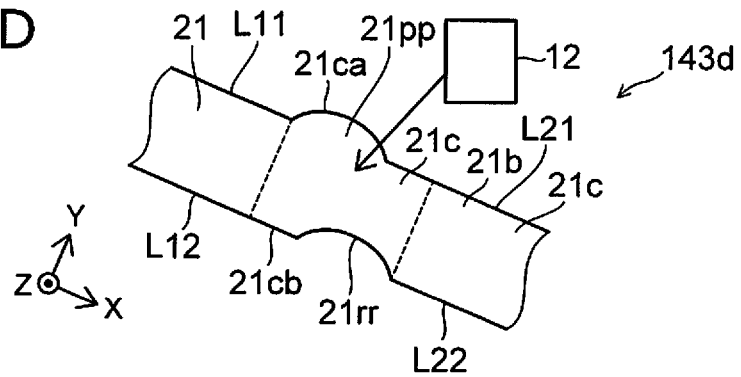

In the magnetic memory devices 143*c* and 143*d* as shown in FIG. 25C and FIG. 25D, the protrusion 21*pp* and the recess 21*rr* are provided in the third region 21*c*. In the magnetic memory device 143*d*, the position in the X-axis direction of the protrusion 21*pp* is different from the position in the X-axis direction of the recess 21*rr*.

In the magnetic memory devices 143*a*, 143*b*, and 143*d*, the configuration of the third region 21*c* is asymmetric with respect to one line aligned with the second direction (e.g., the X-axis direction). The line passes through the center of the first region 21*a* in the third direction (the Y-axis direction) perpendicular to the first plane including the first direction and the second direction. The first region 21*a* is line-symmetric with respect to the line. The line may pass through the center of the second region 21*b* in the third direction (the Y-axis direction). In such a case, the second region 21*b* is line-symmetric with respect to the line.

In the magnetic memory devices 141, 142, and 143*a* to 143*d* as well, the change of the second magnetization 12M of the second magnetic layer 12 due to the current (referring to FIG. 1A) occurs efficiently. For example, the second magnetization 12M changes more easily; and more stable operations are obtained.

Fifth Embodiment

Figure 26A:
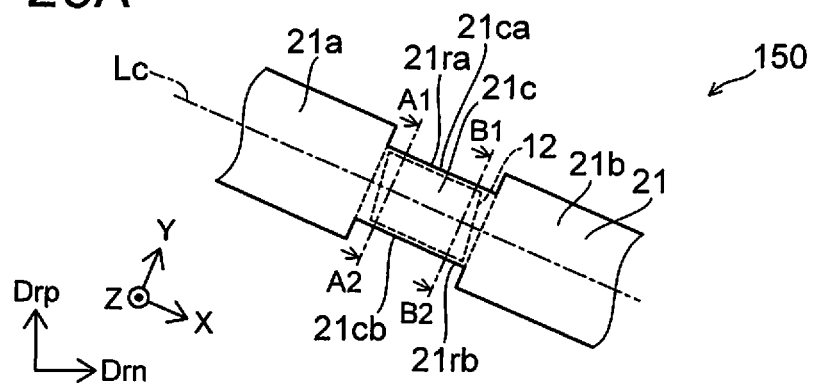
FIG. 26A to FIG. 26C are schematic views illustrating a magnetic memory device according to a fifth embodiment.
Figure 26B:
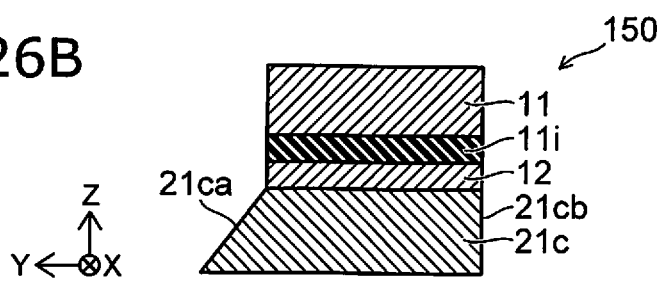
Figure 26C:
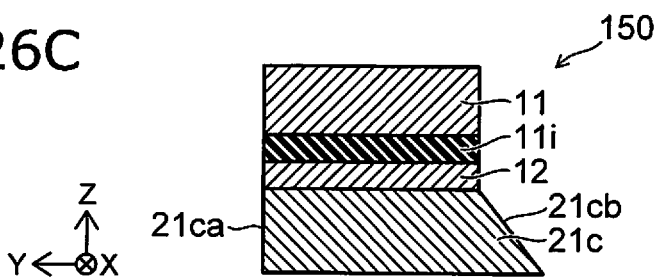

FIG. 26A to FIG. 26C are schematic views illustrating a magnetic memory device according to a fifth embodiment.

FIG. 26A is a plan view of some of the elements included in the magnetic memory device. FIG. 26B is a line A1-A2 cross-sectional view of FIG. 26A. FIG. 26C is a line B1-B2 cross-sectional view of FIG. 26A.

As shown in FIG. 26B and FIG. 26C, the conductive layer 21, the first magnetic layer 11, the second magnetic layer 12, and the first nonmagnetic layer 11*i* are provided in the magnetic memory device 150 according to the embodiment. The controller 70 (e.g., referring to FIG. 1A) may be provided in the magnetic memory device 150.

As shown in FIG. 26A, the conductive layer 21 includes the first to third regions 21*a* to 21*c*. The third region 21*c* is provided between the first region 21*a* and the second region 21*b* in the second direction (e.g., the X-axis direction).

Even in such a case, as shown in FIG. 26B and FIG. 26C, the second magnetic layer 12 is provided between the third region 21*c* and the first magnetic layer 11 in the first direction (the Z-axis direction). The first nonmagnetic layer 11*i* is provided between the first magnetic layer 11 and the second magnetic layer 12.

In the example as shown in FIG. 26A, the first recess 21*ra* and the second recess 21*rb* are provided in the third region 21*c*.

As shown in FIG. 26B and FIG. 26C, the cross-sectional configuration of the conductive layer 21 is different between positions inside the third region 21*c*.

For example, even in such a case, the third region 21*c* includes the first end portion 21*ca* and the second end portion 21*cb*. The direction from the second end portion 21*cb* toward the first end portion 21*ca* crosses the first plane (e.g., the Z-X plane). The first plane includes the first direction (the Z-axis direction) and the second direction (e.g., the X-axis direction).

The configuration of the first end portion 21*ca* in at least one cross section (e.g., the cross section along line A1-A2) perpendicular to the first plane (the Z-X plane) is different from the configuration of the second end portion 21*cb* in the at least one cross section. For example, the cross section is along the Z-Y plane.

In the case where the one cross section recited above is the cross section along line A1-A2 (referring to FIG. 26B), the first end portion 21*ca* is tilted with respect to the Z-axis direction. In such a case, the second end portion 21*cb* is substantially aligned with the Z-axis direction.

On the other hand, in the case where the one cross section recited above is the cross section along line B1-B2 (referring to FIG. 26C), the first end portion 21*ca* is substantially aligned with the Z-axis direction. In such a case, the second end portion 21*cb* is tilted with respect to the Z-axis direction.

Thus, a first angle between the first end portion 21*ca* and the first direction (the Z-axis direction) in the one cross section recited above is different from a second angle between the second end portion 21*cb* and the first direction in the one cross section recited above. The angle between the first end portion 21*ca* and the first plane (X-Y) in the one cross section recited above is different from the angle between the second end portion 21*cb* and the first plane in the one cross section recited above.

The one cross section recited above is proximal to the first region 21*a* or the second region 21*b*. For example, the first distance along the second direction between the one cross section recited above and the first region 21a is different from the second distance along the second direction between the one cross section recited above and the second region 21b.

For example, in the magnetic memory device 150, the third region 21c is asymmetric in a cross section along the Z-Y plane. The configuration of the third region 21c is asymmetric with respect to one line aligned with the second direction (e.g., the X-axis direction).

In the magnetic memory device 150, for example, the current flowing through the third region 21c includes a component crossing the X-axis direction. The change of, the second magnetization 12M of the second magnetic layer 12 due to the current (referring to FIG. 1A) occurs efficiently. For example, the second magnetization 12M changes more easily; and more stable operations are obtained.

In the magnetic memory device 150 as shown in FIG. 26A, the first end portion 21ca and the second end portion 21cb of the third region 21c are aligned with the X-axis direction. In the example, the boundary between the third region 21c and the first region 21a is aligned with the Y-axis direction. The boundary between the third region 21c and the second region 21b is aligned with the Y-axis direction.

FIG. 27A, FIG. 27B, FIG. 28A, and FIG. 28B are schematic cross-sectional views illustrating magnetic memory devices according to the fifth embodiment.

Figure 27A:
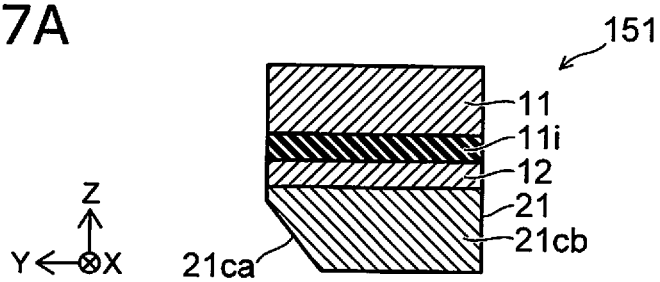
FIG. 27A and FIG. 27B are schematic cross-sectional views illustrating magnetic memory devices according to the fifth embodiment.
Figure 27B:
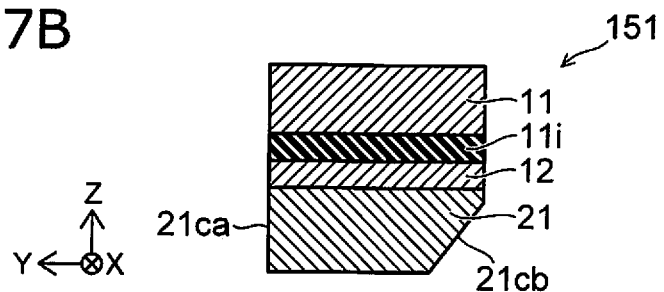
Figure 28A:
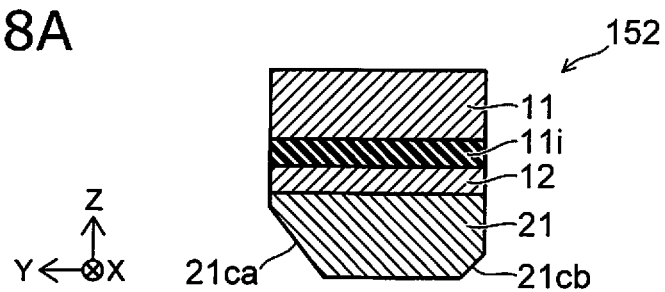
FIG. 28A and FIG. 28B are schematic cross-sectional views illustrating magnetic memory devices according to the fifth embodiment.
Figure 28B:
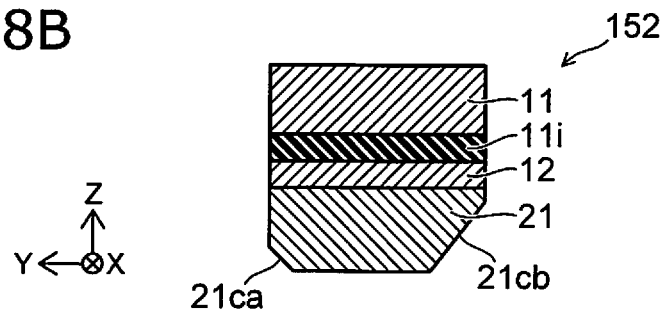

In the magnetic memory devices 151 and 152 shown in these drawings, for example, the planar configurations of the conductive layer 21 and the magnetic layer 12 are similar to FIG. 26A. FIG. 27A and FIG. 28A correspond to the line A1-A2 cross section of FIG. 26A. FIG. 27B and FIG. 28B correspond to the line B1-B2 cross section of FIG. 26A.

In the magnetic memory device 151 as shown in FIG. 27A, for example, in the case where the one cross section recited above is the cross section along line A1-A2, the first end portion 21ca is tilted with respect to the Z-axis direction (a reverse-tapered configuration). On the other hand, the second end portion 21cb is substantially aligned with the Z-axis direction.

In the magnetic memory device 151 as shown in FIG. 27B, in the case where the one cross section recited above is the cross section along line B1-B2, the first end portion 21ca is substantially aligned with the Z-axis direction. On the other hand, the second end portion 21cb is tilted with respect to the Z-axis direction (a reverse-tapered configuration).

In the magnetic memory device 152 as shown in FIG. 28A, in the case where the one cross section recited above is the cross section along line A1-A2, the length of the tilted portion of the first end portion 21ca is longer than the length of the tilted portion of the second end portion 21cb.

In the magnetic memory device 152 as shown in FIG. 28B, in the case where the one cross section recited above is the cross section along line B1-B2, the length of the tilted portion of the first end portion 21ca is shorter than the length of the tilted portion of the second end portion 21cb.

In the embodiment, in the case where the one cross section recited above is the cross section along line A1-A2, the angle between the first end portion 21ca and the Z-axis direction may be larger than the angle between the second end portion 21cb and the Z-axis direction. In such a case, in the case where the one cross section recited above is the cross section along line B1-B2, the angle between the first end portion 21ca and the Z-axis direction may be smaller than the angle between the second end portion 21cb and the Z-axis direction.

Figure 29:
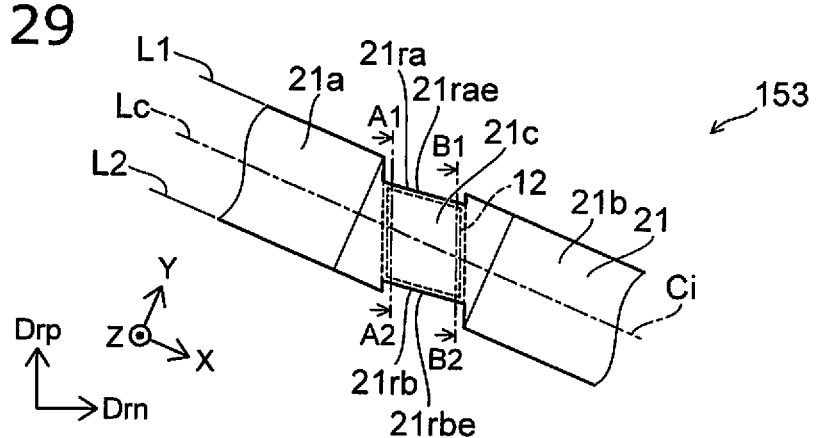
FIG. 29 is a schematic cross-sectional view illustrating a magnetic memory device according to the fifth embodiment.

FIG. 29 is a schematic cross-sectional view illustrating a magnetic memory device according to the fifth embodiment.

As shown in FIG. 29, the conductive layer 21 and the magnetic layer 12 are provided in the magnetic memory device 153 according to the embodiment as well. In the magnetic memory device 153, the first end portion 21ca and the second end portion 21cb of the third region 21c are aligned with the X-axis direction. The first recess 21ra and the second recess 21rb are provided in the third region 21c. In the example, the boundary between the third region 21c and the first region 21a is aligned with the bottom portion direction Drp. The boundary between the third region 21c and the second region 21b is aligned with the bottom portion direction Drp.

As described above, the bottom portion direction Drp is from the bottom portion 21rbe of the second recess 21rb toward the bottom portion 21rae of the first recess 21ra. In the example, the first recess 21ra includes a portion along the X-axis direction. In such a case, the midpoint of the portion corresponds to the bottom portion 21rae. In the example, the second recess 21rb includes a portion along the X-axis direction. In such a case, the midpoint of the portion corresponds to the bottom portion 21rbe.

One of the magnetic memory devices 150 to 152 or a modification of the magnetic memory devices 150 to 152 is applicable to the cross-sectional configuration of the magnetic memory device 153.

In the magnetic memory devices 150 to 152, the cross section of the third region 21c is asymmetric with respect to the Z-X plane. For example, the planar distribution of the current direction in the third region 21c is larger than the planar distribution of the current direction in the first region 21a and the second region 21b. For example, the second magnetization 12M changes more easily; and more stable operations are obtained.

In the second to fifth embodiments, the thickness 21tc along the first direction of the region of the third region 21c overlapping the second magnetic layer 12 may be thicker than the thickness 21ta along the first direction of the first region 21a and thicker than the thickness 21tb along the first direction of the second region 21b (referring to FIG. 10).

Sixth Embodiment

In the description relating to a sixth embodiment hereinbelow, at least a portion of the configuration similar to the first to fifth embodiments is omitted as appropriate.

FIG. 30A to FIG. 30E are schematic views illustrating a magnetic memory device according to the sixth embodiment.

Figure 30A:
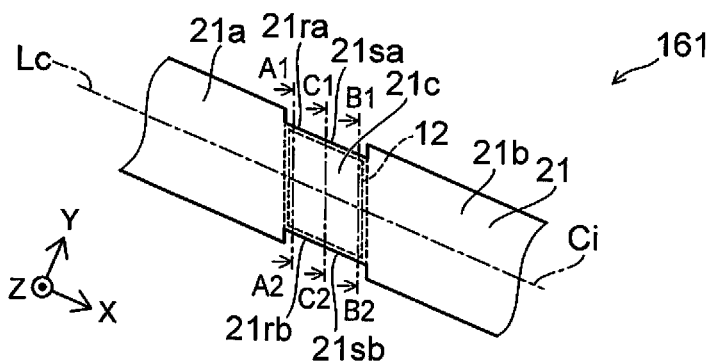
FIG. 30A to FIG. 30E are schematic views illustrating a magnetic memory device according to the sixth embodiment.
Figure 30B:
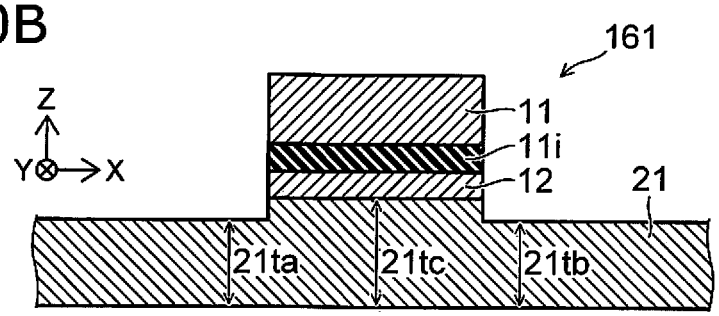
Figure 30C:
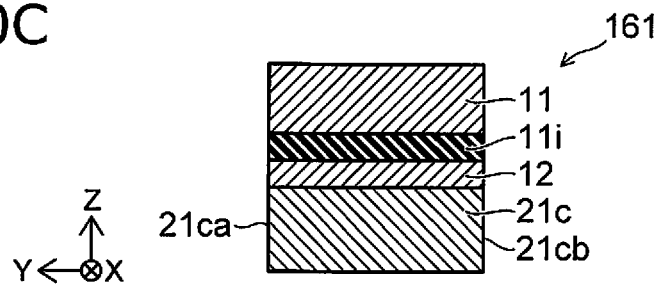
Figure 30D:
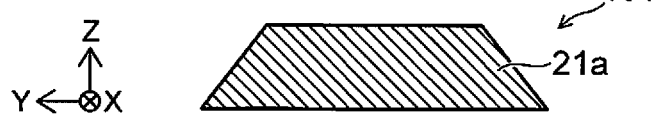

FIG. 30A is a plan view. FIG. 30B is a cross-sectional view along the center line Lc (the Z-X plane) of FIG. 30A. FIG. 30C is a line C1-C2 cross-sectional view of FIG. 30A. FIG. 30D is a line A1-A2 cross-sectional view of FIG. 30A. FIG. 30D is a line B1-B2 cross-sectional view of FIG. 30A.

In the magnetic memory device 161 according to the embodiment as shown in FIG. 30A, the planar configuration of the third region 21c is asymmetric with respect to the center line Lc. On the other hand, the first region 21a is substantially symmetric with respect to the center line Lc. The second region 21b is substantially symmetric with respect to the center line Lc.

In the magnetic memory device 161 as well, for example, the second magnetization 12M of the second magnetic layer 12 changes more easily; and more stable operations are obtained.

In the magnetic memory device 161, for example, the planar configuration of the second magnetic layer 12 is asymmetric with respect to the center line Lc.

As shown in FIG. 30B, the third region 21c includes a region overlapping the second magnetic layer 12 in the Z-axis direction. In the example, the thickness 21tc along the first direction of the overlapping region is thicker than the thickness 21ta along the first direction of the first region 21a. The thickness 21tc is thicker than the thickness 21tb along the first direction of the second region 21b.

In the example as shown in FIG. 30C, the side surface (the first end portion 21ca and the second end portion 21cb) of the third region 21c is substantially aligned with the Z-axis direction.

Figure 30E:
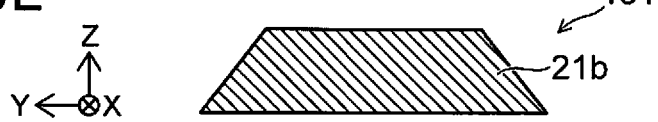

On the other hand, as shown in FIG. 30D, the side surface of the first region 21a is tilted with respect to the Z-axis direction. As shown in FIG. 30E, the side surface of the second region 21b is tilted with respect to the Z-axis direction. These side surfaces cross the Y-axis direction.

In the magnetic memory device 161, the length in the Y-axis direction of the third region 21c is substantially constant in the Z-axis direction. The length in the Y-axis direction of the third region 21c is substantially the same as the length along the Y-axis direction of the second magnetic layer 12.

For example, the conductive layer 21 includes an "upper portion" and a "lower portion." The "upper portion" is positioned between the "lower portion" and the second magnetic layer 12. The "upper portion" may be, for example, a first portion. The "lower portion" may be, for example, a second portion.

The length in the Y-axis direction of the "upper portion" of the first region 21a is substantially the same as the length along the Y-axis direction of the second magnetic layer 12. The length in the Y-axis direction of the "upper portion" of the first region 21a is shorter than the length in the Y-axis direction of the "lower portion" of the first region 21a.

The length in the Y-axis direction of the "upper portion" of the second region 21b is substantially the same as the length along the Y-axis direction of the second magnetic layer 12. The length in the Y-axis direction of the "upper portion" of the second region 21b is shorter than the length in the Y-axis direction of the "lower portion" of the second region 21b.

FIG. 31A to FIG. 31C, FIG. 32A to FIG. 32C, FIG. 33A to FIG. 33C, FIG. 34A to FIG. 34C, FIG. 35A to FIG. 35C, FIG. 36A to FIG. 36C, and FIG. 37A to FIG. 37C are schematic cross-sectional views illustrating magnetic memory devices according to the sixth embodiment.

FIG. 31A, FIG. 32A, FIG. 33A, FIG. 34A, FIG. 35A, FIG. 36A, and FIG. 37A correspond to the line C1-C2 cross section of FIG. 30A. FIG. 31B, FIG. 32B, FIG. 33B, FIG. 34B, FIG. 35B, FIG. 36B, and FIG. 37B correspond to the line A1-A2 cross section of FIG. 30A. FIG. 31C, FIG. 32C, FIG. 33C, FIG. 34C, FIG. 35C, FIG. 36C, and FIG. 37C correspond to the line B1-B2 cross section of FIG. 30A.

In the magnetic memory devices 162a to 162g shown in these drawings, the planar configuration of the third region 21c is similar to the planar configuration of the third region 21c of the magnetic memory device 161. For example, in the magnetic memory devices 162a to 162g, the planar configuration of the second magnetic layer 12 is similar to the planar configuration of the second magnetic layer 12 of the magnetic memory device 161.

Figure 31A:
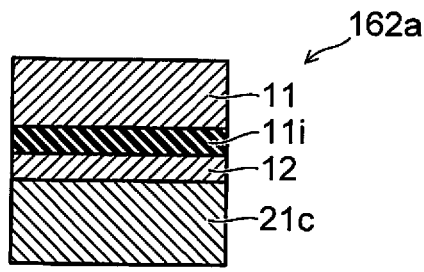
FIG. 31A to FIG. 31C are schematic views illustrating a magnetic memory device according to the sixth embodiment.
Figure 31B:
Figure 31C:
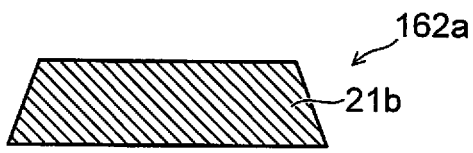

In the magnetic memory device 162a as shown in FIG. 31A, the length in the Y-axis direction of the third region 21c is substantially the same as the length in the Y-axis direction of the second magnetic layer 12. In the magnetic memory device 162a as shown in FIG. 31B, the length in the Y-axis direction of the "upper portion" of the first region 21a is longer than the length in the Y-axis direction of the second magnetic layer 12. The length in the Y-axis direction of the "lower portion" of the first region 21a is longer than the length in the Y-axis direction of the "upper portion" of the first region 21a. In the magnetic memory device 162a as shown in FIG. 31C, the length in the Y-axis direction of the "upper portion" of the second region 21b is longer than the length in the Y-axis direction of the second magnetic layer 12. The length in the Y-axis direction of the "lower portion" of the second region 21b is longer than the length in the Y-axis direction of the "upper portion" of the second region 21b.

Figure 32A:
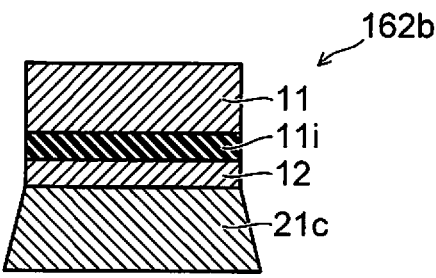
FIG. 32A to FIG. 32C are schematic views illustrating a magnetic memory device according to the sixth embodiment.
Figure 32B:
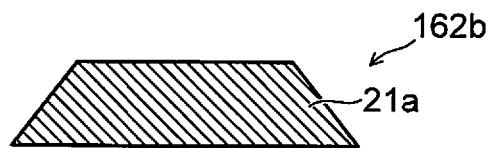
Figure 32C:
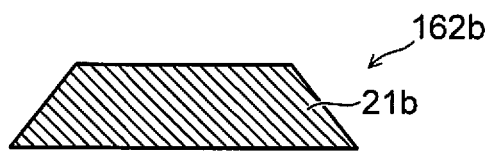

In the magnetic memory device 162b as shown in FIG. 32A, the length in the Y-axis direction of the "upper portion" of the third region 21c is substantially the same as the length in the Y-axis direction of the second magnetic layer 12. The length in the Y-axis direction of the "lower portion" of the third region 21c is longer than the length in the Y-axis direction of the "upper portion" of the third region 21c. In the magnetic memory device 162b as shown in FIG. 32B, the length in the Y-axis direction of the "upper portion" of the first region 21a is substantially the same as the length in the Y-axis direction of the second magnetic layer 12. The length in the Y-axis direction of the "lower portion" of the first region 21a is longer than the length in the Y-axis direction of the "upper portion" of the first region 21a. In the magnetic memory device 162b as shown in FIG. 32C, the length in the Y-axis direction of the "upper portion" of the second region 21b is substantially the same as the length in the Y-axis direction of the second magnetic layer 12. The length in the Y-axis direction of the "lower portion" of the second region 21b is longer than the length in the Y-axis direction of the "upper portion" of the second region 21b.

In the magnetic memory device 162c as shown in FIG. 33A, the configuration of the third region 21c is the same as the configuration of the third region 21c of the magnetic memory device 162c. As shown in FIG. 33B and FIG. 33C, the cross-sectional configurations of the first region 21a and the second region 21b of the magnetic memory device 162c are substantially the same as the cross-sectional configurations of the first region 21a and the second region 21b of the magnetic memory device 162a.

In the magnetic memory device 162d as shown in FIG. 34A, the configuration of the third region 21c is the same as the configuration of the third region 21c of the magnetic memory device 162a. In the magnetic memory device 162d as shown in FIG. 34B, the length in the Y-axis direction of the "upper portion" of the first region 21a is longer than the length in the Y-axis direction of the second magnetic layer 12. The length in the Y-axis direction of the "lower portion" of the first region 21a is substantially the same as the length in the Y-axis direction of the second magnetic layer 12. As shown in FIG. 34C, the cross-sectional configuration of the second region 21b is substantially the same as the cross-sectional configuration of the first region 21a.

Figure 35A:
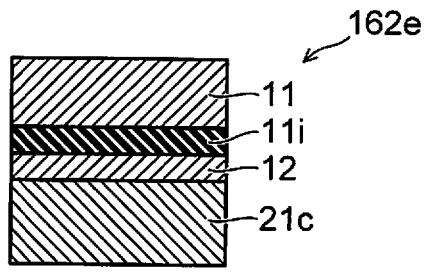
FIG. 35A to FIG. 35C are schematic views illustrating a magnetic memory device according to the sixth embodiment.
Figure 35B:
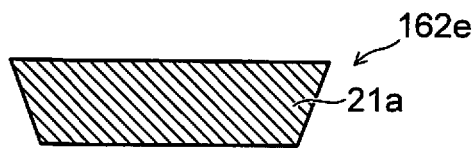
Figure 35C:
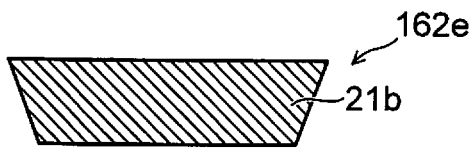

As shown in FIG. 35A, the configuration of the third region 21c of the magnetic memory device 162e is the same as the configuration of the third region 21c of the magnetic memory device 162a. In the magnetic memory device 162e as shown in FIG. 35B, the length in the Y-axis direction of the "lower portion" of the first region 21a is longer than the length in the Y-axis direction of the second magnetic layer 12. The length in the Y-axis direction of the "upper portion" of the first region 21a is longer than the length in the Y-axis direction of the "lower portion" of the first region 21a. As shown in FIG. 35C, the cross-sectional configuration of the second region 21b is substantially the same as the cross-sectional configuration of the first region 21a.

Figure 36A:
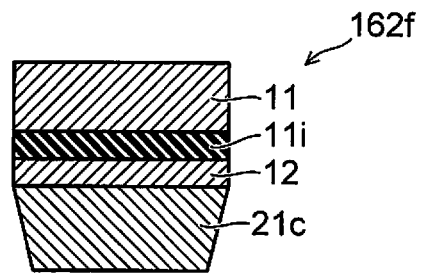
FIG. 36A to FIG. 36C are schematic views illustrating a magnetic memory device according to the sixth embodiment.
Figure 36B:
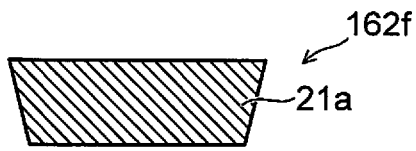
Figure 36C:
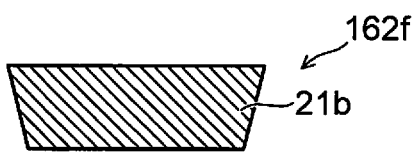

In the magnetic memory device 162f as shown in FIG. 36A, the length in the Y-axis direction of the "upper portion" of the third region 21c is substantially the same as the length in the Y-axis direction of the second magnetic layer 12. The length in the Y-axis direction of the "lower portion" of the third region 21c is shorter than the length in the Y-axis direction of the "lower portion" of the third region 21c. As shown in FIG. 36B and FIG. 36C, the cross-sectional configurations of the first region 21a and the second region 21b of the magnetic memory device 162f are substantially the same as the cross-sectional configurations of the first region 21a and the second region 21b of the magnetic memory device 162d.

Figure 37A:
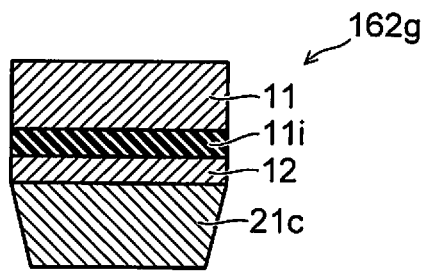
FIG. 37A to FIG. 37C are schematic views illustrating a magnetic memory device according to the sixth embodiment.
Figure 37B:
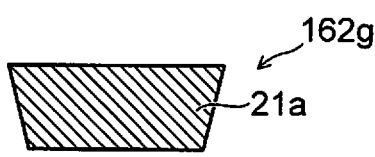
Figure 37C:
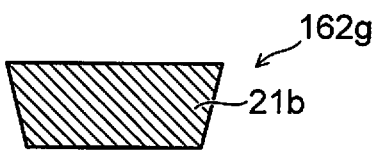

As shown in FIG. 37A, the configuration of the third region 21c of the magnetic memory device 162g is the same as the configuration of the third region 21c of the magnetic memory device 162f. In the magnetic memory device 162g as shown in FIG. 37B, the length in the Y-axis direction of the "upper portion" of the first region 21a is substantially the same as the length in the Y-axis direction of the second magnetic layer 12. The length in the Y-axis direction of the "lower portion" of the first region 21a is shorter than the length in the Y-axis direction of the "upper portion" of the first region 21a. As shown in FIG. 37C, the cross-sectional configuration of the second region 21b is substantially the same as the cross-sectional configuration of the first region 21a.

In the magnetic memory devices 162a to 162g as well, for example, the second magnetization 12M of the second magnetic layer 12 changes more easily; and more stable operations are obtained.

FIG. 38A to FIG. 38C and FIG. 39A to FIG. 39C are schematic cross-sectional views illustrating magnetic memory devices according to the sixth embodiment.

Figure 38A:
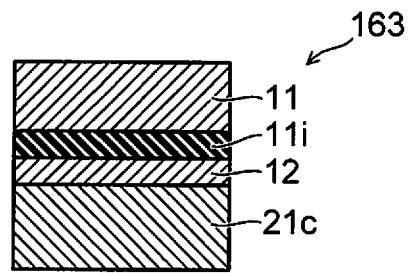
FIG. 38A to FIG. 38C are schematic cross-sectional views illustrating a magnetic memory devices according to the sixth embodiment.
Figure 38B:
Figure 38C:
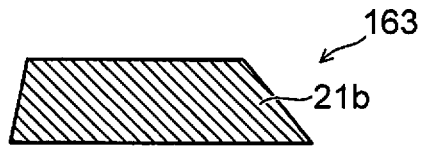
Figure 39A:
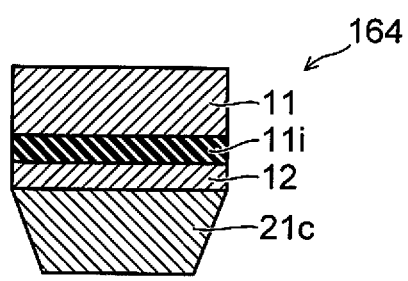
FIG. 39A to FIG. 39C are schematic cross-sectional views illustrating a magnetic memory devices according to the sixth embodiment.
Figure 39B:
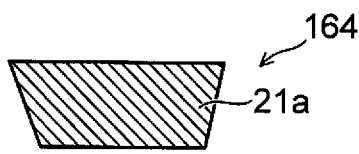
Figure 39C:
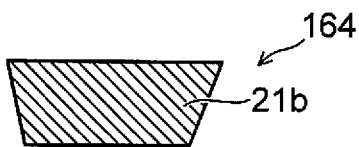

FIG. 38A and FIG. 39A correspond to the line C1-C2 cross section of FIG. 30A. FIG. 38B and FIG. 39B correspond to the line A1-A2 cross section of FIG. 30A. FIG. 38C and FIG. 39C correspond to the line B1-B2 cross section of FIG. 30A.

In the magnetic memory devices 163 and 164 shown in these drawings, the planar configuration of the third region 21c is similar to the planar configuration of the third region 21c of the magnetic memory device 161. For example, the planar configuration of the second magnetic layer 12 of the magnetic memory devices 163 and 164 is similar to the planar configuration of the second magnetic layer 12 of the magnetic memory device 161.

For example, the planar configuration of the third region 21c is asymmetric with respect to the X-axis direction. The planar configuration of the third region 21c is the configuration of the third region 21c in a plane including the first direction and the second direction.

In the magnetic memory device 163 as shown in FIG. 38A, the length in the Y-axis direction of the third region 21c is substantially the same as the length in the Y-axis direction of the second magnetic layer 12.

In the magnetic memory device 163 as shown in FIG. 38B, the angle between the Z-axis direction and one of the two side surfaces of the first region 21a is different from the angle between the Z-axis direction and the other of the two side surfaces of the first region 21a. The cross-sectional configuration (the cross-sectional configuration in the Z-Y plane) of the first region 21a is asymmetric with respect to the X-axis direction. The cross-sectional configuration (the cross-sectional configuration in the Z-Y plane) of the first region 21a is asymmetric with respect to the Z-X plane.

In the magnetic memory device 163 as shown in FIG. 38C, the angle between the Z-axis direction and one of the two side surfaces of the second region 21b is different from the angle between the Z-axis direction and the other of the two side surfaces of the second region 21b. The cross-sectional configuration (the cross-sectional configuration in the Z-Y plane) of the second region 21b is asymmetric with respect to the X-axis direction. The cross-sectional configuration (the cross-sectional configuration in the Z-Y plane) of the second region 21b is asymmetric with respect to the Z-X plane.

In the magnetic memory device 164 as shown in FIG. 39A, the length in the Y-axis direction of the "upper portion" of the third region 21c is substantially the same as the length in the Y-axis direction of the second magnetic layer 12. The length in the Y-axis direction of the "lower portion" of the third region 21c is shorter than the length in the Y-axis direction of the "upper portion" of the third region 21c.

In the magnetic memory device 164 as shown in FIG. 39B, the cross-sectional configuration (the cross-sectional configuration in the Z-Y plane) of the first region 21a is asymmetric with respect to the X-axis direction. The cross-sectional configuration (the cross-sectional configuration in the Z-Y plane) of the first region 21a is asymmetric with respect to the Z-X plane.

In the magnetic memory device 164 as shown in FIG. 39C, the cross-sectional configuration (the cross-sectional configuration in the Z-Y plane) of the second region 21b is asymmetric with respect to the X-axis direction. The cross-sectional configuration (the cross-sectional configuration in the Z-Y plane) of the second region 21b is asymmetric with respect to the Z-X plane.

In the magnetic memory devices 163 and 164, the side surface of the two side surfaces of the first region 21a having the small angle with respect to the Z-axis direction is arranged in the X-axis direction with the side surface of the two side surfaces of the second region 21b having the large angle with respect to the Z-axis direction. The side surface of the two side surfaces of the first region 21a having the large angle with respect to the Z-axis direction is arranged in the X-axis direction with the side surface of the two side surfaces of the second region 21b having the small angle with respect to the Z-axis direction.

In the magnetic memory devices 163 and 164, the cross section of the third region 21c is symmetric with respect to the Z-X plane; and the cross sections of the first region 21a and the second region 21b are asymmetric with respect to the Z-X plane. For example, the planar distribution of the current direction in the third region 21c is different from the planar distribution of the current direction in the first region 21a and the second region 21b. For example, the second magnetization 12M changes more easily; and more stable operations are obtained.

In the magnetic memory devices 162a to 162g, 163, and 164 as well, the thickness 21tc along the first direction of the region of the third region 21c overlapping the second magnetic layer 12 may be thicker than the thickness 21ta along the first direction of the first region 21a and thicker than the thickness 21tb along the first direction of the second region 21b (referring to FIG. 30B).

Seventh Embodiment

In the description relating to a seventh embodiment hereinbelow, at least a portion of the configuration similar to the first to sixth embodiments is omitted as appropriate.

Figure 40A:
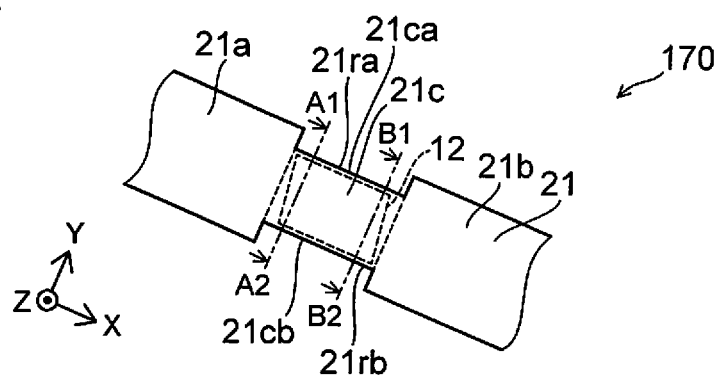
FIG. 40A to FIG. 40C are schematic views illustrating a magnetic memory device according to a seventh embodiment.
Figure 40B:
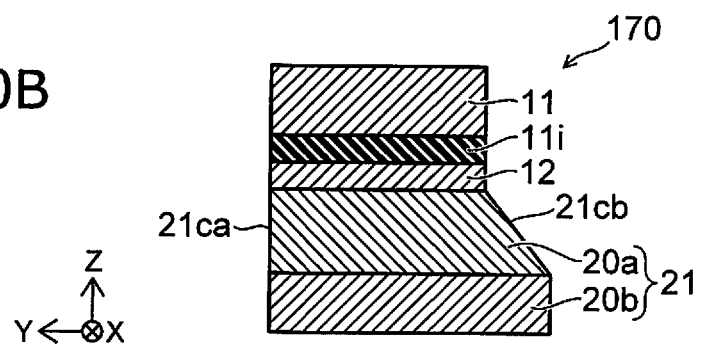
Figure 40C:
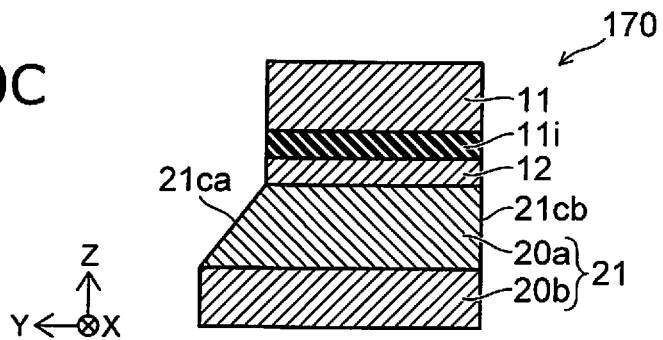

FIG. 40A to FIG. 40C are schematic views illustrating a magnetic memory device according to the seventh embodiment.

FIG. 40A is a plan view. FIG. 40B is a line A1-A2 cross-sectional view of FIG. 40A. FIG. 40C is a line B1-B2 cross-sectional view of FIG. 40A.

In the magnetic memory device 170 according to the embodiment as shown in FIG. 40A as well, the conductive layer 21 includes the first to third regions 21a to 21c. In the example, the first recess 21ra is provided at the first end portion 21ca in the third region 21c. The second recess 21rb is provided at the second end portion 21cb.

In the magnetic memory device 170 as shown in FIG. 40B and FIG. 40C, the conductive layer 21 includes a first conductive film 20a and a second conductive film 20b. The first conductive film 20a is provided between the second conductive film 20b and the second magnetic layer 12.

In the line A1-A2 cross section as shown in FIG. 40B, the angle between the Z-axis direction and the side surface of the first conductive film 20a which is a portion of the first end portion 21ca is smaller than the angle between the Z-axis direction and the side surface of the first conductive film 20a which is a portion of the second end portion 21cb.

In the line B1-B2 cross section as shown in FIG. 40C, the angle between the Z-axis direction and the side surface of the first conductive film 20a which is a portion of the first end portion 21ca is larger than the angle between the Z-axis direction and the side surface of the first conductive film 20a which is a portion of the second end portion 21cb.

The cross-sectional configuration (the cross-sectional configuration in the Z-Y plane) of the third region 21c is asymmetric with respect to the X-axis direction. The cross-sectional configuration (the cross-sectional configuration in the Z-Y plane) of the third region 21c is asymmetric with respect to the Z-X plane.

In the example, the length in the Y-axis direction of the "upper portion" of the first conductive film 20a is substantially the same as the length along the Y-axis direction of the second magnetic layer 12. The length in the Y-axis direction of the "upper portion" of the first conductive film 20a is shorter than the length in the Y-axis direction of the "lower portion" of the first conductive film 20a. The length in the Y-axis direction of the second conductive film 20b is substantially the same as the length in the Y-axis direction of the "lower portion" of the first conductive film 20a.

Thus, in the magnetic memory device 170, the third region 21c is asymmetric in the cross section along the Z-Y plane. The configuration of the third region 21c is asymmetric with respect to one line aligned with the second direction (e.g., the X-axis direction).

Figure 41A:
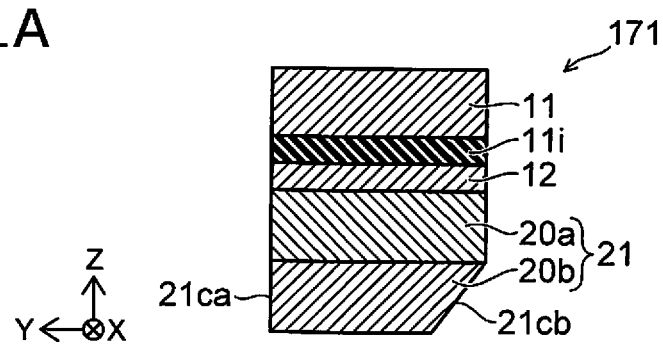
FIG. 41A and FIG. 41B are schematic cross-sectional views illustrating a magnetic memory device according to the seventh embodiment.
Figure 41B:
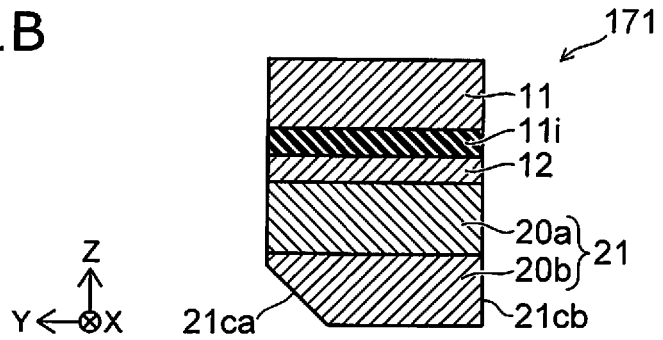

FIG. 41A and FIG. 41B are schematic cross-sectional views illustrating a magnetic memory device according to the seventh embodiment.

In the magnetic memory device 171 shown in these drawings, for example, the planar configuration is similar to the magnetic memory device 170.

FIG. 41A corresponds to the line A1-A2 cross section of FIG. 40A. FIG. 41B corresponds to the line B1-B2 cross section of FIG. 40A.

In the magnetic memory device 171 as shown in FIG. 41A and FIG. 41B as well, the conductive layer 21 includes the first conductive film 20a and the second conductive film 20b.

In the line A1-A2 cross section as shown in FIG. 41A, the angle between the Z-axis direction and the side surface of the second conductive film 20b which is a portion of the first end portion 21ca is smaller than the angle between the Z-axis direction and the side surface of the second conductive film 20b which is a portion of the second end portion 21cb.

In the line B1-B2 cross section as shown in FIG. 41B, the angle between the Z-axis direction and the side surface of the second conductive film 20b which is a portion of the first end portion 21ca is larger than the angle between the Z-axis direction and the side surface of the second conductive film 20b which is a portion of the second end portion 21cb.

The cross-sectional configuration (the cross-sectional configuration in the Z-Y plane) of the third region 21c is asymmetric with respect to the X-axis direction. The cross-sectional configuration (the cross-sectional configuration in the Z-Y plane) of the third region 21c is asymmetric with respect to the Z-X plane.

In the example, the length in the Y-axis direction of the "upper portion" of the second conductive film 20b is substantially the same as the length along the Y-axis direction of the second magnetic layer 12. The length in the Y-axis direction of the "upper portion" of the second conductive film 20b is longer than the length in the Y-axis direction of the "lower portion" of the second conductive film 20b. The length in the Y-axis direction of the first conductive film 20a is substantially the same as the length in the Y-axis direction of the "upper portion" of the second conductive film 20b.

In the magnetic memory devices 170 and 171, for example, the current flowing through the third region 21c includes a component crossing the X-axis direction. The change of the second magnetization 12M of the second magnetic layer 12 due to the current (referring to FIG. 1A) occurs efficiently. For example, the second magnetization 12M changes more easily; and more stable operations are obtained.

In the embodiments recited above, the planar configuration of the third region 21c may be asymmetric with respect to the X-axis direction; and the third region 21c may be asymmetric in the cross section along the Z-Y plane. In the embodiments, for example, the configuration of the third region 21c is asymmetric with respect to one line aligned with the second direction (e.g., the X-axis direction). The planar configuration of the third region 21c is the configuration of the third region 21c in a plane including the first direction and the second direction.

Examples of the conductive layer 21, the first magnetic layer 11, the second magnetic layer 12, and the first nonmagnetic layer 11i will now be described. These descriptions are applicable to any example of the embodiments recited above. The following description relating to the first magnetic layer 11 is applicable to the third magnetic layer 13. The following description relating to the second magnetic layer 12 is applicable to the fourth magnetic layer 14. The following description relating to the first nonmagnetic layer 11i is applicable to the second nonmagnetic layer 12i.

The conductive layer 21 includes, for example, at least one selected from the group consisting of tantalum and tungsten. The conductive layer 21 includes, for example, at least one selected from the group consisting of β-tantalum and β-tungsten. The spin Hall angle is negative for these materials. The absolute value of the spin Hall angle is large for these materials. Thereby, the second magnetization 12M can be controlled efficiently by the program current.

The conductive layer 21 may include at least one selected from the group consisting of platinum and gold. The spin Hall angle is positive for these materials. The absolute value of the spin Hall angle is large for these materials. Thereby, the second magnetization 12M can be controlled efficiently by the program current.

The direction (the orientation) of the spin-orbit torque applied to the second magnetic layer 12 is different between the polarities of the spin Hall angle. For example, the conductive layer 21 applies a spin-orbit interaction torque to the second magnetic layer 12.

The second magnetic layer 12 includes, for example, at least one of a ferromagnetic material or a soft magnetic material. The second magnetic layer 12 may include, for example, an artificial lattice.

The second magnetic layer 12 includes, for example, at least one selected from the group consisting of FePd, FePt, CoPd, and CoPt. The soft magnetic material recited above includes, for example, CoFeB. The artificial lattice recited above includes, for example, a stacked film including a first film and a second film. The first film includes, for example, at least one of NiFe, Fe, or Co. The second film includes, for example, at least one of Cu, Pd, or Pt. The first film is, for example, a magnetic material; and the second film is a nonmagnetic material.

The second magnetic layer 12 may include, for example, a ferrimagnetic material.

In the embodiments, for example, the second magnetic layer 12 has in-plane magnetic anisotropy. For example, the second magnetic layer 12 may have at least one of in-plane shape magnetic anisotropy, in-plane magneto-crystalline anisotropy, or in-plane induced magnetic anisotropy due to stress, etc.

The first nonmagnetic layer 11i includes, for example, at least one selected from the group consisting of MgO, CaO, SrO, TiO, VO, NbO, and $Al_2O_3$. The first nonmagnetic layer 11i is, for example, a tunneling barrier layer. In the case where the first nonmagnetic layer 11i includes MgO, the thickness of the first nonmagnetic layer 11i is, for example, about 1 nm.

The first magnetic layer 11 includes, for example, at least one selected from Co and CoFeB. The first magnetization 11M of the first magnetic layer 11 is fixed in substantially one direction (a direction crossing the Z-axis direction) in the plane. The first magnetic layer 11 is, for example, an in-plane magnetization film.

For example, the thickness of the first magnetic layer 11 is thicker than the thickness of the second magnetic layer 12. Thereby, the first magnetization 11M of the first magnetic layer 11 is fixed stably in a prescribed direction.

In the embodiments, for example, the base body 20s is aluminum oxide. The conductive layer 21 is a Ta layer (having a thickness of, for example, not less than 3 nm and not more than 10 nm). The second magnetic layer 12 includes, for example, a CoFeB layer (having a thickness of, for example, not less than 1.5 nm and not more than 2.5 nm). The first nonmagnetic layer 11i includes a MgO layer (having a thickness of, for example, not less than 0.8 nm and not more than 1.2 nm).

The first magnetic layer 11 may include, for example, first to third films. The first film is provided between the third film and the first nonmagnetic layer 11i. The second film is provided between the first film and the third film. The first film includes, for example, a CoFeB film (having a thickness of, for example, not less than 1.5 nm and not more than 2.5 nm). The second film includes, for example, a Ru film (having a thickness of, for example, not less than 0.7 nm and not more than 0.9 nm). The third film includes, for example, a CoFeB film (having a thickness of, for example, not less than 1.5 nm and not more than 2.5 nm).

For example, a ferromagnetic or antiferromagnetic layer may be provided. The first magnetic layer 11 is provided between the layer and the first nonmagnetic layer 11i. The layer is, for example, an IrMn-layer (having a thickness not less than 7 nm and not more than 9 nm). The layer fixes the first magnetization 11M of the first magnetic layer 11. A Ta layer may be provided on the layer.

An example of operations of the magnetic memory device according to the embodiment will now be described.

As described above, the controller 70 is electrically connected to the first stacked body SB1 (the first magnetic layer 11) and the second stacked body SB2 (the third magnetic layer 13). A prescribed select voltage is applied to the first magnetic layer 11 when programming information to the first stacked body SB1. At this time, the unselect voltage is applied to the second stacked body SB2. On the other hand, the prescribed select voltage is applied to the third magnetic layer 13 when programming information to the second stacked body SB2. At this time, the unselect voltage is applied to the first stacked body SB1. The application of a voltage of 0 volts also is included in "a voltage being applied." The potential of the select voltage is different from the potential of the unselect voltage.

For example, in a first program operation, the controller 70 sets the first magnetic layer 11 to a potential (e.g., a select potential) that is different from the potential of the third magnetic layer 13 (e.g., an unselect potential). In the second program operation, the controller 70 sets the first magnetic layer 11 to a potential (e.g., the select potential) that is different from the potential of the third magnetic layer 13 (e.g., the unselect potential).

For example, in a third program operation, the controller 70 sets the third magnetic layer 13 to a potential (e.g., the select potential) that is different from the potential of the first magnetic layer 11 (e.g., the unselect potential). In a fourth program operation, the controller 70 sets the third magnetic layer 13 to a potential (e.g., the select potential) that is different from the potential of the first magnetic layer 11 (e.g., the unselect potential).

For example, such a selection of the potential is performed by the operations of the first switch Sw1 and the second switch Sw2.

An example of such an operation will now be described.

FIG. 42A to FIG. 42D are schematic views illustrating the operations of the magnetic memory device according to the embodiment.

As shown in FIG. 42A, the controller 70 and the first magnetic layer 11 are electrically connected by the first interconnect 70a. The controller 70 and the third magnetic layer 13 are electrically connected by the second interconnect 70b. In the example, the first switch Sw1 is provided along the first interconnect 70a. The second switch Sw2 is provided along the second interconnect 70b. The potential of the first magnetic layer 11 is controlled by the controller 70 controlling the potential of the first interconnect 70a. The change of the potential of the first interconnect 70a is substantially small. Therefore, the potential of the first interconnect 70a can be considered to be the potential of the first magnetic layer 11. Similarly, the potential of the second interconnect 70b can be considered to be the potential of the third magnetic layer 13. Hereinbelow, the potential of the first magnetic layer 11 is taken to be the same as the potential of the first interconnect 70a. Hereinbelow, the potential of the third magnetic layer 13 is taken to be the same as the potential of the second interconnect 70b.

In the following example, the first magnetization 11M of the first magnetic layer 11 and the third magnetization 13M of the third magnetic layer 13 are in the +Y direction. These magnetizations are fixed.

In a first operation OP1 as shown in FIG. 42A, the controller 70 sets the first region 21a of the conductive layer 21 to a potential V0. The potential V0 is, for example, a ground potential. In the first operation OP1, the controller 70 sets the first magnetic layer 11 to a first voltage V1. In other words, in the first operation OP1, the controller 70 sets a first potential difference between the first region 21a and the first magnetic layer 11 to the first voltage V1. The first voltage V1 is, for example, the select voltage.

On the other hand, in the first operation OP1, the controller 70 sets the third magnetic layer 13 to a second voltage V2. In other words, in the first operation OP1, the controller 70 sets a second potential difference between the first region 21a and the third magnetic layer 13 to the second voltage V2. The second voltage V2 is, for example, the unselect voltage. The second voltage V2 is different from the first voltage V1. For example, the absolute value of the first voltage V1 is greater than the absolute value of the second voltage V2. For example, the polarity of the first voltage V1 is different from the polarity of the second voltage V2.

In the first operation OP1, the controller 70 supplies the first current Iw1 to the conductive layer 21. The first current Iw1 has the orientation from the first region 21a toward the fourth region 21d.

In such a first operation OP1, for example, the second magnetization 12M of the second magnetic layer 12, in the selected state is oriented in, for example, the +Y direction. This is due to the magnetic effect from the conductive layer 21. On the other hand, the fourth magnetization 14M of the fourth magnetic layer 14 in the unselected state substantially does not change. In the example, the fourth magnetization 14M is maintained in the initial state (in the example, the +Y direction).

In a second operation OP2 as shown in FIG. 42B, the controller 70 sets the first region 21a of the conductive layer 21 to the potential V0. In the second operation OP2, the controller 70 sets the first potential difference between the first region 21a and the first magnetic layer 11 to the first voltage V1. In the second operation OP2, the controller 70 sets the second potential difference between the first region 21a and the third magnetic layer 13 to the second voltage V2. In the second operation OP2, the controller 70 supplies the second current Iw2 to the conductive layer 21. The second current Iw2 has the orientation from the fourth region 21d toward the first region 21a.

At this time, for example, the second magnetization 12M of the second magnetic layer 12 in the selected state changes to the −Y direction. This is due to the magnetic effect from the conductive layer 21. On the other hand, the fourth magnetization 14M of the fourth magnetic layer 14 in the unselected state substantially does not change. In the example, the fourth magnetization 14M is maintained in the initial state (in the example, the +Y direction).

The electrical resistance between the first magnetic layer 11 and the conductive layer 21 (e.g., the first region 21a) after the first operation OP1 is taken as the first electrical resistance. The electrical resistance between the first magnetic layer 11 and the conductive layer 21 (e.g., the first region 21a) after the second operation OP2 is taken as the second electrical resistance. The first electrical resistance is different from the second electrical resistance. In the example, the first electrical resistance is lower than the second electrical resistance.

On the other hand, the electrical resistance between the third magnetic layer 13 and the conductive layer 21 (e.g., the first region 21a) after the first operation OP1 recited above is taken as the third electrical resistance. The electrical resistance between the third magnetic layer 13 and the conductive layer 21 (e.g., the first region 21a) after the second operation OP2 recited above is taken as the fourth electrical resistance. The third electrical resistance is substantially the same as the fourth electrical resistance. This is because the fourth magnetization 14M of the fourth magnetic layer 14 substantially does not change.

Thus, in the embodiment, the absolute value of the difference between the first electrical resistance and the second electrical resistance is greater than the absolute value of the difference between the third electrical resistance and the fourth electrical resistance.

Thus, in the first stacked body SB1 in the selected state, the change of the electrical resistance is formed by the first current Iw1 or the second current Iw2. In other words, the programming of the information is performed. On the other hand, in the second stacked body SB2 in the unselected state, the change of the electrical resistance is not formed by the first current Iw1 or the second current Iw2.

In the example of a third operation OP3 shown in FIG. 42C, the first stacked body SB1 is set to the unselected state; and the second stacked body SB2 is set to the selected state. At this time, in the first operation OP1, the controller 70 sets the first potential difference between the first region 21a and the first magnetic layer 11 to the first voltage V1 (referring to FIG. 42A). On the other hand, in the second operation OP2, the controller 70 sets the first potential difference to the first voltage V1 (referring to FIG. 42B). In the third operation OP3 as shown in FIG. 42C, the controller 70 sets the first potential difference between the first region 21a and the first magnetic layer 11 to the second voltage V2 (the unselect voltage). In the third operation OP3, the controller 70 supplies the first current Iw1 to the conductive layer 21.

At this time, the second magnetization 12M of the second magnetic layer 12 in the unselected state is the same as the state of FIG. 42A. On the other hand, the fourth magnetization 14M of the fourth magnetic layer 14 in the selected state is changed from the state of FIG. 42A.

In a fourth operation OP4 shown in FIG. 42D as well, first stacked body SB1 is set to the unselected state; and the second stacked body SB2 is set to the selected state. In the fourth operation OP4, the controller 70 sets the first potential difference to the second voltage V2. In the fourth operation OP4, the controller 70 supplies the second current Iw2 to the conductive layer 21.

In the first stacked body SB1 which is in the unselected state, the electrical resistance is substantially the same between the third operation OP3 and the fourth operation OP4. On the other hand, in the second stacked body SB2 which is in the selected state, the electrical resistance changes between the third operation OP3 and the fourth operation OP4.

Thus, the absolute value of the difference between the first electrical resistance after the first operation OP1 and the second electrical resistance after the second operation OP2 is greater than the absolute value of the difference between the electrical resistance between the first magnetic layer 11 and the first region 21a after the third operation OP3 and the electrical resistance between the first magnetic layer 11 and the first region 21a after the fourth operation OP4.

The multiple stacked bodies correspond respectively to the multiple memory cells. It is possible to store mutually-different information in the multiple memory cells. When storing the information in the multiple memory cells, for example, one of "1" or "0" may be stored in the multiple memory cells; and subsequently, the other of "1" or "0" may be stored in some of the multiple memory cells as desired.

For example, one of "1" or "0" may be stored in one of the multiple memory cells; and subsequently, one of "1" or "0" may be stored in another one of the multiple memory cells.

In the description recited above, the first region 21a and the fourth region 21d are interchangeable with each other. For example, the electrical resistance recited above may be the electrical resistance between the first magnetic layer 11 and the fourth region 21d. The electrical resistance recited above may be the electrical resistance between the third magnetic layer 13 and the fourth region 21d.

Examples of other operations will now be described.

Figure 43A:
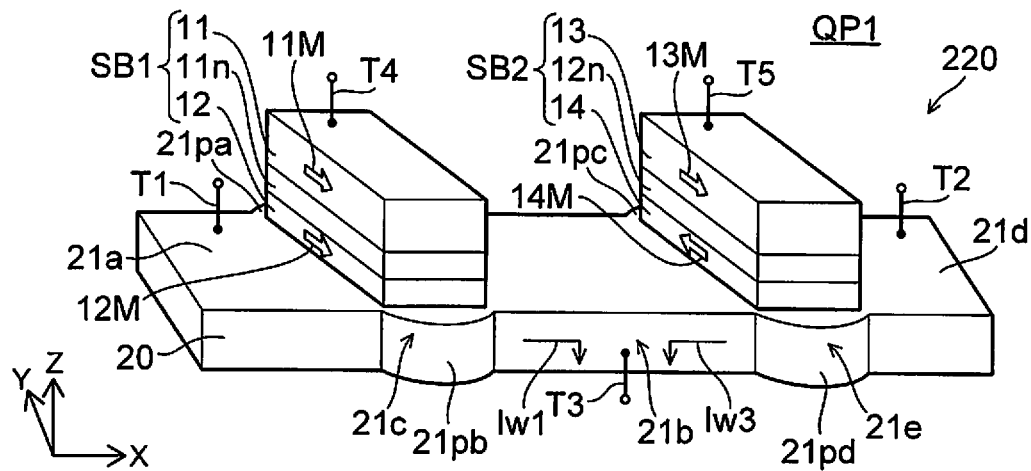
FIG. 43A to FIG. 43C are schematic perspective views illustrating a magnetic memory device according to the embodiment.
Figure 43B:
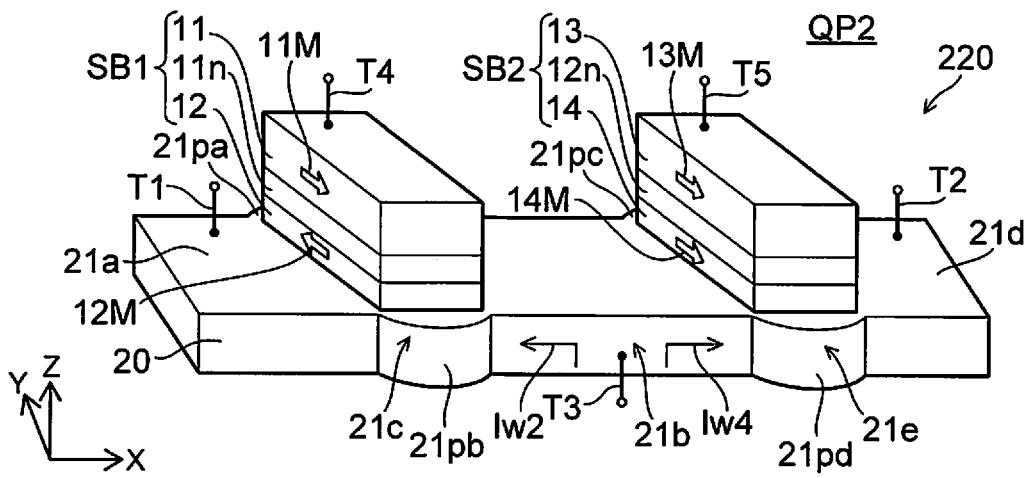
Figure 43C:
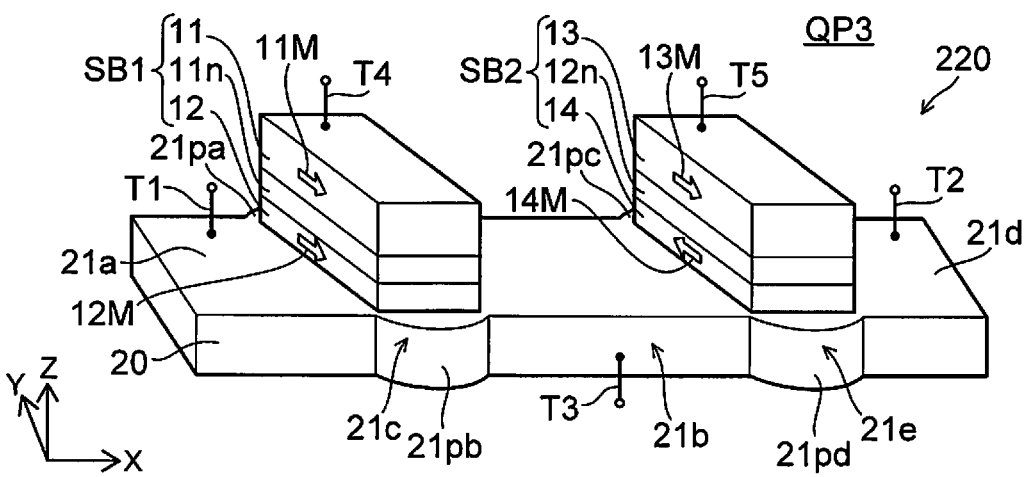

FIG. 43A to FIG. 43C are schematic perspective views illustrating a magnetic memory device according to the embodiment.

As shown in FIG. 43A, multiple stacked bodies (the first stacked body SB1 and the second stacked body SB2) are provided in the magnetic memory device 220 according to the embodiment. In the magnetic memory device 220, the current that flows in the first stacked body SB1 and the current that flows in the second stacked body SB2 are different.

The first stacked body SB1 overlaps the third region 21c in the first direction (the Z-axis direction). The second stacked body SB2 overlaps the fifth region 21e in the first direction.

For example, the first terminal T1 is electrically connected to the first region 21a of the conductive layer 21. The second terminal T2 is electrically connected to the fourth region 21d. The third terminal T3 is electrically connected to the second region 21b. A fourth terminal T4 is electrically connected to the first magnetic layer 11. A fifth terminal T5 is electrically connected to the third magnetic layer 13.

In one operation QP1 as shown in FIG. 43A, the first current Iw1 flows from the first terminal T1 toward the third terminal T3. In the operation QP1, a third current Iw3 flows from the second terminal T2 toward the third terminal T3. The orientation of the current (the first current Iw1) at the position of the first stacked body SB1 is the reverse of the orientation of the current (the third current Iw3) at the position of the second stacked body SB2. In such an operation QP1, the orientation of the spin Hall torque acting on the second magnetic layer 12 of the first stacked body SB1 is the reverse of the orientation of the spin Hall torque acting on the fourth magnetic layer 14 of the second stacked body SB2.

In another operation QP2 shown in FIG. 43B, the second current Iw2 flows from the third terminal T3 toward the first terminal T1. In the operation QP2, a fourth current Iw4 flows from the third terminal T3 toward the second terminal T2. The orientation of the current (the second current Iw2) at the position of the first stacked body SB1 is the reverse of the orientation of the current (the fourth current Iw4) at the position of the second stacked body SB2. In such an operation QP2, the orientation of the spin Hall torque acting on the second magnetic layer 12 of the first stacked body SB1 is the reverse of the orientation of the spin Hall torque acting on the fourth magnetic layer 14 of the second stacked body SB2.

As shown in FIG. 43A and FIG. 43B, the orientation of the fourth magnetization 14M of the fourth magnetic layer 14 is the reverse of the orientation of the second magnetization 12M of the second magnetic layer 12. On the other hand, the orientation of the third magnetization 13M of the third magnetic layer 13 is the same as the orientation of the first magnetization 11M of the first magnetic layer 11. Thus, magnetization information that has reverse orientations between the first stacked body SB1 and the second stacked body SB2 is stored. For example, the information (the data) in the case of the operation QP1 corresponds to "1." For example, the information (the data) in the case of the operation QP2 corresponds to "0." By such operations, for example, the reading can be faster as described below.

In the operation QP1 and the operation QP2, the second magnetization 12M of the second magnetic layer 12 and the spin current of the electrons (the polarized electrons) flowing through the conductive layer 21 have an interaction. The orientation of the second magnetization 12M and the orientation of the spin of the polarized electrons have a parallel or antiparallel relationship. The second magnetization 12M of the second magnetic layer 12 precesses and reverses. In the operation QP1 and the operation QP2, the orientation of the fourth magnetization 14M of the fourth magnetic layer 14 and the orientation of the spin of the polarized electrons have a parallel or antiparallel relationship. The fourth magnetization 14M of the fourth magnetic layer 14 precesses and reverses.

FIG. 43C illustrates a read operation of the magnetic memory device 220.

In a read operation QP3, the potential of the fourth terminal T4 is set to a fourth potential V4. The potential of the fifth terminal T5 is set to a fifth potential V5. The fourth potential V4 is, for example, a ground potential. The potential difference between the fourth potential V4 and the fifth potential V5 is taken as ΔV. The two electrical resistances are taken as a high resistance Rh and a low resistance Rl for each of the multiple stacked bodies. The high resistance Rh is higher than the low resistance Rl. For example, the resistance when the first magnetization 11M and the second magnetization 12M are antiparallel corresponds to the high resistance Rh. For example, the resistance when the first magnetization 11M and the second magnetization 12M are parallel corresponds to the low resistance Rl. For example, the resistance when the third magnetization 13M and the fourth magnetization 14M are antiparallel corresponds to the high resistance Rh. For example, the resistance when the third magnetization 13M and the fourth magnetization 14M are parallel corresponds to the low resistance Rl.

For example, in the operation QP1 (the "1" state) illustrated in FIG. 43A, a potential Vr1 of the third terminal T3 is represented by Formula (1).

$$Vr1 = (Rl/(Rl+Rh)) \times \Delta V \quad (1)$$

On the other hand, in the state of the operation QP2 (the "0" state) illustrated in FIG. 43B, a potential Vr2 of the third terminal T3 is represented by Formula (2).

$$Vr2 = (Rh/(Rl+Rh)) \times \Delta V \quad (2)$$

Accordingly, a potential change ΔVr between the "1" state and the "0" state is represented by Formula (3).

$$\Delta Vr = Vr2 - Vr1 = ((Rh-Rl)/(Rl+Rh)) \times \Delta V \quad (3)$$

The potential change ΔVr is obtained by measuring the potential of the third terminal T3.

Compared to the case where a constant current is supplied to the stacked body (the magnetoresistive element) and the voltage (the potential difference) between the two magnetic layers of the magnetoresistive element is measured, for example, the consumed energy when reading can be reduced in the read operation QP3 recited above. In the read operation QP3 recited above, for example, high-speed reading can be performed.

Thus, the controller 70 is configured to further perform at least the read operation QP3 of applying a voltage between the first magnetic layer (the fourth terminal T4) and the third magnetic layer (the fifth terminal T5), and detecting a potential of the second region (the third terminal T3).

In the operation QP1 and the operation QP2 recited above, the perpendicular magnetic anisotropies of the second magnetic layer 12 and the fourth magnetic layer 14 can be controlled by using the fourth terminal T4 and the fifth terminal T5. Thereby, the program current can be reduced. For example, the program current can be about ½ of the program current of the case where the programming is performed without using the fourth terminal T4 and the fifth terminal T5. For example, the program charge can be reduced. The relationship between the polarities of the voltages applied to the fourth terminal T4 and the fifth terminal T5 and the increase and decrease of the perpendicular magnetic anisotropy is dependent on the materials of the magnetic layers and the conductive layer 21.

The first current Iw1 may be supplied together with the third current Iw3. The first current Iw1 may be supplied after supplying the third current Iw3. The third current Iw3 may be supplied after supplying the first current Iw1.

The second current Iw2 may be supplied together with the fourth current Iw4. The second current Iw2 may be supplied after supplying the fourth current Iw4. The fourth current Iw4 may be supplied after supplying the second current Iw2.

In the case in which the first current Iw1 and the third current Iw3 are supplied in a different timing and the second current Iw2 and the fourth current Iw4 are supplied in a different timing, increase of the current flowing the terminal T3 is suppressed, for example. This can suppress increase of areas of transistors connected with the third terminal T3. Such operation can be applied to magnetic memory devices including conductive layers having symmetrical configuration.

Figure 44:
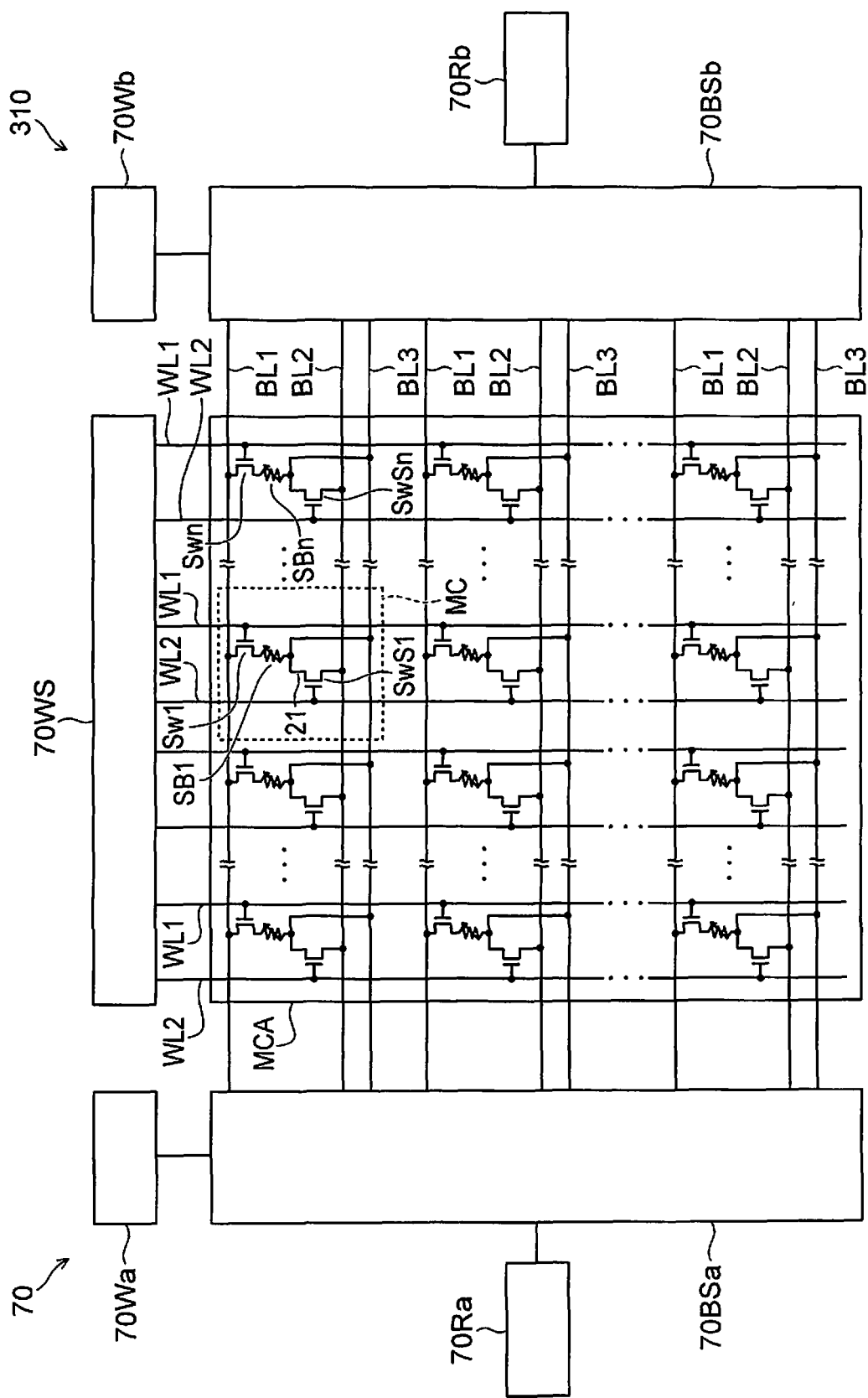
FIG. 44 is a schematic view showing a magnetic memory device according to the embodiment.

FIG. 44 is a schematic view showing a magnetic memory device according to the embodiment.

As shown in FIG. 44, a memory cell array MCA, multiple first interconnects (e.g., word lines WL1 and WL2, etc.), multiple second interconnects (e.g., bit lines BL1, BL2, and BL3, etc.), and the controller 70 are provided in the magnetic memory device 310. The multiple first interconnects extend in one direction. The multiple second interconnects extend in another one direction. The controller 70 includes a word line selection circuit 70WS, a first bit line selection circuit 70BSa, a second bit line selection circuit 70BSb, a first program circuit 70Wa, a second program circuit 70Wb, a first read circuit 70Ra, and a second read circuit 70Rb. Multiple memory cells MC are arranged in an array configuration in the memory cell array MCA.

For example, the switch Sw1 and a switch SwS1 are provided to correspond to one of the multiple memory cells MC. These switches are considered to be included in one of the multiple memory cells. These switches may be considered to be included in the controller 70. These switches are, for example, transistors. The one of the multiple memory cells MC includes, for example, a stacked body (e.g., the first stacked body SB1).

As described above, multiple stacked bodies (the first stacked body SB1, the second stacked body SB2, etc.) may be provided for one conductive layer 21. Multiple switches (the switch Sw1, the switch Sw2, etc.) may be provided respectively for the multiple stacked bodies. In FIG. 44, one stacked body (the stacked body SB1 or the like) and one switch (switch Sw1 or the like) are drawn to correspond to one conductive layer 21 for easier viewing of the drawing.

As shown in FIG. 44, one end of the first stacked body SB1 is connected to the conductive layer 21. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first region 21a) of the conductive layer 21 is connected to one of the source or the drain of the switch SwS1. The other end (e.g., the fourth region 21d) of the conductive layer 21 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the program operation of the information to the memory cell MC will now be described.

The switch SwS1 of one memory cell MC (the selected memory cell) to which the programming is to be performed is set to the ON state. For example, in the ON state, the word line WL2 that is connected to the gate of one switch SwS1 is set to a high-level potential. The setting of the potential is performed by the word line selection circuit 70WS. The switch SwS1 of another memory cell MC (an unselected memory cell) of the column including the one memory cell MC (the selected memory cell) recited above also is set to the ON state. In one example, the word line WL1 that is connected to the gate of the switch Sw1 inside the memory cell MC (the selected memory cell) and the word lines WL1 and WL2 that correspond to the other columns are set to a low-level potential.

One stacked body and one switch Sw1 that correspond to one conductive layer 21 are drawn in FIG. 44. As described above, the multiple stacked bodies (the stacked body SB1, the second stacked body SB2, etc.) and the multiple switches (the switch Sw1, the switch Sw2, etc.) that correspond to one conductive layer 21 are provided. In such a case, for example, the switches that are connected respectively to the multiple stacked bodies are set to the ON state. The select voltage is applied to one of the multiple stacked bodies. On the other hand, the unselect voltage is applied to the other stacked bodies. Programming is performed to the one of the multiple stacked bodies recited above; and the programming is not performed to the other stacked bodies. Selective programming of the multiple stacked bodies is performed.

The bit lines BL2 and BL3 that are connected to the memory cell MC (the selected cell) to which the programming is to be performed are selected. The selection is performed by the first bit line selection circuit 70BSa and the second bit line selection circuit 70BSb. A program current is supplied to the selected bit lines BL2 and BL3. The supply of the program current is performed by the first program circuit 70Wa and the second program circuit 70Wb. The program current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic layer 12, etc.) of the MTJ element (the first stacked body SB1, etc.) is changeable by the program current. The magnetization direction of the memory layer of the MTJ element is changeable to the reverse direction recited above when the program current flows from the other of the first bit line selection circuit 70BSa or the second bit line selection circuit 70BSb toward the one of the first bit line selection circuit 70BSa or the second bit line selection circuit 70BSb. Thus, the programming is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON state. At this time, the switches Sw1 of the other memory cells MC (the unselected cells) of the column including the memory cell MC (the selected cell) recited above also are set to the ON state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the selected bit line BL1 and bit line BL3. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is detected by the first read circuit 70Ra and the second read circuit 70Rb. For example, the difference between the magnetization of the memory layer (the second magnetic layer 12) and the magnetization of the reference layer (the first magnetic layer 11) of the MTJ element is detected. The difference includes the orientation of the magnetization being in a mutually-parallel state (having the same orientation) or a mutually-antiparallel state (having the reverse orientation). Thus, the read operation is performed.

For example, there is volatile (SRAM (Static Random Access Memory) or DRAM (Dynamic Random Access Memory)) working memory, nonvolatile (NAND flash memory or a HDD (Hard Disk Drive)) storage, etc. The consumed energy of SRAM is large due to the leakage current. The consumed energy of DRAM is large due to the refresh current.

In working memory, the frequency of being in operation (Active) is high compared to the frequency of being in standby (Standby). In the operations, a large program charge is necessary; and the program energy increases. The energy that is saved in standby is consumed in the operation; and as a total, it is difficult to reduce the consumed energy.

For last level cache memory (LLC (Last Level Cache)) in which the operation frequency is relatively low, for example; there is a possibility that the consumed energy can be reduced by using STT (Spin Transfer Torque)-MRAM (Magnetic Random Access Memory). However, in the case where STT-MRAM is used in the cache memory of higher levels than LLC, the operation frequency increases remarkably. Therefore, an enormous amount of energy is consumed.

In the embodiment, the consumed energy can be small. In the embodiment, high-speed operations can be obtained.

According to the embodiments, a magnetic memory device can be provided in which more stable operations are obtained.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies. The "state of being electrically connected" includes the state in which an electrical element (a switch such as a transistor or the like) is inserted between multiple conductive bodies so that a state is formable in which a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as conductive layers, magnetic layers, nonmagnetic layers, controller, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
    a conductive layer including a first region, a second region, and a third region between the first region and the second region;
    a first magnetic layer;
    a second magnetic layer provided between the third region and the first magnetic layer in a first direction crossing a second direction, the second direction being from the first region toward the second region; and
    a first nonmagnetic layer provided between the first magnetic layer and the second magnetic layer,
    the third region including a first end portion and a second end portion, a direction from the second end portion toward the first end portion crossing a first plane, the first plane including the first direction and the second direction,
    the first end portion including a first protrusion,
    the second end portion including a second protrusion, a first position along the second direction of the first protrusion being different from a second position along the second direction of the second protrusion.

2. The device according to claim 1, wherein a length of the second magnetic layer along a top portion direction is different from a length of the second magnetic layer along the second direction, the top portion direction being from a top portion of the second protrusion toward a top portion of the first protrusion.

3. The device according to claim 1, wherein a portion of the second magnetic layer is along at least a portion of the first protrusion.

4. The device according to claim 1, wherein
the third region includes a region overlapping the second magnetic layer in the first direction, and
a thickness along the first direction of the overlapping region is thicker than a thickness along the first direction of the first region and thicker than a thickness along the first direction of the second region.

5. The device according to claim 1, wherein the conductive layer includes at least one selected from the group consisting of tantalum and tungsten.

6. The device according to claim 1, further comprising a controller electrically connected to the first region and the second region,
the controller being configured to perform at least a first operation of supplying a first current to the conductive layer from the first region toward the second region, and a second operation of supplying a second current to the conductive layer from the second region toward the first region.

7. The device according to claim 6, wherein
the controller is further electrically connected to the first magnetic layer,
the controller sets a first potential difference between the first region and the first magnetic layer to a first voltage in the first operation,
the controller sets the first potential difference to the first voltage in the second operation,
the controller further performs a third operation and a fourth operation,
in the third operation, the controller sets the first potential difference between the first region and the first magnetic layer to a second voltage and supplies the first current to the conductive layer, the second voltage being different from the first voltage,
in the fourth operation, the controller sets the first potential difference to the second voltage and supplies the second current to the conductive layer,
a first electrical resistance between the first magnetic layer and the conductive layer after the first operation is different from a second electrical resistance between the first magnetic layer and the conductive layer after the second operation, and
an absolute value of a difference between the first electrical resistance and the second electrical resistance is greater than an absolute value of a difference between an electrical resistance between the first magnetic layer and the conductive layer after the third operation and an electrical resistance between the first magnetic layer and the conductive layer after the fourth operation.

8. The device according to claim 1, further comprising
a third magnetic layer;
a fourth magnetic layer;
a second nonmagnetic layer; and
a controller,
the conductive layer further including a fourth region and a fifth region, the second region being provided between the first region and the fourth region in the second direction, the fifth region being provided between the second region and the fourth region in the second direction,
the fourth magnetic layer being provided between the fifth region and the third magnetic layer in the first direction,
the second nonmagnetic layer being provided between the third magnetic layer and the fourth magnetic layer,
the controller being electrically connected to the first region, the second region and the fourth region,
the controller being configured to perform at least a first program operation of supplying a first current to the conductive layer and supplying a second current to the conductive layer, the first current having a direction from the first region toward the second region, the second current having a direction from the fourth region toward the second region.

9. The device according to claim 8, wherein
the controller is configured to further perform at least a second program operation of supplying a third current to the conductive layer and supplying a fourth current to the conductive layer, the third current having a direction from the second region toward the first region, the fourth current having a direction from the second region toward the fourth region.

10. The device according to claim 9, wherein
the controller is further connected to the first magnetic layer and the third magnetic layer,
the controller is configured to further perform at least a read operation of applying a voltage between the first magnetic layer and the third magnetic layer, and detecting a potential of the second region.

* * * * *